United States Patent [19]
Milkovich et al.

[11] Patent Number: 6,078,281
[45] Date of Patent: Jun. 20, 2000

[54] SIGNAL PROCESSING ARCHITECTURE WHICH IMPROVES SONAR AND PULSE DOPPLER RADAR PERFORMANCE AND TRACKING CAPABILITY

[75] Inventors: Edward Milkovich, Northridge; Ralph Elton Gifford, Moorpark, both of Calif.

[73] Assignee: Milkovich Systems Engineering, Northridge, Calif.

[21] Appl. No.: 08/990,714

[22] Filed: Dec. 15, 1997

Related U.S. Application Data

[63] Continuation-in-part of application No. 08/671,939, Jun. 28, 1996, abandoned.

[51] Int. Cl.[7] .................................................... G01S 7/285
[52] U.S. Cl. ............................ 342/196; 342/162; 342/192
[58] Field of Search .................................... 342/196, 159, 342/162, 192, 193, 194, 203

[56] References Cited

U.S. PATENT DOCUMENTS

| | | | |
|---|---|---|---|
| 4,042,925 | 8/1977 | Albanese et al. | 342/132 |
| 4,057,800 | 11/1977 | Ganz | 342/116 |

(List continued on next page.)

FOREIGN PATENT DOCUMENTS

WO98/02760  1/1998  WIPO .

OTHER PUBLICATIONS

Signal Analysis, J. Brown and E.V.D. Glazier, Published 1964 Reinhold Publishing Corporation, pp. 175–183.
Radar Handbook, 2nd Ed., McGrow–Hill, Inc., Chspter 8 "Automatic Detection, Tracking And Sensor Integration," G.V. Trunk, pp. 8.1–8.15 and p. 17.15.
Fourier Receiver Sensitivity (U), Jack R. Williams, 29th Navy Symposium on Underwater Acoustics, NUSC, New London, Ct., vol. II, pp. 503–514, Oct. 31, 1972.
Calculation Of The Minimum Detectable Signal For Practical Spectrum Analyzers, C. Nicholas Pryor, Naval Ordinance Laboratory, Aug. 2, 1971, pp. 1–10.
A Signal Model To Detect A CW Signal In Gaussian Noise With Alternatives For Improved Detection Performance, Edward Milkovich, Jun. 1979.

*Primary Examiner*—John B. Sotomayor
*Attorney, Agent, or Firm*—Oppenheimer Wolff & Donnelly; George Fountain; Douglas Larson

[57] ABSTRACT

A Fast Fourier Transformation (FFT) processing is disclosed that measures FFT output phase standard deviation over a number of consecutive FFT runs. The system corrects FFT output phase in an organized fashion for all potential signal filter offset positions while measuring changes in phase standard deviation, and selects the filter offset where the minimum standard deviation occurs. The system utilizes pseudo coherent integration to enhance traditional integration, where the pseudo coherent integration locates the mean phase shift within the number of FFTs integrated, and corrects all FFT runs by this mean shift value. The integration multiplies the magnitude of each FFT filter output by the cosine and sums all FFTs in the integration period for the respective filter. Detections are then declared based on outputs from a combination of a single filter detector, a sum coherent and traditional detector, a filtered coherent detector, and a filtered traditional detector, thereby utilizing various blended techniques across the filter bandwidth. Pulse Doppler radar architecture is predicated on more efficient time utilization during target dwells and is achieved by using managed PRF scheduling, frequency domain Doppler ambiguity resolution, determining signal position and phase within a Doppler filter extremely accurately, performing pseudo coherent integration and use of multi-strategy detection concepts. The PRF scheduling used in this radar architecture coupled with a frequency domain approach to perform Doppler corrected pulse compression and resolve Doppler ambiguity on the same scan provides the architecture to maintain same PRF during dwell and capitalize on integration.

82 Claims, 34 Drawing Sheets

U.S. PATENT DOCUMENTS

| | | | |
|---|---|---|---|
| 4,137,532 | 1/1979 | Taylor, Jr. et al. | 342/93 |
| 4,758,838 | 7/1988 | Maeda et al. | 342/25 |
| 4,816,833 | 3/1989 | Ferguson et al. | 342/95 |
| 4,916,452 | 4/1990 | Borchert et al. | 342/109 |
| 5,245,347 | 9/1993 | Bonta et al. | 342/149 |
| 5,307,070 | 4/1994 | Runge et al. | 342/25 |
| 5,311,189 | 5/1994 | Nagel | 342/95 |
| 5,375,143 | 12/1994 | Kazecki et al. | 375/233 |
| 5,402,131 | 3/1995 | Pierce | 342/194 |
| 5,410,750 | 4/1995 | Cantwell et al. | 455/306 |
| 5,442,359 | 8/1995 | Rubin | 342/109 |
| 5,515,300 | 5/1996 | Pierce | 364/572 |
| 5,583,512 | 12/1996 | McEligot | 342/189 |
| 5,583,517 | 12/1996 | Yokev et al. | 342/457 |
| 5,596,330 | 1/1997 | Yokev et al. | 342/387 |
| 5,606,324 | 2/1997 | Justice et al. | 342/62 |
| 5,646,623 | 7/1997 | Walters et al. | 342/129 |
| 5,659,520 | 8/1997 | Watson et al. | 367/125 |
| 5,784,026 | 7/1998 | Smith et al. | 342/160 |

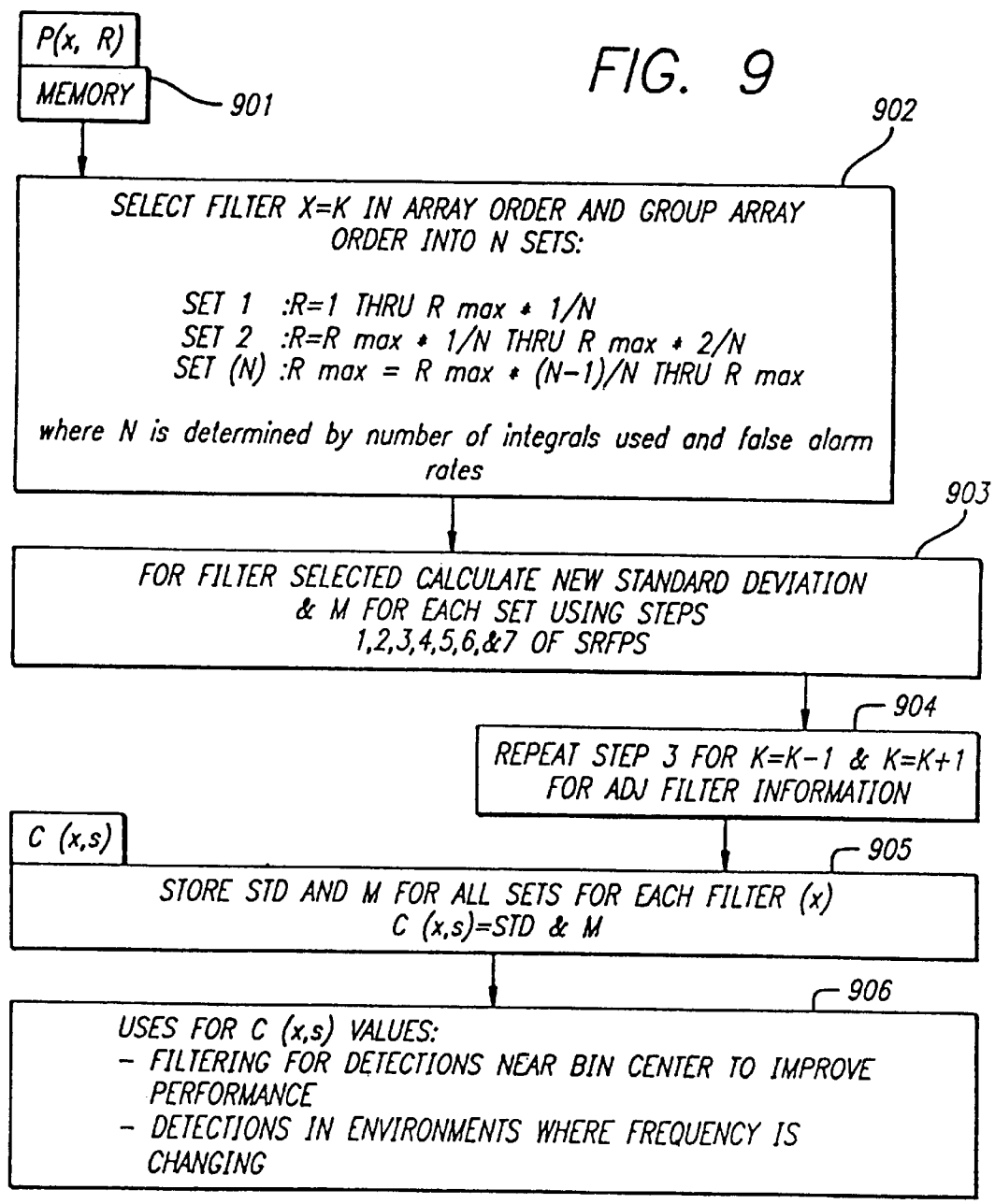

| RANGE GATE | PHASE SHIFT DUE TO DOPPLER IN EACH PC ELEMENT ||||||
|---|---|---|---|---|---|---|
| | "NO FOLD" OUT/IN BOUND ||| "FIRST FOLD" OUT/IN BOUND |||
| 1 | 0/0 | 0/0 | 0/0 | 0/0 | 0/0 | 0/0 |
| 2 | 0/-10 | 5/-5. | 10/-20. | 10/0. | 15/-15 | 20/-10 |
| 3 | 0/-19 | 10/-10 | 19/-38 | 19/0 | 30/-30 | 38/-19 |
| ⋮ | | | | | | |
| 11 | 0/-97 | 48/-48 | 97/-194 | 97/0 | 146/-146 | 194/-97 |
| 12 | 0/-107 | 54/-54 | 107/-214 | 107/0 | 161/-161 | 214/-107 |
| 13 | 0/-117 | 59/-59 | 117/-234 | 117/0 | 176/-176 | 234/-117 |
| FILTER NUMBER | 0 | 32 | 63 | 63 | 32 | 0 |
| AVG VELOCITY (Ft/Sec) | 9.6 | 607 | 1225 | 1245 | 1843 | 2461 |
| DOPPLER FREQUENCY | 193 | 12159 | 24511 | 24897 | 36863 | 49022 |

PRF = 24705
FILTER BW = 386
PW = 13 usec

FIG. 16

SIGNAL PROCESSING ARCHITECTURE WHICH IMPROVES SONAR AND PULSE DOPPLER RADAR PERFORMANCE AND TRACKING CAPABILITY

CROSS-REFERENCE TO RELATED APPLICATION

This is a continuation-in-part of U.S. patent application Ser. No. 08/671,939 ('939), filed Jun. 28, 1996, now abandoned the entire contents of which are hereby incorporated by reference.

BACKGROUND OF THE INVENTION

The present invention generally relates to the field of signal processing and, more particularly, to sonar processors and pulse Doppler radars utilizing frequency domain processing to improve signal detection.

Since the invention of radar and sonar for detection of objects, numerous techniques for signal processing have been introduced to enhance the image obtained from the returned signal and to reduce the noise inherent in signal reflection within a fluid media. Recent coherent systems have improved the imaging of the object to obtain higher quality, or higher resolution, signatures of the object for purposes of identification. Further, developments in linear detectors have enhanced receiver performance, but low signal to noise ratios pose detection difficulties for linear detectors. However, clutter and noise remain major obstacles to improving the performance of these systems.

When signal frequency is known to exist within a particular range of frequencies, the processing receiver must employ a set of parallel filters to cover the known frequency ranges. The typical fast Fourier transform (FFT) processing receiver is illustrated in FIG. 1. As shown in FIG. 1, the processing receiver 10 receives an input signal equal to signal plus noise. The analog signal is initially filtered by filter 11 and run through an A/D converter 12. The signal is buffered into N samples in buffer 13, and for a single range bin sample this is the number of samples used in the weighting and FFT. Each buffered signal is then weighted in weighting element 14, and the FFT processor 15 performs the fast Fourier transform and provides the signal into a real portion, Rx, and an imaginary portion, Ix.

The real and imaginary portions are squared and summed, and the square root of this sum is taken within the linear detector 16. The resultant signal from the linear detector 16 represents the signal amplitude in filter x, which is integrated in integrator 17. The average noise level computation block 18 computes the average noise level based on the integrated amplitude. The integrated amplitude and the average noise level are evaluated to determine if the signal exceeds a false alarm threshold in false alarm detector 19, and this signal is transmitted through the system to determine target classification, location, tracking, frequency accuracy improvement, and field signal correlation.

The problems with the aforementioned design are that performance of the receiver integrator 17 can generally be limited by the inherent properties associated with detector square law performance for low signal-to-noise ratio situations. Additionally, if the non-coherent integration time exceeds the time duration that the signal remains within a single filter bandwidth, performance is lost. Performance loss may also occur if integrators are loaded with noise before a signal occurs.

System performance is highly dependent on many factors associated with the system illustrated in FIG. 1. For example, the position of the signal within the filter affects performance of the system, with maximum performance loss occurring at 0.5 (0.5 distance to next filter center) offset from filter center. Further, the weighting function used to maximize off filter center performance can have significant implications on signal detection. Frequency accuracy is generally determined by filter resolution, and for filter offsets in the 0.5 area, accuracy uncertainty is two filters. The most advanced signal processors have been shown to improve frequency accuracy by at most a factor of five.

The function of signal tracking in general may require performance of one to two dB above MDL (Minimal Detection Levels) for effective performance. Other influences may also affect system performance, including contamination from tilted noise spectra, noise spiking, spurious other signals, and other environmental unknowns which can bias the system threshold and cause performance loss. Internal balancing of system parameters is also critical, in that the accuracy required to determine the threshold level increases with increasing time constants, while at the same time increasing these time constants increases the losses associated with several parameters, such as environment, filter offset, and signal position within the filter.

Pulse Doppler radars, such as those used on fighter aircraft, have traditionally relied on FFT processing without the use of post detection integration to improve signal detection. Any FFT detection improvement obtained is proportional to the resolution used and is driven by the pulse repetition frequency (PRF) employed by the radar as well as the dwell time spent on the target, or the time when the radar is illuminating the target. Pulse Doppler radars utilize either high PRF or medium PRF to detect targets. The advantage of high PRF is that the higher PRF frequency provides greater detection ranges than medium PRF, with high PRF providing very poor range resolution, range accuracy and ghosting, wherein multiple targets appear within the same beam width.

Medium PRF radars provide good range and range rate resolution but provide inferior detection ranges. The key factors affecting medium PRF radar detection performance are that time must budgeted during dwell time on the target to obtain independent measurements on the target, thereby permitting resolution of range and Doppler ambiguity, as well as sidelobe clutter (slc), which is driven by antennae side lobes, range resolution, and other extraneous factors. The time allocated to resolve these issues takes away the time that could be used to integrate the signal longer for better detection.

Range/Doppler effects are mitigated by different PRF approaches, and the number of PRFs used varies with different radars. The most popular method uses eight PRFs during the dwell. When scanning over a target, the radar must receive a detection on three of the eight PRFs in order to resolve ambiguities. Variance in the PRFs by a factor of two without correcting for average radiated power reduces medium PRF average power on the target, again diminishing the performance of medium PRF with respect to high PRF.

A modulated transmitted pulse is used to obtain range information from high PRF. During radar processing of echoes, the modulation is utilized to determine target range. This approach requires three periods in the dwell to resolve detection, thereby providing 2.6 more periods of time to collect coherent data for processing. This additional collection time contributes to higher high PRF performance. In addition, since the high PRF is generally an order of magnitude higher than medium PRF, it essentially eliminates Doppler ambiguity and provides the high PRF mode with a factor of three improvement in FFT resolution, again contributing to enhanced performance.

The poor range resolution/accuracy and ghosting associated with multiple targets in the beam requires multiple scans before the accuracy of the data is good enough be used for targeting weapons. A Kalman type filter can be used to get the improvements in resolution and accuracy needed. A minimum of three looks is generally used for the data to be considered adequate to pass on to the mission computer. Medium PRF, on the other hand, has much higher quality range information on one scan but does nothing to improve azimuth accuracy. Medium PRF would therefore also require additional looks to have sufficient data quality to support fighter engagement. However, since the long range detection performance of medium PRF is considerably less than that of high PRF, medium PRF is not generally used in long range air-to-air detection operations.

The significant problems or constraints associated with fighter or other airborne radar operations are as follows. Medium PRF average power decreases as the PRF is lowered if pulse width is not adjusted. Pulse compression signal losses occur as a function of Doppler velocity, and thus the higher the velocity the larger the losses. The specific losses are related to the pulse widths employed. The 3 of 8 design logic used to resolve range and Doppler ambiguity in medium PRF operation wastes time that could be used to improve signal detection. High PRF uses 3 of 3 detection, reducing the time loss by a factor of 2.6 but loses some of this time due to the waveform used to determine range. Short dwell times and PRFs used limit the number of Doppler filters provided. Typically, medium PRF provides thirty-two Doppler filters. Frequency accuracy is limited by the resolution of the Doppler filter. The performance of the system is dependent on the position of the signal within the Doppler filter, and losses occur when the signals are off-of-filter center. Determining the noise level power in the vicinity of the signal is subject to real world contamination from tilted noise spectra, noise spiking, other signals and a host of unknowns which can bias the Constant False Alarm Rate (CFAR) threshold and cause performance losses. The quality of data provided to the General Purpose Computer (GPC) for tracking requires a number of scans for the GPC to determine accurate target position, heading and ground velocity. The radar limitations prohibit it from determining the target heading and ground velocity.

Examples of prior art radar systems are shown in the following U.S. patents: U.S. Pat. No. 3,935,572 (Broniwitz et al.); U.S. Pat. No. 4,093,948 (Long, III); U.S. Pat. No. 4,106,019 (Alexander et al.); U.S. Pat. No. 4,499,467 (Rittenbach); U.S. Pat. No. 4,584,579 (Frost et al.); U.S. Pat. No. 4,746,922 (Prenat); and U.S. Pat. No. 4,954,830 (Kirkorian et al.). The entire contents of each of these patents and all other patents and other publications mentioned anywhere in this disclosure are hereby incorporated by reference.

SUMMARY AND OBJECTS OF THE INVENTION

Given the above-described general system constraints and performance characteristics, it is an object of the current invention to provide a system having enhanced signal processing capability which is not limited by the detector square law during low SNR operation. Such a system should operate in various environments, including but not limited to sonar and airborne radar applications.

It is another object of the current invention to provide a system wherein system performance is optimized for positions of signals within the filter and the off-center filter performance depending on the weighting function.

It is yet another object of the current invention to provide a system having improved frequency accuracy over presently known signal processing technology.

It is still another object of the current invention to provide a system which minimizes the effects of tilted noise spectra, noise spiking, spurious signals, and other environmental factors.

It is still a further object of the current invention to provide a system which improves medium PRF performance for airborne radars by providing improved range resolution, range accuracy, ghosting performance, data collection, and improved performance over that generally available using Kalman filtering.

It is still a further object of the current invention to provide a system which enhances signal-to-noise ratio over existing radars utilizing medium PRF.

It is still a further object of the current invention to provide a system which reduces ground clutter in conditions where ground clutter limits range performance.

It is still a further object of the current invention to provide a system wherein the impact of pulse compression sidelobe response is reduced during strong target signal detection situations.

It is still a further object of the current invention to provide a system wherein single filter signal detection is capable of avoiding CFAR losses due to finite sample size errors, large signals, and/or multiple uncertainty in background noise or clutter power.

It is still a further object of the current invention to provide a system which measures target heading and correlates same target detections scan-to-scan for tracking accuracy and time line improvement.

It is still a further object of the current invention to provide a system which reduces signal loss given that the received Doppler echo is not filter centered thereby improving the probability of resolving range ambiguity on consecutive scans for weak targets.

It is still a further object of the current invention to provide a system which eliminates the pulse compression losses associated with high Doppler frequencies and wide transmitted pulses providing all aspect target detection.

It is still a further object of the current invention to provide a system which resolves Doppler ambiguity within the same PRF, providing the same advantage as high PRF.

It is still a further object of the current invention to provide a system employing a scanning antenna that accommodates changing the scan rates to increase performance with minor adjustments in the radar processing software.

It is still a further object of the current invention to provide a system which employs an electronic steerable array (ESA) and provides a fast scan rate for tracking and a slow rate to increase performance.

It is still a further object of this invention to provide frequency domain pulse compression.

It is still a further object of this invention to provide a PRF approach to allow for post detection integration of signals.

It is still a further object of this invention to provide azimuth resolution improvement to give better azimuth accuracy.

It is still a further object of this invention to provide target classification capability.

In accordance with one aspect the current invention, there is provided an improved fast Fourier transform (FFT) sensor using enhanced frequency domain processing. The system measures FFT output phase standard deviation over a number of consecutive FFT runs, and subsequently adjusts the output for processing phase shifts. The system corrects FFT output phase in an organized fashion for all potential signal filter offset positions while measuring changes in phase standard deviation, and selects the filter offset where the minimum standard deviation occurs. The system utilizes pseudo coherent integration to augment and enhance traditional integration, where the filter offset adjusts the phase shift within the number of FFTs integrated and pseudo coherent integration integrates all the values based on corrected values. The integration multiplies the magnitude of each FFT filter output by the cosine of the corresponding corrected phase and summing all FFTs in the integration period for the respective filter. Detections are then declared based on the ratio of pseudo coherent integration and traditional integration and the standard deviation values. Detection further utilizes various blended techniques across the filter bandwidth to optimize signal detection.

The system comprises an arctangent calculator for using the real and imaginary outputs of an FFT processor employing redundancy, a memory for storing values of magnitudes and phase, and a bin number phase corrector. The bin number phase corrector maintains the phase of all signals in FFT bins evenly divisible by the redundancy of the FFT processing, and shifts all signals by a predetermined ratio between bin position and redundancy. For example, for a four-to-one redundancy, the 0, 4, 8, etc. positions are not phase shifted, the 1, 5, 9, etc. positions are phase shifted 90 degrees, the 2, 6, 10, etc. positions are shifted 180 degrees, and the 3, 7, 11, etc. positions are shifted 270 degrees.

The system also comprises a filter unit phase rotation corrector which corrects filter phase shift based on signal position in the filter. The system has a mean phase calculator and a standard deviation calculator to calculate those parameters of the received signal for every filter position tested, and a lowest standard deviation evaluator, wherein the filter unit phase rotation corrector, mean phase calculator, and lowest standard deviation evaluator iteratively step through all bin positions in the FFT filter to capture the position where minimum standard deviation occurs. The system also has an adjacent bin position measurement to capitalize on signal energy in adjacent filter and a filter phase corrector which adjusts the signal for filter number phase rotation.

The system has a pseudo coherent integrator and a detector, where the pseudo coherent integrator has an integrator and computes a value equal to the cosine of the stored phase value from the memory, multiplies the value by filter magnitude value, divides the value by a number of samples used in the integration, and sums the value with the value obtained for the repeated process on the next sample to be integrated.

Other embodiments of this invention are based on taking a pulsed Doppler radar system (comprised of an antenna unit, a transmitter for transmitting the signal through the antenna unit, a receiver/exciter for receiving a signal reflected by a target through the antenna unit to provide a reception signal and the exciter creating the reference waveform for transmitting/receiving (all operating under the control of a programmable event generator) and a processing unit which receives the reception signal from the A/D and performs processing to maximize detection of the target signal) and improving its performance through processing to increase range detection, to determine target heading, to increase range accuracy, to increase Doppler velocity accuracy, to improve azimuth accuracy, to reduce Doppler losses in pulse compressed radars and to classify the target.

The totality of processing improvements are made possible based first on the system architecture adopted which redistributes the time line budgets to capitalize on integration gain, which previously has not been attempted with medium PRF radars due to the inability to resolve range and Doppler ambiguity after integration using multiple scans. The flexibility of the architecture provides features for redistributing the time line budgets for optimizing all attributes of the improvements. The extended processing gains are based on using advanced processing techniques, techniques disclosed in the '939 application and new processing concepts to advance the state-of-the-art beyond current boundaries.

Another definition of the invention is for a system for improving system performance for use with pulsed Doppler radar systems, comprising: a system architecture; a frequency domain pulse compressor; a frequency domain Doppler correlation ambiguity resolver; a range ambiguity resolver; a standard deviation calculator; a lowest standard deviation evaluator, wherein the filter unit phase rotation corrector, the mean phase calculator, and the lowest standard deviation evaluator iteratively step through all filter positions in the filter; a frequency calculator; a frequency rate-of-change calculator; a pseudo coherent integrator; a two channel detection concept; means for reduction of pulse compression sidelobe response; means for reducing ground clutter; means for removing redundant target detections; a target heading determination concept; a scan-to-scan or multiple scan range ambiguity resolver; a range bin position interpreter; a single filter standard deviation detector; and a multi-hypothesis detector.

A more specific definition of an embodiment of this invention is the radar system of the paragraph above and, further comprising: an arc tangent calculator for calculating the phase angle of the real and imaginary outputs of the FFT processor; (replaced here with a unit vector phase rotator); a calculator for determining phase and rotating phase for use with the arc tangent calculator; a memory for storing values of magnitude and phase; a memory for storing values of frequency domain pulse compressed Doppler/range bin values; a phase corrector for time displaced phase shifts occurring in higher frequency Doppler signals related to pulse compression; a position calculator to determine position of target signal within a range bin; a calculator to determine target heading from scan-to-scan or multiple scans; a calculator to accurately determine aircraft ground velocity; a calculator to evaluate multiple hypothesis to make detections; and an evaluator to make single filter detections.

Other objects, features and advantages of the present invention will become more apparent from a consideration of the following detailed description and from the accompanying drawings.

BRIEF DESCRIPTION OF THE DRAWINGS

FIG. 9 presents an additional alternate embodiment of a constant filter tracking unit.

FIG. 16 is a chart illustrating phase shift in range gates and Doppler filter comprising 13:1 pulse compression VS Doppler.

DETAILED DESCRIPTION OF PREFERRED EMBODIMENTS

The current invention is designed to operate in a variety of environments, including but not limited to applications to sonar and radar processing, including airborne radar systems.

Receiver Performance

Figure 2:
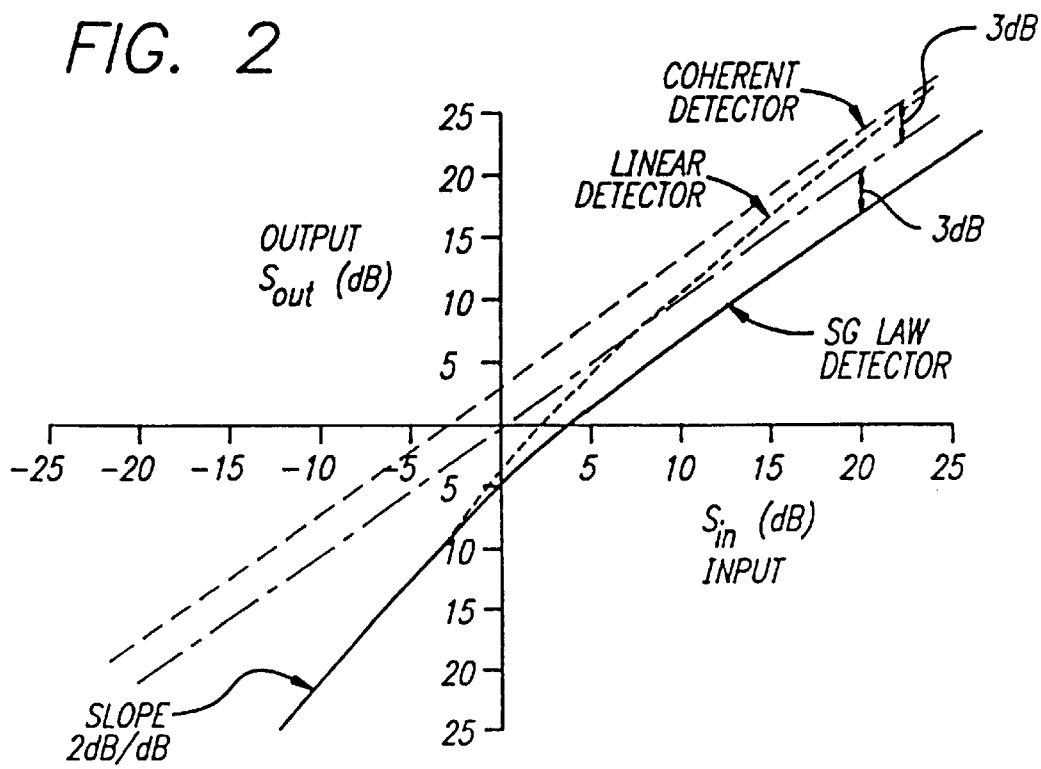
FIG. 2 is a performance illustration of linear detectors, coherent detectors, and the square law detector.

The transfer function relationship between output and input signal-to-noise ratio (SNR) for coherent, linear, and square law detectors is shown in FIG. 2, which is from "Signal Analysis," J. Brown and E. V. D. Glazier, Reinhold Publishing Corp., 1964. From FIG. 2, for linear detectors with SNRs less than unity, the output is related to the input by a squaring relationship, similar to the square law detector. At input SNRs greater than 10 dB, output is directly proportional to the inputs. Assuming that most modern sensors operate in the $10^{-4}$ to $10^{-6}$ probability of the false alarm range, the input SNR required for 0.5 probability of detection is in the range of 9.4 to 11.2 dB. Within this range, the integration gain obtained when doubling from one to two samples is 2.2 dB. Integration of thirty-two samples provides 10.6 dB of gain, thereby setting the input SNR in the 0 dB range. Doubling the number of samples from thirty-two to sixty-four provides an integration gain of 1.7 dB. This reduction in non-coherent integration gain is as a result of the inverse square change in the SNR from the linear detector transfer function.

From FIG. 2 and the interrelationships between the various detectors, in order to optimize weak signals, an optimized linear detector must minimize or eliminate the inverse square SNR transfer function effects. An optimized system which identifies signal frequency and phase to an accuracy higher than the FFT processor resolution and which is independent of the linear detector would provide a pseudo coherent detector having the beneficial properties of the coherent detector combined with the beneficial properties of the linear detector. As shown in FIG. 2, the coherent detector output SNR is directly proportional to the input, independent of signal-to-noise ratio, and thus provides increased performance for weak signal conditions.

Figure 1:
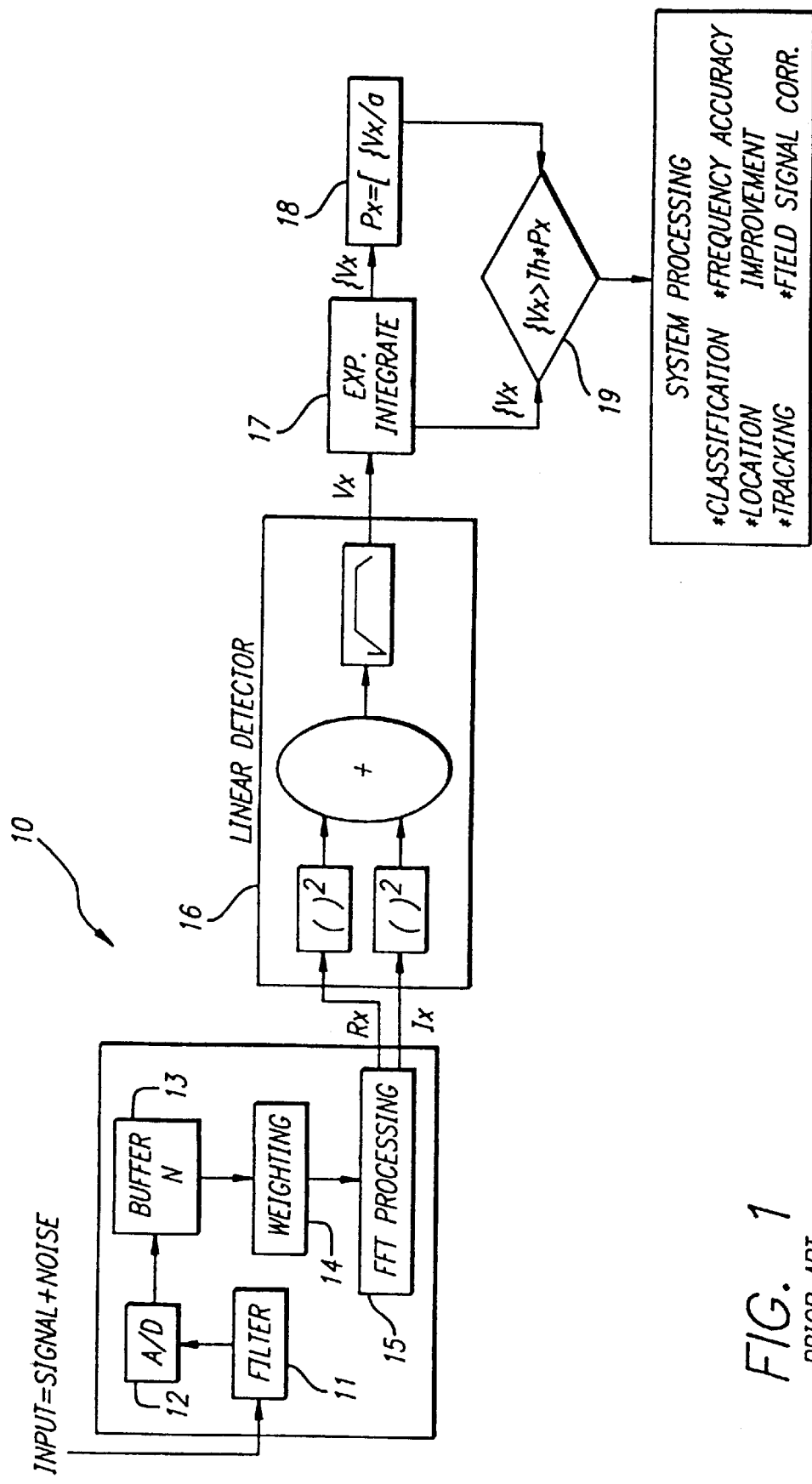
FIG. 1 shows a prior art signal detection system using a linear detector.
Figure 3:
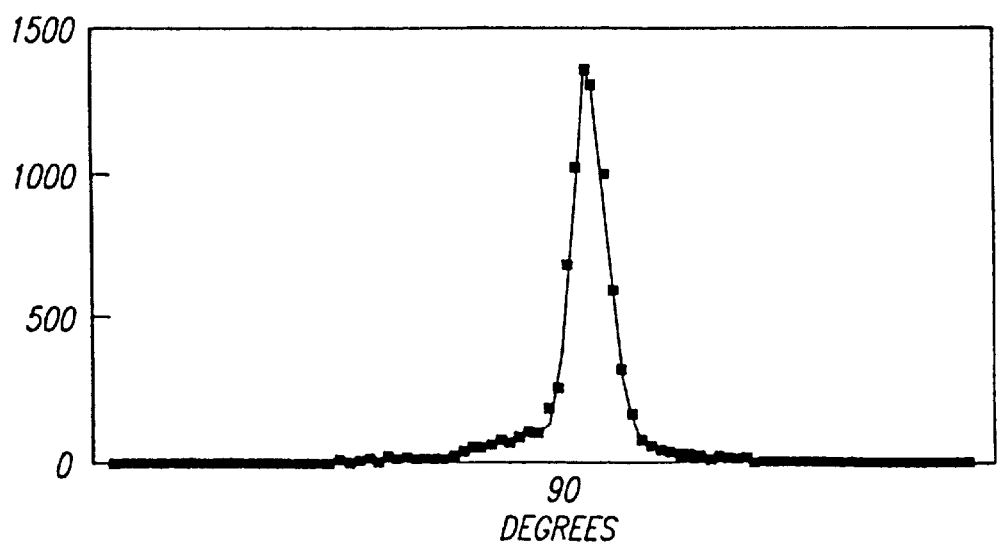
FIG. 3 is the output phase standard deviation of an FFT processor having as input normally distributed gaussian white noise.

The enhanced Fourier receiver design first requires identifying the signal frequency position in the FFT filter without relying on the linear detector of FIG. 1. This signal frequency position identification requires identifying the phase behavior of noise alone, i.e. without signal, from consecutive outputs of the same FFT filter. An example of the phase standard deviation for noise is illustrated in FIG. 3. FIG. 3 assumes an input of uniformly distributed noise into the system and illustrates the output of the FFT filter in the noisy environment. From this figure, the mean value of the noise phase is zero degrees and the standard deviation of the FFT filter output is normally distributed with a mean value of one hundred degrees. Contrary to this indication for noise, expected phase standard deviation from a strong signal is zero degrees, with the exception that the FFT processing introduces changing phase shifts. The signal phase out of the FFT processing depends on (1) the position of the signal in the FFT filter, (2) the degree of signal overlap, or amount of redundancy, used in the FFT processing, and (3) the particular filter used.

Figure 4:
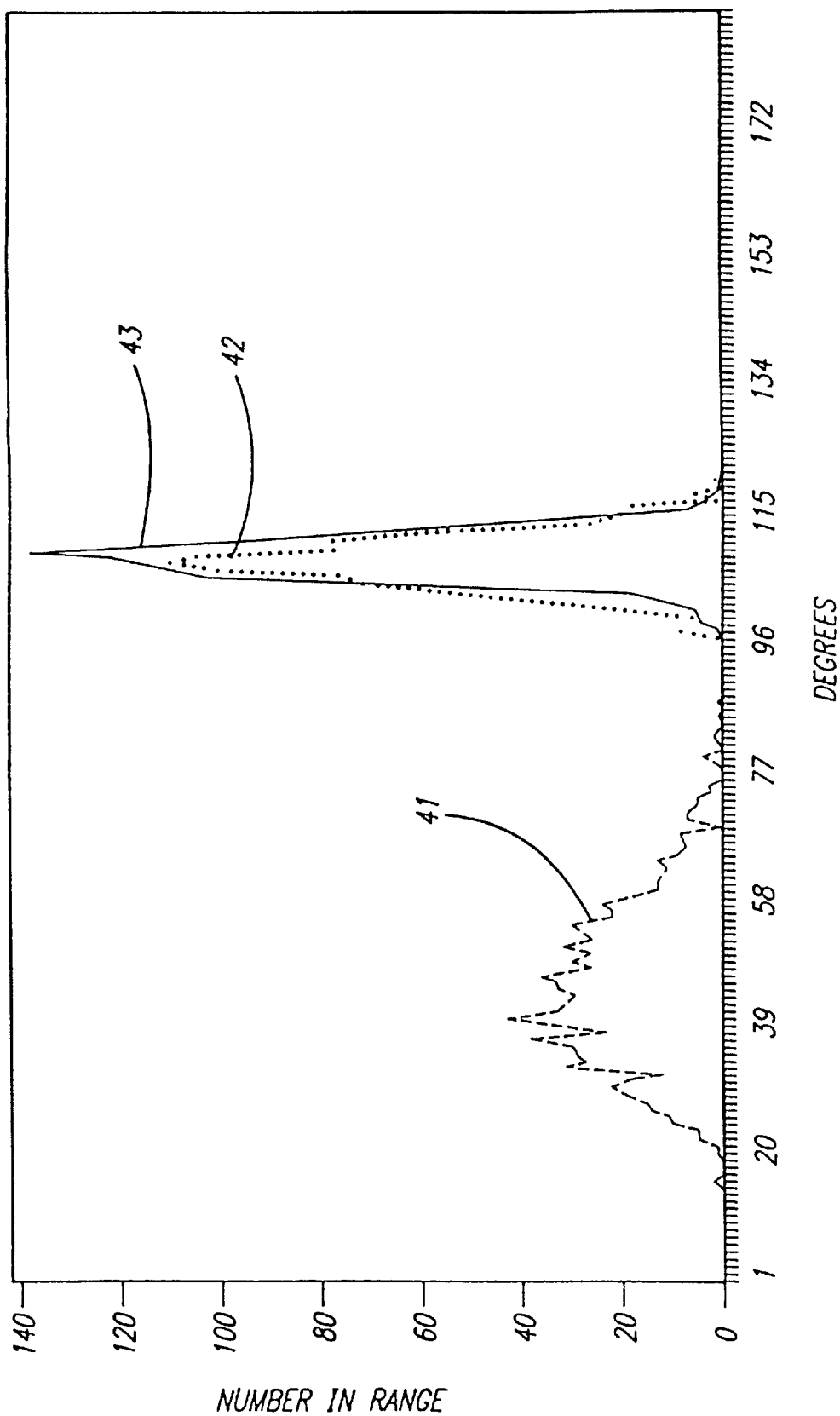
FIG. 4 illustrates processing phase shifts on minimal detection levels for signals in various filters and filter positions.

The effects of phase shifting on standard deviations are shown in FIG. 4 for signals in various filters and filter positions. FIG. 4 assumes a 256 point FFT, Hanning weighted, with 128 point real filters. The system utilizes a sinewave signal with background noise typically utilized in system modeling for signal processing applications. First MDL signal 41 is for MDL signals centered in various FFT filters whose position number is divisible by four, i.e. 4, 8, 12, 16, etc. Second MDL signal 42 is for MDL signals centered in FFT filters whose number is not divisible by four, i.e. 1, 2, 3, 5, 6, 7, 9, etc. Third MDL signal 43 is for MDL signals identical to those of first MDL signal 41, but with the signal 0.3 units above filter center. The mean value of the standard deviation in first MDL signal 41 is forty degrees, while mean values for second MDL signal 42 and third MDL signal 43 are one hundred degrees.

Comparison of these signals with the noise only FFT filter output plot of FIG. 3 shows that a wide separation in the standard deviation exists between an MDL signal condition and noise only in the absence of processing phase shifts. Filter center signals will not have a rotating phase shift when redundancy processing is not used. Four-to-one redundancy processing involves transmitting multiple versions of the signal where twenty-five percent of each version is new and seventy-five percent is from the previous sample. For example, in a four-to-one redundant system, if the signal "01429768 . . . " is to be processed in groups of four, the system will process "0142" first, "1429" second, "4297" third, and so on. Redundancy changes phase rotation among the filters. The filters used to obtain first MDL signal 41 do not have phase rotation, while those of second MDL signal 42 did have phase rotation. This plot indicates that for MDL signals in filters other than those divisible by four or for signals off filter center, virtually no separation between signal and noise exists.

The phase shifting due to redundancy and non-filter centered signals results from the properties inherent in the FFT processing. For a redundancy of four to one, all filters divisible by four, i.e. 0, 4, 8, 12, etc., will not have any phase shift. Filters one greater, i.e. 1, 5, 9, 13, etc., have ninety degrees of phase shift, filters two greater, i.e. 2, 6, 10, 14, etc., will have 180 degrees of phase shift, and three greater, i.e. 3, 7, 11, 15, etc., will have 270 degrees. For signals not filter centered, for a signal higher in frequency than the FFT filter bandwidth divided by two and a four-to-one redundant FFT process, forty-five degrees of positive phase shift occur between successive FFT outputs. If the signal is lower in frequency than the FFT filter bandwidth divided by two, forty-five degrees of negative phase shift occur. All intermediate signal positions or combinations of filter position and offset differences will result in proportionally phase shifted values.

The relationship between the signals of FIG. 4 and the noise out of the FFT filter presented in FIG. 3 indicates that elimination of processor phase shifts provides the capability of detecting signals using standard deviation measurements within a noisy environment. Such an approach requires correcting all signal phase shifts produced by signal processing.

The system design which takes advantage of this relationship requires using a search routine which simultaneously determines the signal frequency in a filter and provides compensation which eliminates processing phase shifts.

Figure 5:
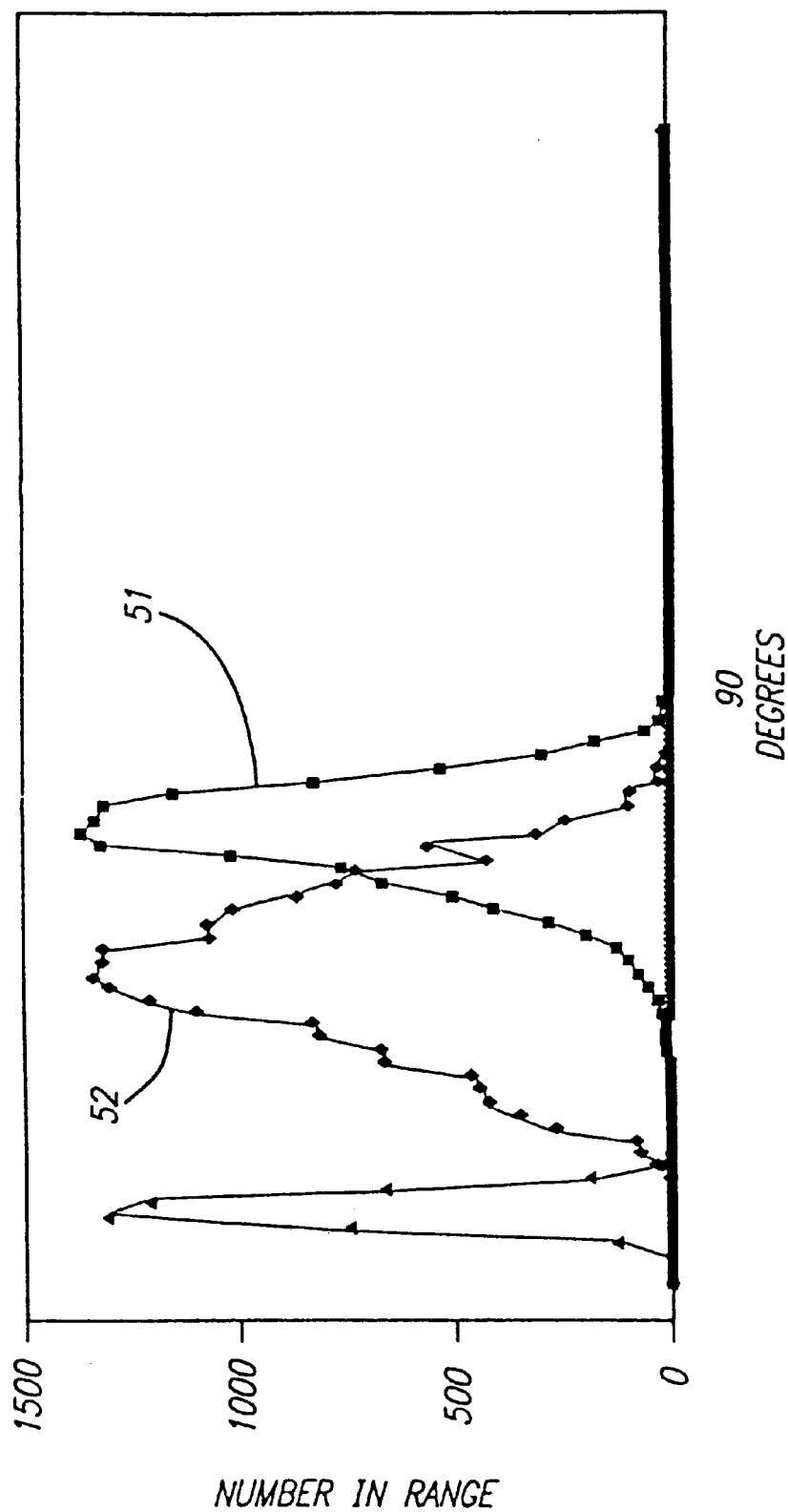
FIG. 5 shows the effects of corrected processor phase shifts for MDL signal and noise standard deviations.

A plot of signals utilizing a technique eliminating processing phase shifting is presented in FIG. 5. As shown, the elimination of processing phase shifting results in the mean value of the noise only phase standard deviation shifting toward the origin. Noise data 51 is the same as used for FIG. 3 data, but the standard deviation is shifted from one hundred degrees to seventy-five degrees due to responding to the correction used. MDL signal data 52 is identical to the third MDL signal 43 of FIG. 4, which is 0.3 units above filter center. With processing phase shifting eliminated, the mean of this MDL signal data 52 is fifty-three degrees. This indicates that correction of all processing signal phase shifts, regardless of the filter or the filter position the signal assumes, provides a way to differentiate between signal and noise and enhance system performance.

To effectuate this enhanced performance, the system measures FFT output phase standard deviation over a number of consecutive FFT runs. The FFT output is then adjusted for processing phase shifts. The design then systematically corrects the FFT output phase for all potential signal filter offset positions while monitoring changes in measured phase standard deviation. The system designates the correct phase shift adjustment as the signal filter offset where the minimum standard deviation occurs.

In order to simultaneously determine frequency and correct processing phase shift, the system must continuously observe the state of the FFT process to change the phase relationship at the output of the FFT filter. The design performs a progressive correction of a series of FFT outputs to monitor the phase standard deviation for each correction. The system also monitors where minimal value is achieved, this being the best estimate of where the signal is located within the filter.

The statistical behavior of the phase standard deviation improves with use of an increased number of integrals. Larger integration periods produce an increase in the value of the mean associated with a signal with the distribution decreasing in width for a given signal. Thus, the greater the number of integrations utilized in the FFT, the narrower and deeper the signal profile analyzed.

Further, with respect to distribution of noise standard deviation based on noise filter position, the probability of occurrence decreases upon moving away from the center of the filter. This phenomenon follows a normally distributed form. A normally distributed function, rather than a uniformly distributed function, provides an opportunity to optimize receiver performance as a function of knowing the location of the signal within the filter. Further, the phase standard deviation process described may be used as a pre-filter for the detection process and yield a reduction in filters. With appropriate thresholding to minimize false alarms, the standard deviation process described herein can be used to filter processed FFT data outputs into noise only and possible signal categories. This reduces sample size for subsequent detection, thereby increasing system performance.

Depending on the environmental conditions encountered, different approaches may be used separately or simultaneously within the receiver. The first approach is to threshold the standard deviation detection at the value producing the desired false alarm rate, and use this information to select which filters may be used to detect signals from the traditional linear detector. The gain available depends on the number of signals that can be eliminated. Generally, one dB of gain is available per order of magnitude reduction in filters without any filter containing signals having been eliminated. If filters containing signals have already been eliminated, less than one dB of gain would be available.

The second approach to enhance performance under different environmental conditions is to threshold the standard deviation detection as in the first option and using this information to select filters from an environmental detector which provides characteristics similar to those of a coherent detector.

The environmental detector selects filters for detection by selecting signal filters based on the measured frequency position. Since the frequency position of all filters is known for all filters, the system cross checks adjacent filters to measure agreement for signals displaced greater than 0.2. If signal agreement does not occur, the signal is noise. If signal agreement occurs, the signal may be a real signal with an attendant false alarm. Signal agreement is determined by evaluating adjacent filters and measuring correlation. For example, if a filter 0.2 right of center has an indication of 0.2 positive, and the adjacent filter is 0.8 negative, the signals are correlated, indicating they are potential signal and not noise. Summation of the two adjacent filter values to unity, or unity plus or minus some small amount, indicates correlation between the two filter positions. All filters are evaluated with adjacent filters to determine correlation and signal agreement. In addition to adjacent filter checking, consecutive filter checking also provides enhanced detection and tracking capability.

As an alternate embodiment to adjacent filter correlation and standard deviation selection, the system may perform consecutive filter correlation by splitting the integration period into parts and measuring the parts for consecutive filter agreement. Such an implementation is not as beneficial as adjacent filter correlation or standard deviation selection. Such an implementation provides satisfactory tracking data in the filter centers where adjacent filter processing was weak. Combining these techniques can provide an enhanced detection and tracking capability, as adjacent filter correlation yields higher performance at filter edges, while standard deviation selection performs better for filter center regions.

Another embodiment of the system involves pseudo coherent integration. The system selects a filter for potential signal, wherein the system establishes the frequency of the signal and corrects the processing phase shifts from FFT output to output. The system then performs pseudo coherent integration by locating the mean phase shift occurring within the number of FFTs integrated and correcting all FFT runs by the mean phase shift value. This separate phase shift correction is performed due to the uncertainty of the phase of the received signal with respect to the FFT processing and not as a result of the processing, as was the phase shift correction described above. After correcting for this phase shift, the integration is then performed by multiplying the magnitude of each FFT filter output by the cosine of the corresponding corrected phase and summing all FFTs in the integration period for the respective filter. The expected value of the coherent integration is zero for all filters containing noise and a positive sum value for all filters containing signal. The result of this technique is that noise amplitude is lower than signal amplitude. Noise amplitude, even though lower than signal amplitude, is still relatively significant, and reduces performance benefits by forcing higher thresholds.

An alternative to the pseudo coherent approach involves using direct coherent transforms, which uses input data to the FFT process rather than the synthesized approach out of the FFT process as discussed above. Direct coherent transforms provide the ability to reprocess all filters identified with a potential signal. From the previous discussion, position and phase are known from the previous measurements and a direct transform is in order.

This coherent processing phenomenon is an alternative to pseudo coherent integration, and is suggested as an alternative due to the fact that filter centered signals require no phase correction and can provide increased performance benefit. Thus, an alternative to phase shifting entails shifting FFT input signals and rerunning FFT processing, and repeating this input signal shift and FFT processing cycle multiple times.

The system described thus far provides data integrated with a traditional approach or a pseudo coherent approach, frequency information which predicts the position of the potential signal in the filter, filter response data showing the amount of signal in the adjacent filters, phase standard deviation values and false alarm rates to sort filters into noise only and potential signal, adjacent filter correlation and false alarm rates to sort filters into noise only and potential signal, and information to employ single filter detection capability.

Single filter detection may also yield superior results for different environmental signal conditions. Two processes for providing single filter detection may be employed. The first process utilizes phase standard deviation measurement and thresholding at $10^{-4}$ false alarm rate. The second process entails lowering the standard deviation for a higher false alarm level and more detections, and subsequently filtering based on threshold exceedances of the ratio of the integration value of the pseudo coherent integration to the traditional integration value. The combined thresholding provides an overall false alarm level of $10^{-4}$. This second process yields significantly improved results, and may be optimized by utilizing additional filtering out of noise signals based on adjacent filter correlation as described above.

Fourier Receiver Improved Performance System Design

Figure 6:
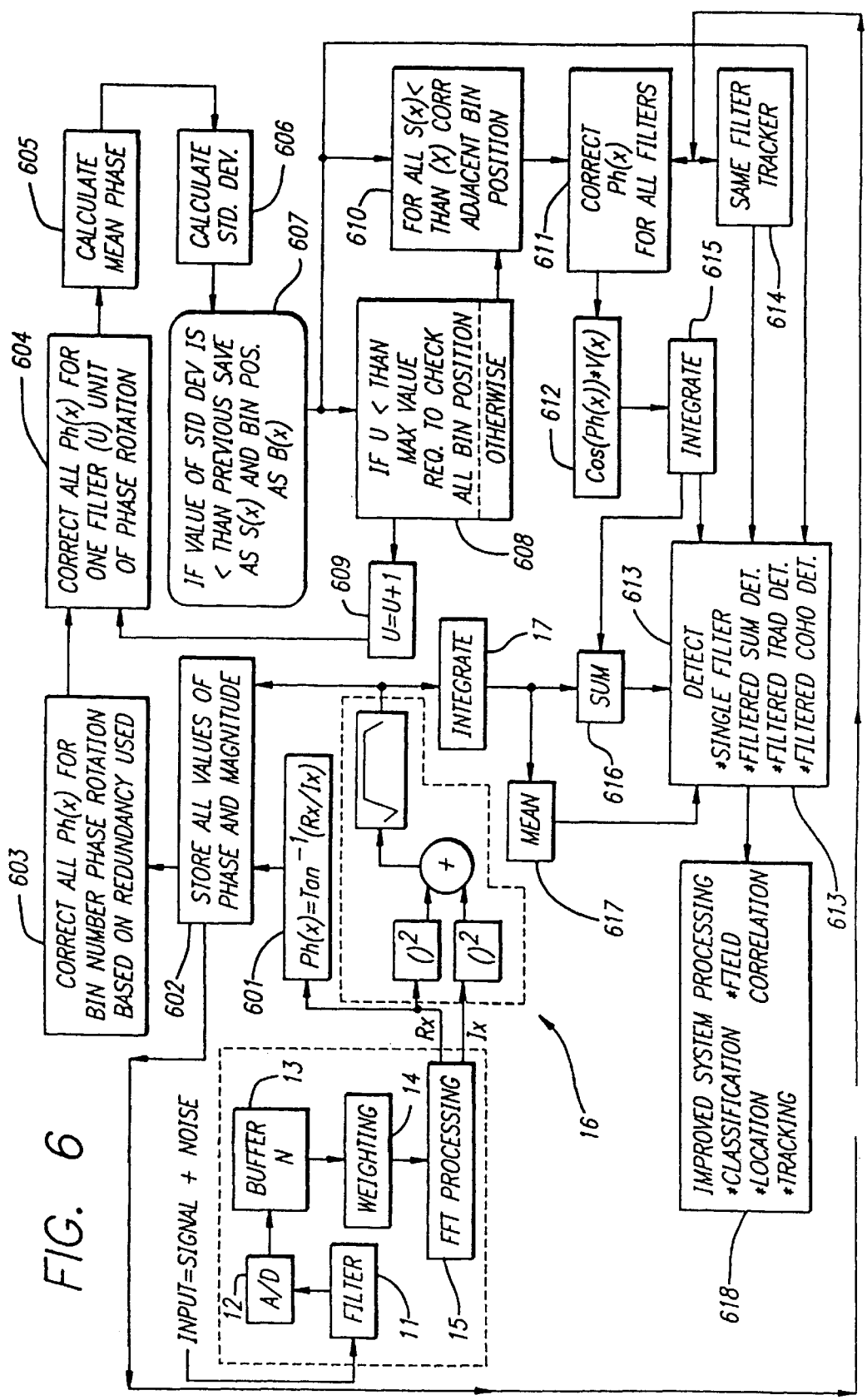
FIG. 6 is an illustration of the signal detection system in accordance with the teachings of the present invention.

The design of the system employing the inventive criteria outlined above is illustrated in FIG. 6. The system utilizes many of the elements shown in FIG. 1. The real and imaginary outputs of the FFT processor 15 are routed to arctangent function 601 which calculates the phase of the filter output for all FFT filters and for all FFT runs desired in the integration. Storage step 602 stores all results from arctangent function 601 for further processing in addition to the values received from the linear detector 16. The system searches all FFT filters for signal positions which provide minimal phase standard deviation irrespective of the presence of the signal. The system corrects phase for each filter based on its filter number position. A typical system utilizes four-to-one redundancy in order to minimize integration losses due to the weighting function. However, any value of redundancy may be utilized and still be within the scope of the invention.

For a four-to-one redundancy, as described above, all filters evenly divisible by four need no bin center correction. All adjacent filters one position up from these filters require −90 degrees of phase shift, two positions up require −180 degrees of phase shift, and three positions up require −270 degrees of phase shift. The system performs this shifting based on redundancy in phase correction block 603.

Figure 7:
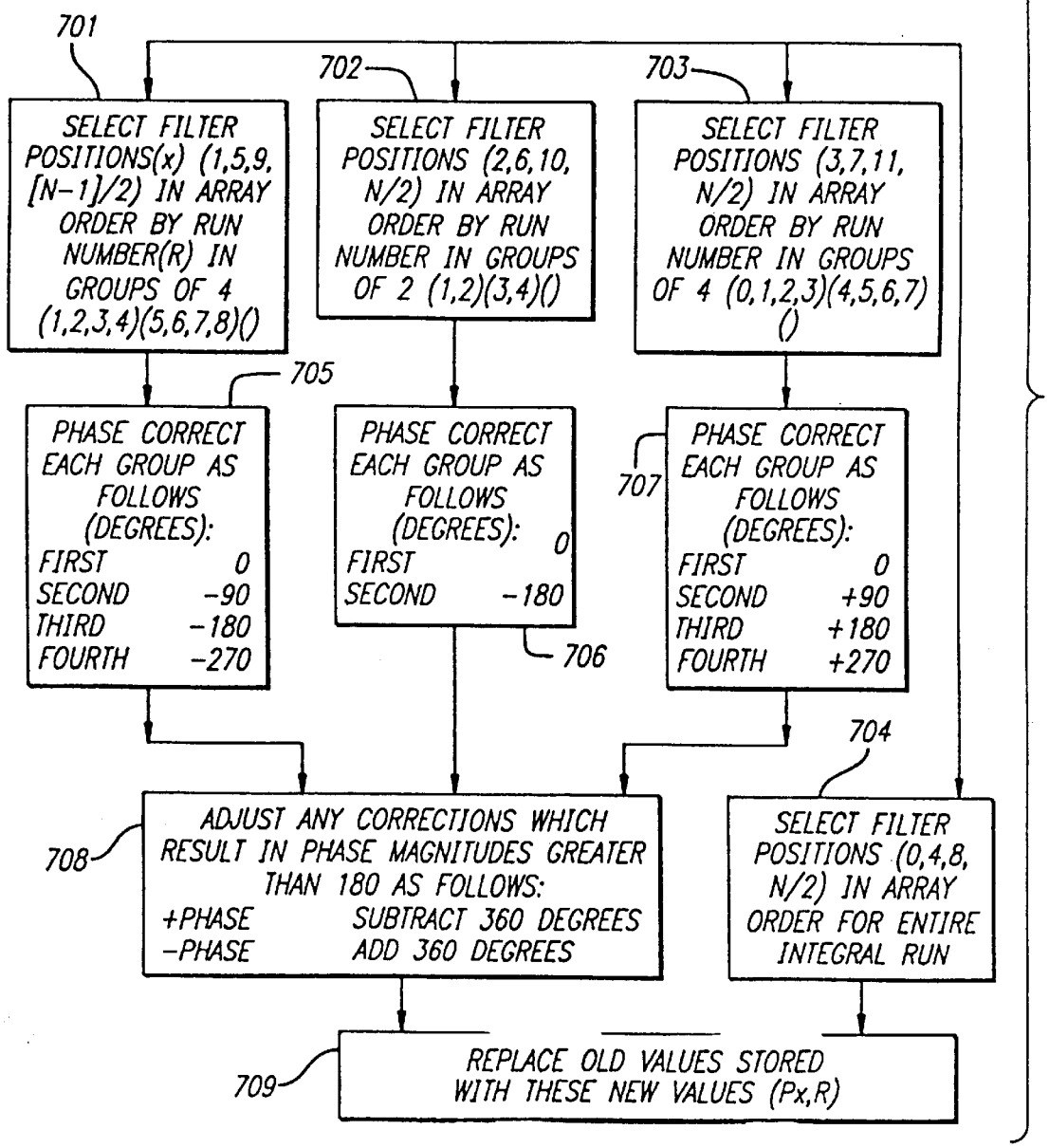
FIG. 7 is an expanded view of the process required to correct processor phase shifts in each FFT filter.

An expanded view of the phase correction block 603 operation is presented in FIG. 7. From FIG. 7, phase is cumulative up to a full rotation, 360 degrees, and then repeats. The phase information representing the output of the FFT function, due to the arctangent function, produces a discontinuity at the 180 degree point. Phase correction must account for this discontinuity. Discontinuity correction block 708 monitors all correction addition/subtractions, and if magnitudes occur that exceed 180 degrees, a full rotation correction occurs as shown. All corrected values replace the old values in step 709.

Phase rotation as described herein uses an arc tangent function. A less computation intensive alternative is to use the real and imaginary outputs of the FFT process and rotate using a unity vector for pulse compression in the frequency domain. The unity vector approach may replace the arc tangent function here.

Following phase correction in phase correction block 603, the system corrects filter phase shift based on signal position in the position phase correction block 604. For this particular design the filter phase shift is corrected in increments of one degree per FFT run, however other correction values are appropriate for different specific designs. The one degree is cumulative with FFT run numbers, i.e. first FFT run is zero degrees, second run is one degree, third run is two degrees, and so on. Following each incremental shift of all of the FFTs in the integral, the system calculates the mean and the standard deviation of the phase in mean calculation block 605 and standard deviation calculation block 606. The standard deviation is checked against the previous value in standard deviation evaluation block 607, and if the standard deviation is less than the previous value, the new value is stored along with the filter positional number.

Figures 1, 8:
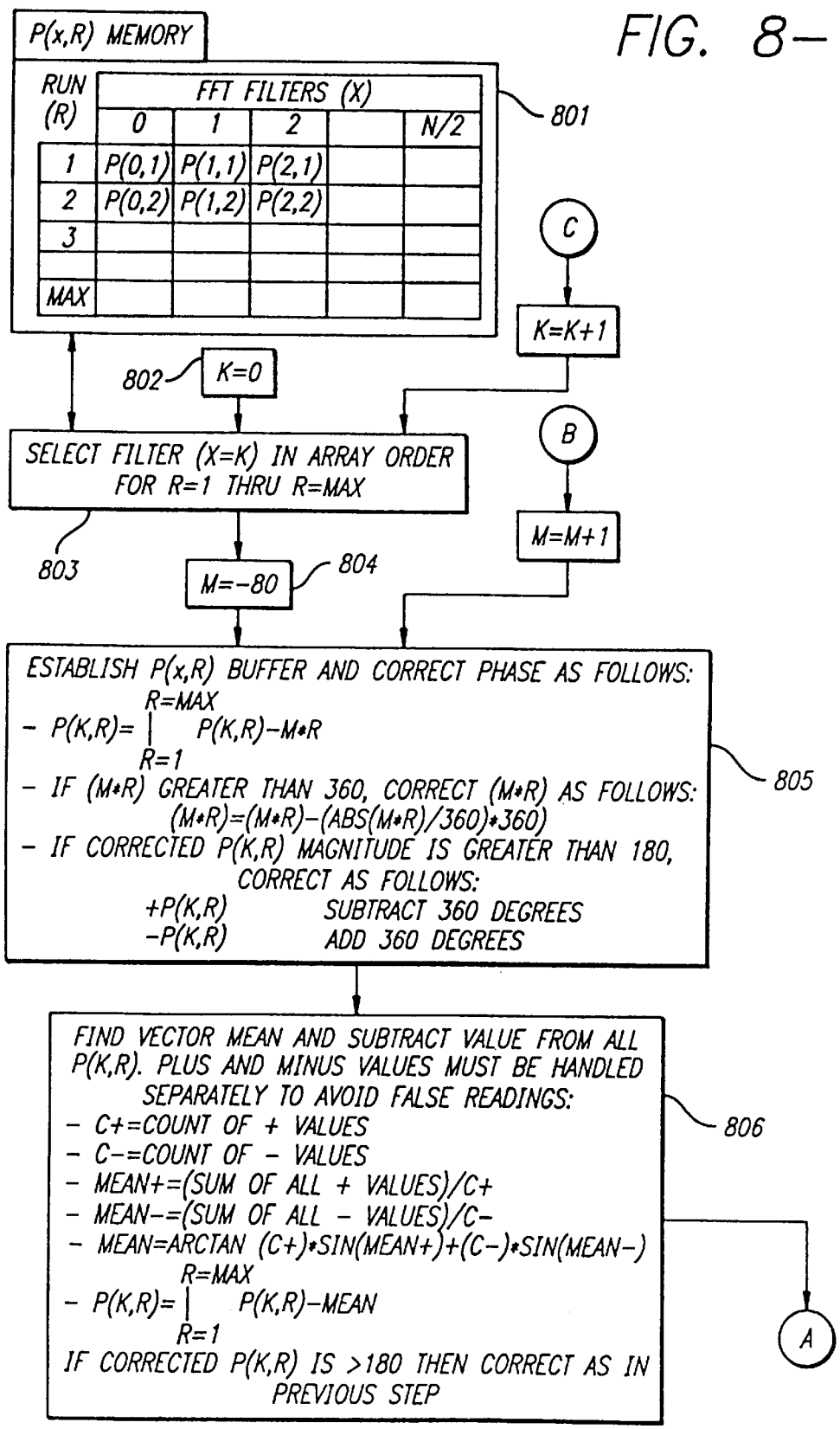
FIG. 8 illustrates the search process used to find the filter position that provides minimum standard deviation.
Figures 2, 8:
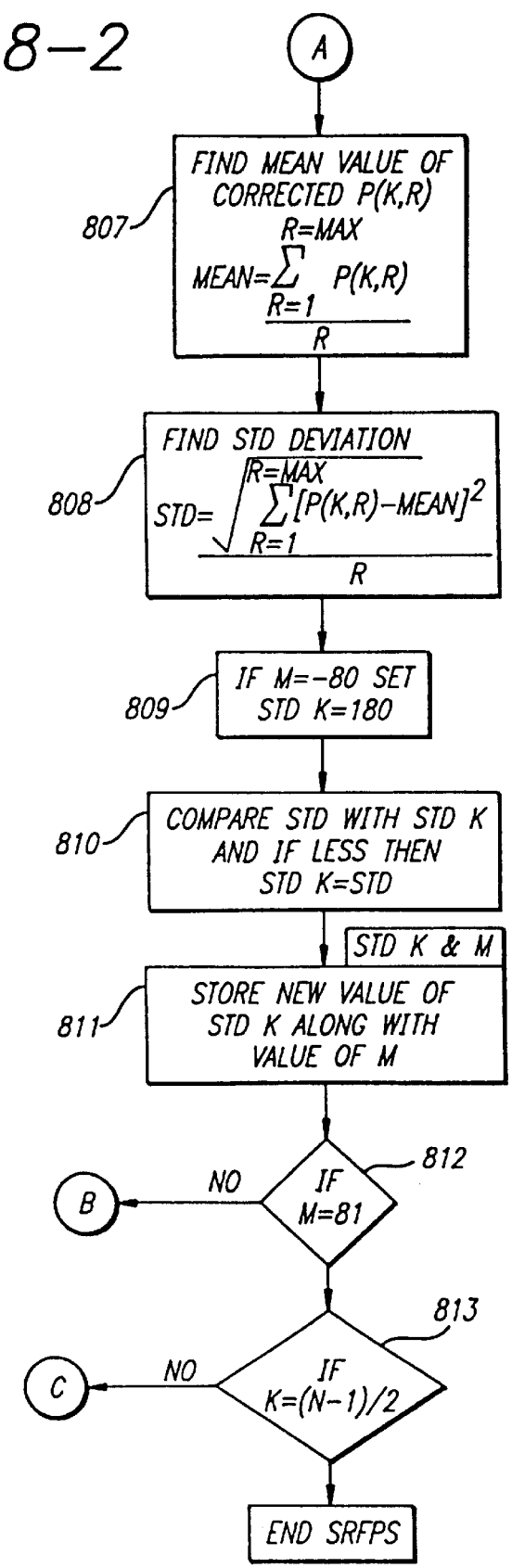

FIG. 8 illustrates the design of signal position correction evaluation blocks 604–609. The search routine, called SRFPS, locates the "potential signal" in each FFT filter. The process initially selects all of the processed data for the first filter, including runs one through the maximum number of integrals selected for integration. Block 805 illustrates a phase multiplier M of −72 degrees, corresponding to −0.8 offset from filter center, is subtracted from the first run value. The resulting phase is checked for 180 degree discontinuity and corrected if the addition/subtraction magnitude exceeds 180 degrees. The new value is stored in a processing buffer and the process repeated for a second run value with M multiplied by the run value. The process is repeated for all runs to be integrated. The resulting process serves to correct phase for all values in filter zero for a hypothesized signal in a −0.8 filter offset position.

Block 806 determines the mean phase value among all the R values in the selected filter. Again, the 180 degree discontinuity requires a compensating technique. The system requires an array vector arithmetic approach as shown in step 806. All the buffered run values for the selected filter are corrected by subtracting the mean value from each run. This process shifts the mean phase value of all the integral values to near zero degrees. Block 807 confirms that the zero mean value is achieved. In the vicinity of zero degrees, traditional mean value calculations are in order due to the separation from the 180 degree discontinuity.

Block 808 determines the standard deviation value of phase for the given M value. Block 809 sets the initial value of standard deviation to 180 degrees for each filter run, and block 810 compares the calculated value with the previous value and if the new standard deviation value is less, the new value is stored along with the filter positional number in block 811. This process is repeated for M of −71 to M of 72 in steps of one degree. The search from −0.8 offset to 0.8 offset for each filter locates the signal position where the minimum standard deviation occurs, and the standard deviation and signal position M (frequency of the filter) are recorded for use in other processing. The original values of phase remain unchanged in memory.

Typically, a total of seventy-two degrees, or 0.8 offset, are searched on each side of the filter center, but different ranges may be searched depending on timing and performance specifications while still within the scope of the current invention. Block 608 checks the total number of filters and when completed passes control to adjacent filter correlation.

Adjacent filter correlation block 610 measures adjacent bin position for all filters whose bin position is greater than 0.2 offset, and if correlation with the adjacent filter is within four units, then both filters are tagged for special detection processing. Correlation based on four units is based on observed test results, but other values may be used and still be within the scope of the invention.

An additional step is to determine range bin straddle. Range bin correlation is a process similar to adjacent filter correlation with the exception that the subject of correlation is the range bin following the filter of interest. If correlation occurs, the filter is tagged for range correlation as well.

An additional alternate embodiment of signal detection is provided by the filter tracking unit shown in FIG. 9. Consecutive filter tracking augments detection within 0.2 units of filter center. When a filter is selected, all runs associated with the filter are grouped into subarrays. Each subarray is processed using the steps shown in FIG. 9, particularly blocks 902–904. The system calculates and stores standard deviation and M values for further processing.

Before integration, the system corrects the original stored values of phase, Ph(x), for filter number phase rotation, filter signal position measured, and mean signal phase shift in phase correction block 611. Phase correction is per blocks 805 and 806 of FIG. 8.

The system then applies pseudo coherent integration in pseudo coherent integration block 612 by taking the cosine of the corrected stored phase value Ph(x), multiplying it by the filter magnitude value, dividing the value by the number of samples in the integral, and summing it with the value obtained for the repeated process on the next sample to be integrated. The system repeats this process for all samples in the integral period and for all filters.

The arc tangent phase rotation approach can be replaced with the unit vector approach. This change requires that the above process be applied to the Real and Imaginary values stored out of the FFT process.

Detection declaration step 613 declares detections by observing and utilizing the results of previous functions based on the integration period and the environment where the processor operates.

The same filter detection approach in detection block 613 thresholds the standard deviation for a higher false alarm level and performing more detections, and subsequently filtering the results based on threshold exceedances of the ratio of the integration value of the pseudo coherent integration to the traditional integration value and filter testing. This ratio must exceed a predetermined threshold value and if exceeded, must satisfy filter testing. To satisfy filter testing, (1) the standard deviation of the filter must be less than a predetermined standard deviation value, (2) the traditional integration value must be larger than a threshold value for the traditional integration mean, and (3) the signal position in the filter must pass a coarse adjacent filter test. The system adjusts all threshold values based on the signal position in the filter.

The use of the ratio test is based on optimization of the radar mode of operation, and choosing to use the ratio test singularly or in combination with the subsequent summed test is an alternative method to enhance performance.

Figure 10:
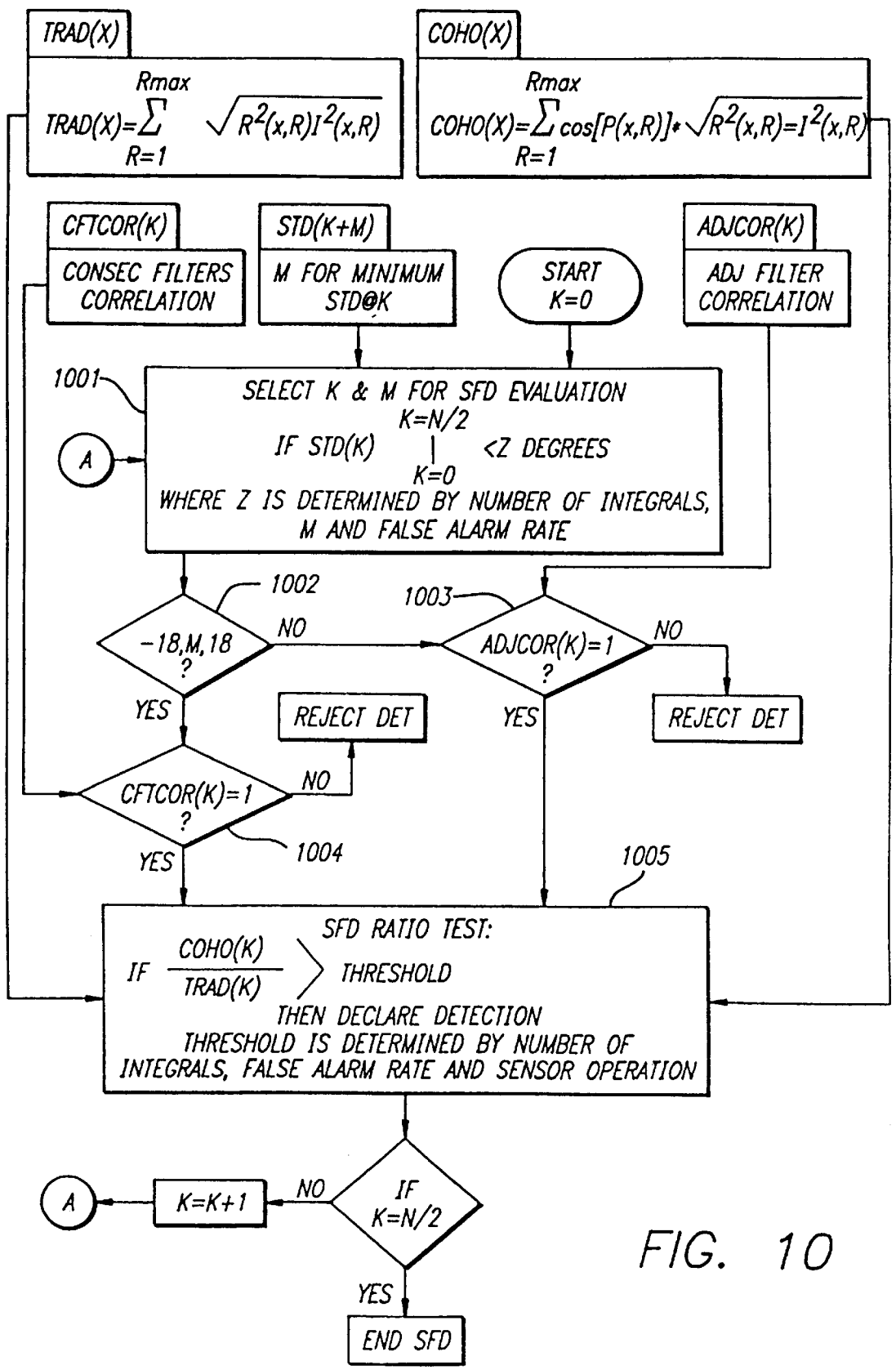
FIG. 10 shows the operation of the same filter detection scheme of the detection block.

The operation of the same filter detection scheme of detection block 613 is presented in FIG. 10. Filter testing is shown in blocks 1001, 1002, 1003, and 1004. Passing the filter test requires that the standard deviation of the filter must be less than a predetermined standard deviation value as shown in block 1001. If less than 0.2 units displaced from filter center, block 1004 checks if the signal passed the consecutive filter tracking test outlined above. If it did pass this test, the signal is routed to the single filter ratio test of block 1005 for ratio test. If the ratio test is passed, the system declares a signal detection. If the signal position is greater than 0.2 units displaced, the signal is routed to block 1003 for adjacent filter correlation check. If it passes the test, it is routed to block 1005. The process is repeated for all filters.

Figure 11:
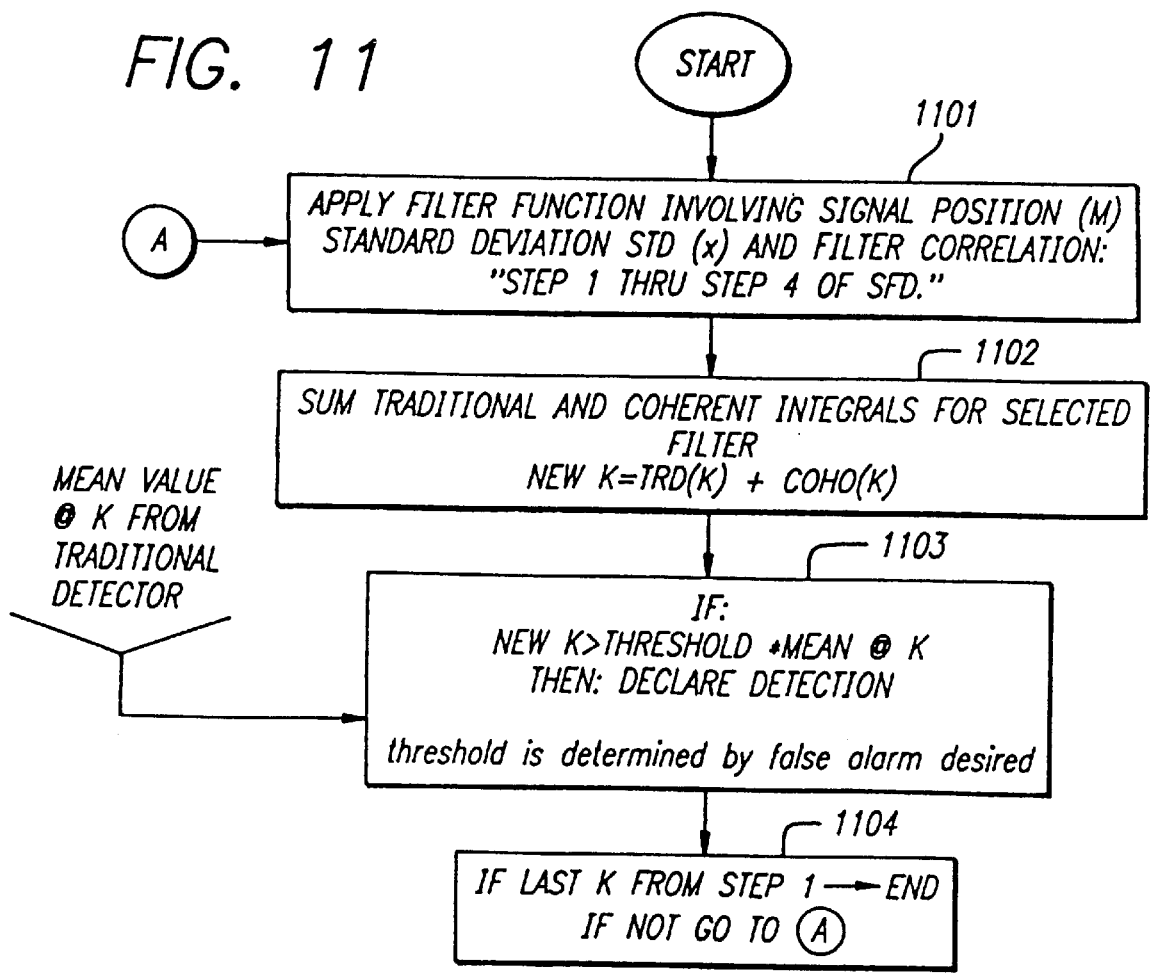
FIG. 11 shows a filtered sum detector used with the detection block.

Detection block 613 also includes a filtered sum detector in accordance with FIG. 11. The filter function of FIG. 10, including blocks 1001, 1002, 1003, and 1004, reduces the false alarm rates. This reduction in false alarm rates is followed by a summation process where the pseudo coherent integration for the selected filter is added to the traditional integration value of the same filter. Detection is then accomplished with a threshold exceedance test. Filtered traditional detection and pseudo coherent integration detection are accomplished in a like manner.

In order to optimize system performance, the integrated signal detector using pseudo coherent integration employs several different concepts to obtain improvements across the filter bandwidth from −0.5 to +0.5. The region from −0.1 to +0.1 sums the pseudo coherent detection with traditional detection. Detections must exceed a predetermined threshold value based on the mean and must pass filter testing. To pass filter testing, the standard deviation of the filter must be less than a predetermined standard deviation value and the signal position in the filter must reside between −0.1 to +0.1.

The region between 0.1 and 0.4 on each side of the filter center is based on thresholded pseudo coherent integration and several different filter concepts. The 0.1 to 0.3 filter uses standard deviation and signal position, while the 0.2 to 0.4 filter uses a larger standard deviation and a coarse adjacent filter position correlation. The 0.3 to 0.4 filter uses the largest standard deviation and signal position. For signals between 0.4 and 0.5 on each side of filter center, the detection process employs adjacent filter summation. For those filters the correlation identifies, the signal in the nearest adjacent filter is summed with the identified filter and the system compares the sum to a threshold obtained by multiplying the mean value calculated for the traditional detector by the value providing the $10^{-4}$ false alarm detection rate.

For a system using a 256 point FFT, four-to-one redundant, with a 40 or 160 integration period, in a setting with a signal to noise ratio for the processor in the 0.4 to 0.6 probability of detect, and with SNRs of 0.13 or 0.076, the enhanced system shows overall improvements of 2 to 4.5 dB average improvement across the filter and even greater improvement at the edges of the filter. Noise distribution is normally distributed with the mean centered in the filter and decreasing at the filter edges, and in the configuration described provides the features for good adjacent bin correlation in the 0.3 to 0.5 filter regions. Adjacent bin correlation reduces false alarm detections, permitting lower thresholds to increase signal detections.

The parameters outlined above have been used for testing purposes, and it is to be understood that systems utilizing different parameters, such as 1000 point FFTs, will produce similar beneficial results.

Performance for the measured coherent integration performance using pseudo coherent integration is better than the measured simulated performance of the ratio detector described above. However, the ratio detector may be utilized in applications where accurate measurement of the local power mean is difficult. The use of the ratio detector in a real environment may provide better overall performance.

While the performance of the ratio detector is generally not as good as the integrated detector, its overall performance in radar operation may be better due to the spikiness of background clutter. Spikiness or tilted background noise power distorts the values used to discriminate the target from noise or clutter, inherently reducing performance.

While the invention has been described in connection with specific embodiments thereof, it will, be understood that the invention is capable of further modifications. This application is intended to cover any variations, uses or adaptations of the invention following, in general, the principles of the invention, and including such departures from the present disclosure as come within known and customary practice within the art to which the invention pertains.

Doppler High and Medium PRF Radar

Figure 12:
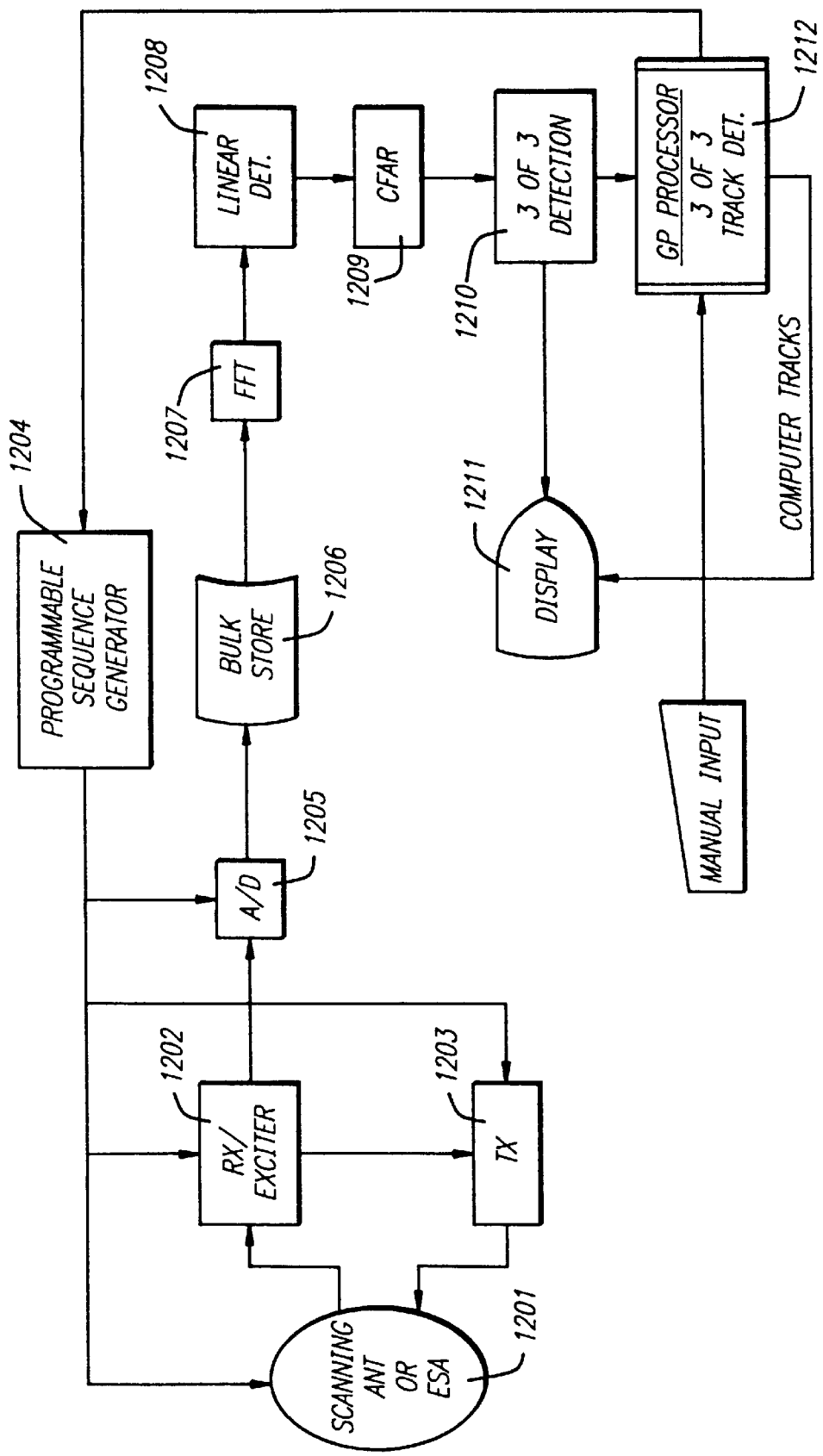
FIGS. 12 and 13 are expanded detail flow diagrams for a conventional fighter application medium and high, respectively, PRF radars.

The architecture of the typical Doppler high PRF radar is illustrated in FIG. 12. Referring thereto, radar scanning antenna 1201 interfaces with radar receiver/exciter 1202, radar transmitter 1203, and programmable sequence generator 1204. Analog-to-digital converter 1205 receives data from radar transmitter 1203 and programmable sequence generator 1204 and passes data to bulk store 1206. Bulk store 1206 passes data to FFT element 1207, which passes transformed data to linear detector 1208, on to CFAR thresholding unit 1209, and to 3 of 3 detection unit 1210. 3 of 3 detection unit 1210 passes detection information to display 1211 and general processor 1212, which may receive manual input and pass computer tracks to the display 1211.

Figure 13:
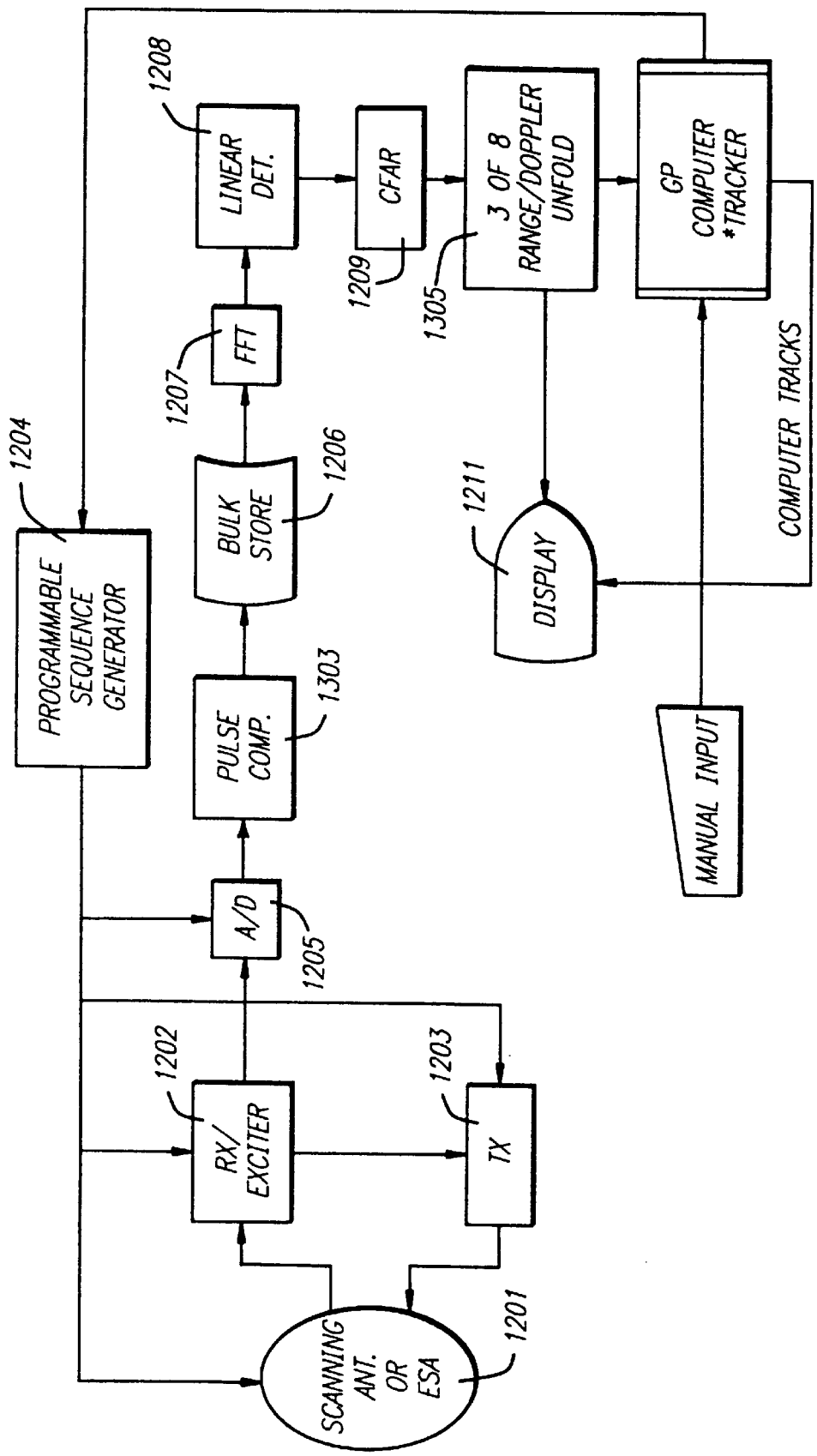

For medium PRF operation, as shown in FIG. 13, the architecture is changed by adding pulse compression codes to the transmitted waveform, adding a pulse compressor 1305 following the analog-to-digital converter 1205 and providing a 3 of 8 detector following the CFAR thresholding unit 1209. The performance of both medium and high PRF situations is driven by average power radiated and time on target. However, this architecture, even though optimal, with current technology has fundamental constraints and problems that limit performance during its intended usage.

The high PRF mode does not offer an architecture that shows promise of major improvements and consequently target tracking performance using high PRF suffers. The tracker used in current is slow to converge to a quality answer for target position and heading. Slow convergence is due to insufficient resolution of the radar range and azimuth data for the tracker solving for target heading and velocity with minimal updates. The high range resolution in medium PRF is highly desirable, and the large losses incurred due to time lost to resolve ambiguities provides a good starting point to obtain improvements. The obvious place to begin is medium PRF and insure a better utilization of the dwell time budget available for processing, maintain average power on the target, and capitalize on technology for maximum processing gains.

Significantly, the problem of range and Doppler ambiguity in medium PRF occurs only at the onset of first detection. That is, after detection the problem becomes one of tracking updates which can negate the need for continuous range and Doppler ambiguity resolution. The quality of the range information will help tracking problems but more importantly, the current invention is focused to provide measurements that will simplify and speed up target tracking.

The following sections each describe the design rationale or approach for improvements incorporated into a new medium PRF mode. The new medium PRF architecture section illustrates integration of these improvements into the new medium PRF architecture.

A set of design characteristics is used throughout the design description to allow analytical and performance explanation. However, it is to be understood that the design of the medium PRF invention is not dependent on these chosen characteristics, but may employ alternative characteristics, while still within the scope of the invention. There are an infinite number of alternative characteristics that could be used. The specifics would be driven by the radar developer meeting the objectives of the radar operational characteristics.

The characteristics used are illustrated in Table 1 below.

TABLE 1

|  | PRF | | PULSE WIDTH | RANGE RES | RANGE GATES | ECLIPSED RNG-GATES | DWELL TIME | INTEGRALS |
|---|---|---|---|---|---|---|---|---|
| PRF SET-1 | PRF-1 | 25000 hz | 10 usec | 250 ft | 80 | 20 | 28.5 ms | 11 |
|  | PRF-2 | 24096 hz |  |  | 83 |  |  |  |
| PRF SET-2 | PRF-1 | 21978 hz | 12 usec | 250 ft | 91 | 24 | 28 ms | 9 |
|  | PRF-2 | 21276 hz |  |  | 94 |  |  |  |
| PRF SET-3 | PRF-1 | 19801 hz | 14 usec | 250 ft | 101 | 28 | 29 ms | 8 |
|  | PRF-2 | 19230 hz |  |  | 104 |  |  |  |

Target revisit time (t) = 2 seconds

The pulse width and PRF were chosen to maintain average power and as such require that the pulse compression change when PRF is changed. Revisit time need not be consistently fixed but rather can change from scan to scan. This provides time in the intervals to be used for other functionality, i.e. radar, communication, anti-jamming, etc.

1. Frequency Domain Pulse Compression and Doppler Ambiguity Resolver

Figure 14:
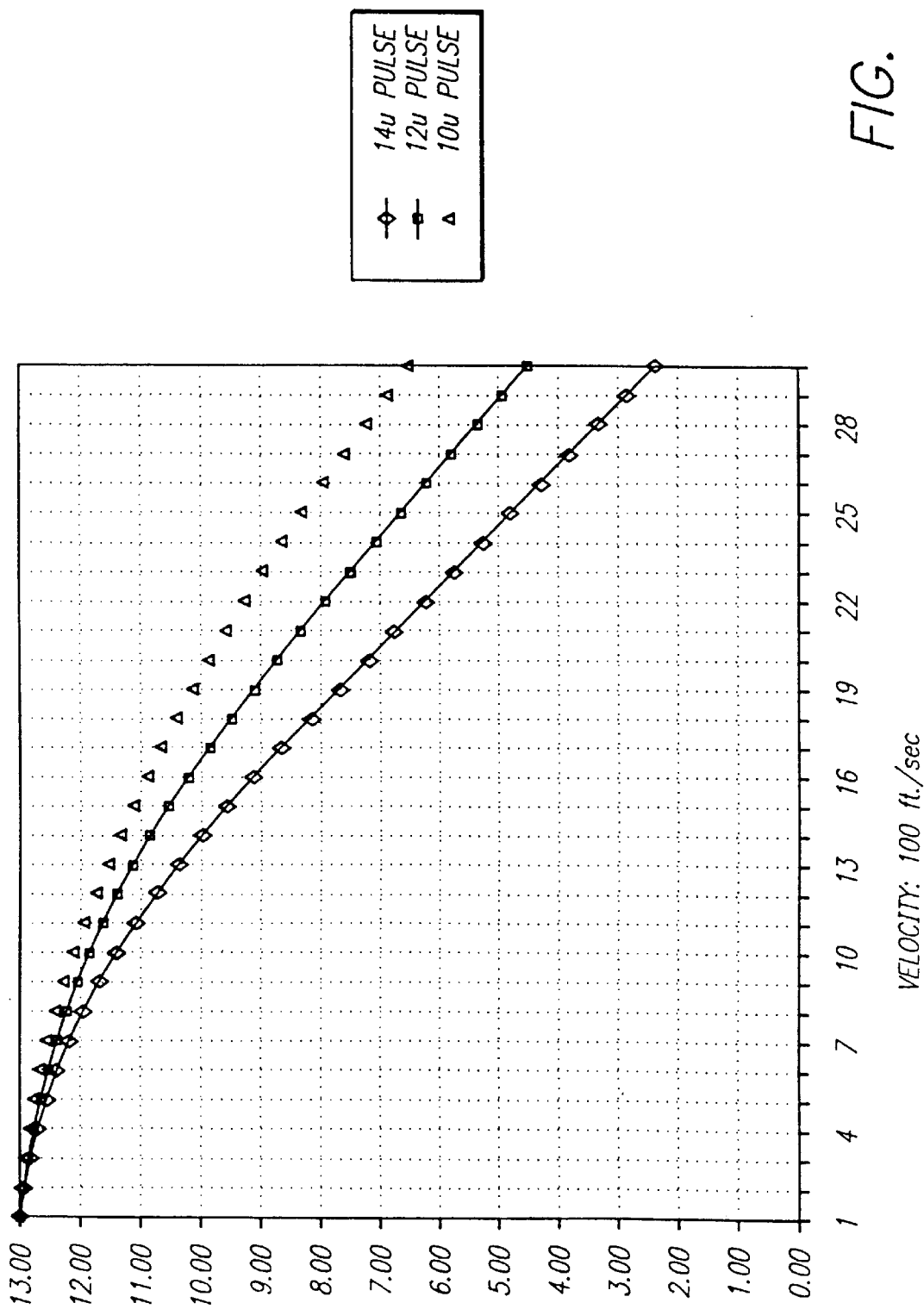
FIG. 14 shows pulse compression signal loss.

Pulse compression is often used in medium PRF radars to increase average power radiated and provide high range resolution. If the pulse width of the uncompressed pulse becomes an appreciable portion of one cycle of the Doppler frequency, a significant performance loss occurs. The losses are of the form shown in FIG. 14 and become appreciable for high closing velocities. The losses shown therein were computed for 13:1 pulse compression; however, the degree of pulse compression does not affect performance loss.

Traditional approaches for implementing pulse compression and reducing losses include compressing data following the analog-to-digital converter 1205 and mixing the signal with multiple frequency translation signals forming multiple processing channels. Each frequency translation signal is chosen to change the Doppler frequency to avoid losses. Costs associated with this approach are that it requires duplication of the entire channel from FFT processing through CFAR detection for each channel.

Figure 15:
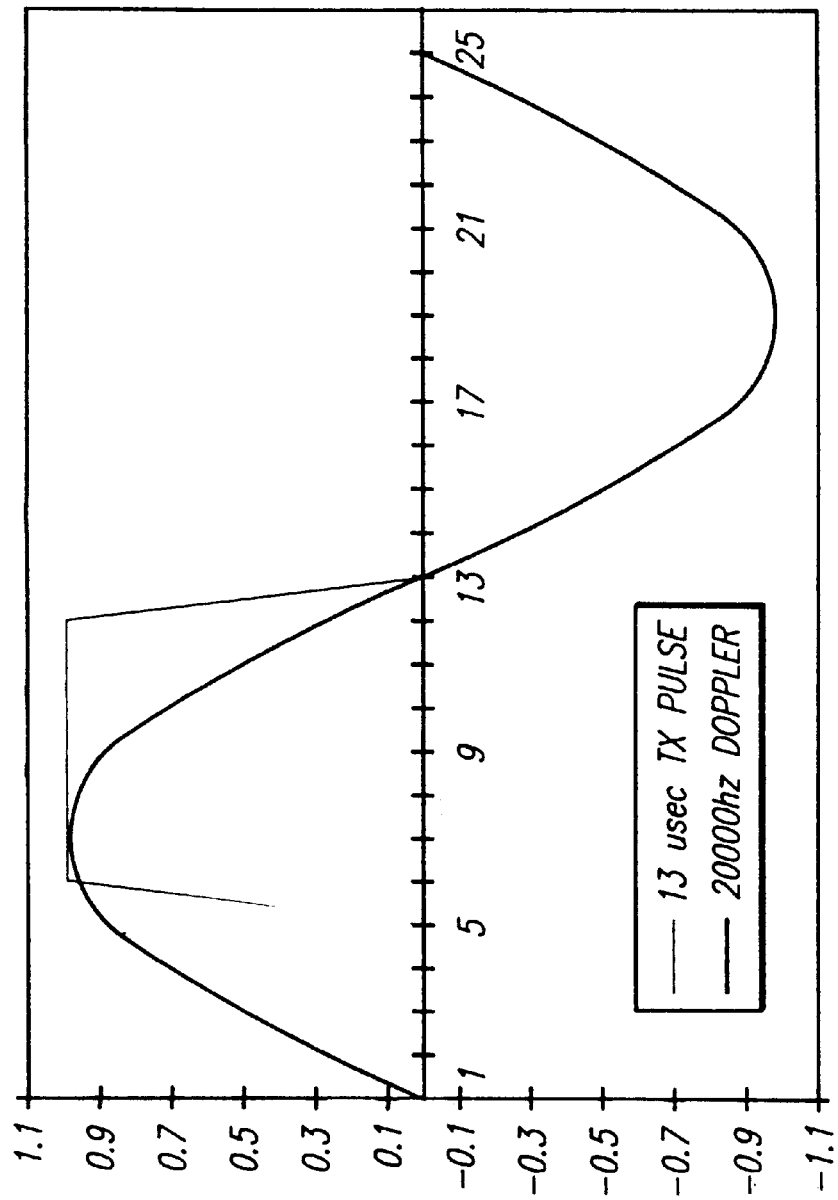
FIG. 15 shows the relationship between high Doppler and TX Pulse.

FIG. 15 illustrates what is occurring as the pulse width widens with a high Doppler frequency. From FIG. 15, if the transmitted pulse is one quarter the duration of one Doppler cycle, the phase shift occurring across the sample pulse is ninety degrees. Using a 13:1 pulse compression ratio indicates that each segment in the pulse is moving out of phase with the previous segments. For the situation illustrated in FIG. 15, the second pulse compress element is one thirteenth of ninety degrees out of phase with the first, the third is two thirteenth's of ninety degrees, and so on. With this phase shift using the traditional compression following the analog-to-digital conversions, the summation to compress the pulse will not all be in proper phase relationship with each other, leading to the performance degradation shown in FIG. 14.

Compensation could be applied to shift the loss curve to a different Doppler frequency by simply applying a set amount of phase shift to all the elements. Such a compensation application could move the loss curve so that optimum performance occurs at target velocities of interest without adding more Doppler channels. This is also the way to provide compensation if the system employs more processing channels.

An alternative approach is to perform the compression in the frequency domain by computing the phase for the Doppler center frequency of the FFT filter being compressed for all range gates involved in the compression. FIG. 16 illustrates the phase shift that would occur using a thirteen microsecond pulse with thirteen-to-one pulse compression and considering Doppler velocities through the first Doppler fold.

In the frequency domain, positive Doppler is associated with an inbound target and negative Doppler is associated with an outbound target. Increasing positive Doppler moves from filter zero to filter one, and so forth. Negative Doppler moves from filter zero to filter 63, and so forth. In addition the phase shift for outbound targets is negative and for inbound targets is positive. In viewing the phase shift, it is apparent that compensation on a filter-by-filter basis will eliminate all losses, and compensation beyond the folding frequency will provide a means to resolve Doppler ambiguity.

Resolving of Doppler ambiguity is possible due to the signal amplitude changes occurring with different compensations. Compensation will be correct at one filter position only. By selecting a pulse width that provides measurable amplitude change for folding frequency above the Doppler frequency, a measurable difference occurs between the resolved Doppler filter wherein the Doppler correction is accurate and the ambiguous Doppler filters that are incorrect. The process need only compare related filters for the amplitude change. The related filters are only those that fold into the same filter for both +and − Doppler.

The pulse widths and PRFs for the proposed characteristics provide about 0.9 dB of amplitude difference at the first fold for all PRFs. Phase coding must be employed to provide the pulse compression illustrated. That is, during the summation process, appropriate coded phasing must be applied to each range gate unit to insure that all elements are in phase when aligned and out of phase when not aligned. This coded phasing reduces the sidelobes.

Implementation of a system employing this process corrects for inbound targets on the first pass by positively rotating phase correction. Phase correction is computed for the zero Doppler filter, and correction is applied to the data in each range gate position as shown in FIG. 16, not including the pulse compression phase code. Second range gate data is rotated one thirteenth of the total phase computed for the zero Doppler filter, the third range gate data rotated two thirteenths, and so forth. This rotation occurs for all twelve gates following the range being compressed for. Rotated data is then summed using the pulse code phasing applied to each element gate to obtain the amplitude for a phase compensated pulse compressed range gate.

The process is repeated for the next FFT filter. However, the phase rotation is increased because the Doppler frequency is higher. This process continues for all 63 Doppler filters. The process continues through the first fold, i.e. a true Doppler filter 64 would be artificially created from filter 0.

The phase shift correction of filter 0 data would be applied based on the Doppler velocity in filter 64. This mapping process is continued, i.e. filter 1 maps to 65, filter 2 maps to 66, and so forth for inbound. The process then covers the largest Doppler velocity requiring detection. For the characteristics chosen four folds would be required for high speed targets.

A similar map is created for outbound Doppler but in this case Doppler filter 1 starts in filter 63 and phase correction is reversed (negative rotating phase correction). Once the complete map is created, (as four folds are resolved, the map is now eight time 64 filters wide) two or more methods can be used to determine the Doppler bin having the largest amplitude.

One approach is to perform traditional integration and power determination and then compare the related Doppler ambiguous filters (eight each) to determine which filter has the most power. This method resolves the Doppler frequency. The filter may be selected using amplitude centroiding. With limitations on choices of pulse width, the amplitude change from the selected filter to the fold next to it is on the order of 1 dB and the fold beyond that is greater than 3 dB. As noise is mixed in with the signal, these measurements will be somewhat contaminated and a selection process typical of amplitude centroiding is the most accurate approach to resolve the filter.

This selection process then reduces the map data to the same size map as originally held. The major difference is that filter numbers have changed, no Doppler ambiguity exists, and the filters are not contiguous.

An alternative approach to select the right filter is to use the processing approach as outlined in the Receiver Performance and System Design sections above. The methodology described above provides a more sensitive detection approach based on measuring phase standard deviation. Since the Doppler bin resolution method above makes phase adjustments based on Doppler frequency and only one filter has all phases arranged properly, the Receiver Performance/System Design sections process would be superior in determining which Doppler filter is unambiguous. This approach is the preferred approach, but it requires considerably more processing power to operate. System considerations therefore dictate which approach should be used in a specific design.

When proper accounting is applied to the inventive process described herein, a major advantage is realized in resolving Doppler fold over. Proper accounting requires that the Doppler frequency domain be expanded several fold over the Doppler domain processed, and that the phase compensation applied to each element involved in pulse compression be based on the phase shifts occurring as a function of Doppler frequency and radar pulse width. This is not possible in the time domain. The cost for implementing pulse compression is the phase rotation and summations for each Doppler filter and the expanded memory required for the extra data created.

Implementation of the current invention reduces signal loss across the fold, which is easily distinguished at the proper Doppler frequency.

2. Capitalizing on Post Detection Integration Gain and Frequency Determination

As shown in FIG. 12, fighter radars do not use post detection integration. However, processing theory shows that such integration provides detection improvement. With a total time budget of three scans, an alternative approach would be to reallocate PRF schedules so that post detection integration takes place during dwell time. In such an arrangement alternate scans are employed to resolve range/Doppler ambiguities. The problem that must be solved is correlating two second late information and to resolving range and Doppler ambiguities. Performance improvement for such an arrangement is based on the antenna pattern changes during collection of data, the number of integrals used and integration approach.

To maximize the dwell time on target, data is collected between the −3 dB points as the antenna is rotated, thereby requiring a gain adjustment based on the two way amplitude loss. Table 2 illustrates amplitude pattern across the 3 dB points with no antenna weighting.

TABLE 2

| ONE WAY | TWO WAY | AMP RECEIVED |
| --- | --- | --- |
| −3.0 dB | −6.0 dB | 0.5 |
| −1.66 dB | −3.32 dB | 0.7 |
| −0.72 dB | −1.44 dB | 0.9 |
| −0.17 dB | −0.34 dB | 0.99 |
| 0.0 dB | 0.0 dB | 0.99 |
| −0.17 dB | −0.34 dB | 0.9 |
| −0.72 dB | −1.44 dB | 0.7 |
| −1.66 dB | −3.32 dB | 0.5 |
| −3.0 dB | −6.0 dB | 0.5 |

The average of these amplitude changes is 2 dB, which reduces the overall gain of the integration process by the same amount.

For the given dwell times the FFT sizes are set at 64 data points. The traditional approach of linear detection followed by rectangular integration provides the following gain:

PRF Set-1 Gain=6.8 * Log(11)−2.0=5.1 dB

PRF Set-2 Gain=6.8 * Log(9)−2.0=4.5 dB

PRF Set-3 Gain=6.8 * Log(8)−2.0=4.1 dB

Using the pseudo coherent integration approach detailed in the Receiver Performance and System Design sections outlined above, the gain obtained is:

PRF Set-1 Gain=8.7 * Log(11)−2.0=6.9 dB

PRF Set-2 Gain=8.7 * Log(9)−2.0=6.3 dB

PRF Set-3 Gain=8.7 * Log(8)−2.0=5.9 dB

The gain available from the Receiver Performance and System Design approach provides the greatest gain and is preferred for this medium PRF invention. The Receiver Performance and System Design approach can be implemented in one of two ways. The first implementation applies the process to all Doppler filters, which is relatively straight forward to implement but requires extensive processing resources. This approach is the same approach as would be used as described above for Doppler ambiguity resolution. An alternative approach which reduces processing is to perform a two step detection process where the first step identifies potential target detections and resolves Doppler ambiguity and the second step uses the processing approach detailed in the Receiver Performance and System Design sections above for final detection. This two-step approach is outlined in the next section.

3. Use of Traditional Processed Data to Enhance Performance

The coherent integration process of the Receiver Performance and System Design sections herein provides a second channel of data that is statistically independent from the traditional processing channel. Because of the statistical independence it provides a convenient secondary means to improve processing gain and reduces overall processing. The approach uses the traditional data processing path with a high false alarm rate threshold, such as 0.01. This first step identifies "potential" target detections for subsequent detection in the second step processing in the pseudo coherent integration channel.

The first step thinning step reduces the number of range/Doppler bins the coherent integration detection must process.

The first processing threshold must pass the signals to meet the expected processing gain of the coherent integration channel. To do this the threshold must be set at a low enough false alarm rate to pass the weakest signals expected in the coherent channel. For all the design improvements built into the coherent integration channel, at least 3 dB of additional gain is anticipated. With a system false alarm rate of 0.00000001 this would predict that the traditional channel threshold be set at 0.01 and the coherent channel set at 0.000001. The two step process results in the desired system false alarm rate (product 0.01 times 0.000001=0.0000001). The fact that the final threshold is reduced two orders of magnitude provides this processing approach an additional 1 db of gain. This is possible because the two processing paths are statistically independent, the process yields the processing gain.

4. Target Heading Determination

The difference between information obtained during a dwell and the two second later dwell is that the range changes due to the target incoming/outgoing velocity vector and the change in radar position, a Doppler frequency shift occurs due to position change of both the target and the radar, Doppler shift is proportional to the apparent heading change relative to the radar position occurring due to position changes, and radar to target bearing changes.

The detection in the second PRF (two seconds later) can be correlated with the previous PRF detection if the target heading relative to the radar look angle can be determined.

Just as the radial velocity can be determined from the temporal Doppler shift, it is possible to determine the tangential, or cross-range, component of velocity. Determining the cross-range component of velocity requires accurate consecutive measurement of Doppler frequency. The accuracy available is a function of PRF and dwell time. The dwell time available in fighter radar is typically twenty-five milliseconds wherein the time is measured for the antennae to scan between the 3 dB points. The average medium PRF of traditional radar is approximately fifteen kHz. With multiple PRFs available to resolve ambiguities and short dwell times, the size of the FFTs are limited to 32 filters. This provides at best 470 hertz filter bandwidths which is insufficient to solve for the cross range component of velocity.

To date, radar manufacturers have not provided a means to increase frequency measurement significantly above that which is provided by the FFT filter. However, the solution is as outlined above in the Receiver Performance and System Design sections, which provide a means to increase frequency accuracy two orders of magnitude over the filter bandwidth if ten integral samples are used. This two order of magnitude frequency increase is more than adequate to resolve cross-ranging, and solving for cross-range provides the means to determine target heading, a benefit of paramount significance in fighter radars.

Figure 17:
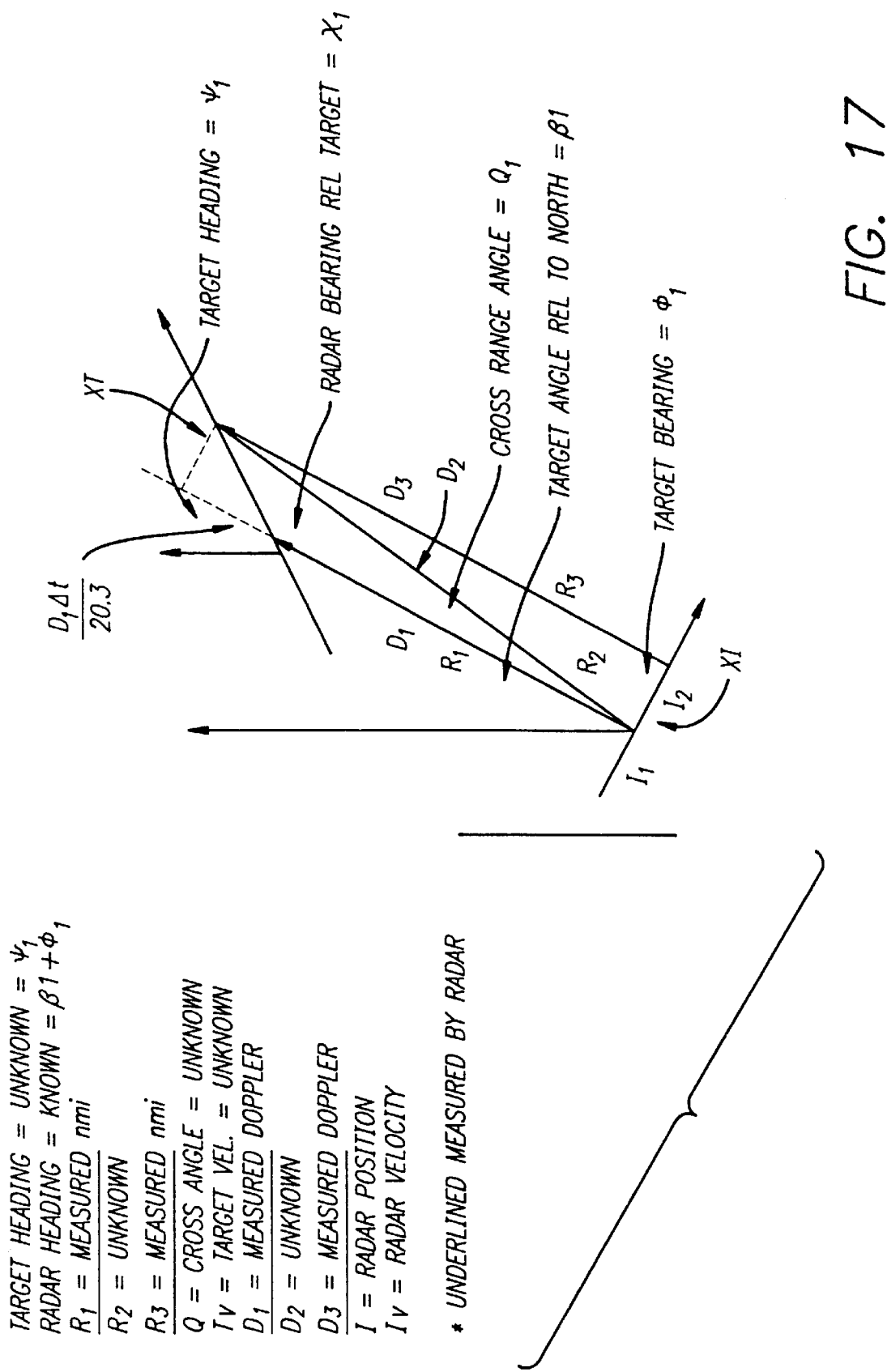
FIG. 17 illustrates the geometric relationships of target and radar on two scans.

A number of different analytical approaches are possible to determine the cross range component of velocity needed to solve the target heading relative to look angle. The following shows two different calculation approaches. FIG. 17 presents a position diagram showing the geometric position of the radar and the target for scan 1 and scan 2. The range and Doppler information the radar is able to measure for the geometric relationships of the problem is also shown in FIG. 17.

The target heading relative to look angle (commonly referred to as the Doppler angle) is shown as radar bearing relative to target and can be determined from the radar measured data and the known position of the fighter at scan 1 and scan 2. Target true heading, relative to North, is obtained by adding the true radar look angle to the relative heading. The target true heading when the radar is at position one is the target look angle relative to true North plus 180 degrees minus the radar bearing angle relative to the target. A 180 degree radar bearing angle means that the target is headed outbound on the line of sight bearing. FIG. 17 depicts the role of cross range angle to solve the radar bearing angle and heading angle.

As shown, the radar measures the range and Doppler to the target from position 1 ($I_1$) and position 2 ($I_2$). The Doppler measured at $I_x$ is given by:

$$D_x = 20.3 * T_v * \cos(\chi_x) \tag{4.1}$$

where x is the position number.

The cross range angle (Q) is given by:

$$Q_1 = \cos^{-1}(R_2/(R_2-(D_2-D_1)\Delta t/40.6)) \tag{4.2}$$

where $\Delta t$ is time between measurement.

The azimuth angle from the target line of travel to the radar is given by:

$$\chi_1 = 180 - \tan^{-1}(R_2*\sin(Q_1)/(R_2*\cos(Q_1)-R_1)) \tag{4.3}$$

if $R_2$ is greater than $R_1$; and $$\chi_1 = \tan^{-1}(R_2*\sin(Q_1)/(R_1-R_2*\cos(Q_1))) \tag{4.4}$$

if $R_1$ is greater than $R_2$.

And the ratios of Doppler to the angles involved is given by:

$$D_3/D_1 = \cos(\chi_1 + Q - \phi_1)/\cos(\chi_1) \tag{4.5}$$

Since the radar is moving, the $D_2$ and $R_2$ measurements are not directly measured; however, they can be computed. $R_2$ is obtained by adding/subtracting the distance the radar has moved away/toward the target and $D_2$ is obtained from $D_3$ by correcting for the angular change the radar motion creates. The modified Equation (4.2) using $D_3$ is as follows:

$$Q_1 = \cos^{-1}(R_1/(R_1-D_3*\Delta t*\cos(\chi_1+Q_1)/40.6*\cos(\chi_1+Q_1-\phi_1)+D_1\Delta t/40.6)) \tag{4.6}$$

Equations (4.3), (4.4) and (4.5) or (4.3), (4.4) and (4.6) represent two equations with two unknowns and are used to solve for $Q_x$ and $\chi_x$. The equations solve $\chi_x$ for the conditions where the radar track is in the same direction as the target track. Since the target track direction is not known, a second calculation is required with the above equations with an appropriate sign change to the cross angle and aircraft position change angle. To resolve the ambiguity produced with two heading angles computed relative to the line of sight line to the target, the $R_3$ range measurement is used. This is accomplished by projecting two track lines from the target position on the first measurement and calculating the range to the radar position on the second measurement and comparing the calculated ranges with the measured range. The range that correlates is the track of the target. Knowing the target track angle relative to the look angle and knowing the look angle relative to true North, the target heading relative to true North is determined with appropriate additions/subtractions based on orientations of the two angles.

An alternative calculation approach (Equations (4.7) and (4.8)) iterates target cross track (XT) to find an XT solution to determine heading.

An alternative calculation approach that uses the measured values of Doppler rather than corrections for motion is the preferred approach for calculating target heading. The methodology shown in Equations (4.7) or (4.8) is based on iterating the target cross track position (XT) over the expected range of values. If a zero value is found then target heading is calculated with Equation (4.9) or (4.10) using the XT value that produced the zero value.

Equations (4.7) and (4.9) are used for outbound targets and Equations (4.8) and (4.10) are used for inbound targets.

$$(((D_3/D_1)-\cos((XI-XT)/R_3))/\sin((XI-XT)/R_3))-((XT*20.3)/(t*(-D_3)))=0 \quad (4.6)$$

$$(((D_3/D_1)-\cos((XI-XT)/R_3))/\sin((XI-XT)/R_3))-((XT*20.3)/(t*(-D_3)))=0 \quad (4.8)$$

Where the value of (XT) that provides a solution to Equations (4.7) and (4.8) is used to calculate the target true heading ($\psi_1$) in Equations (4.9) or (4.10).

$$\psi_1=B_1+57.295*\tan((XT*20.3)/(t*(-D_1))) \quad (4.9)$$

$$\psi_1=B_1+180-57.295*\tan((XT*20.3)/(t*(-D_3)) \quad (4.10)$$

Ambiguity occurs in Equations (4.7) and (4.8) if the radar motion is along the radar bearing line. For all other flight conditions, the equations as shown provide heading answers for all headings to the right side of the radar bearing line where (XI) is positive when the Radar track is on the right side and negative for a track on the left side. To solve for headings to the left side of the radar bearing line the sign of (XI) must be reversed.

Equations (4.5) and (4.7) show that Doppler frequency is most sensitive for headings perpendicular to the line of sight bearing where the change from $D_1$ to $D_3$ is the largest, and least sensitive for target headings toward or away from the radar where the change from DI to $D_3$ is the least. This sensitivity indicates that the accuracy of the heading measurements varies with target heading and resolution of the frequency measurement. For the selected PRFs and dwell times the resulting FFT filter bandwidths are 395 hertz, 328 hertz and 281 hertz.

Using the approach illustrated in the Receiver Performance and System Design sections above to measure frequency, the frequency resolution will be approximately 3.5 hz. For every doubling of dwell time, this resolution will be improved a factor estimated at about two. Alternatively, increasing the scan intervals between calculations increases the Doppler differences in direct proportion to number of scan intervals used. Table 3 shows the approximate Doppler difference for various target velocities and headings at a ten nautical mile range for a two second scan.

TABLE 3

| Tgt Velocity | Target bearing rel. radar look angle | | | | | | | | |
|---|---|---|---|---|---|---|---|---|---|
| ft/sec | 90 | 85 | 80 | 75 | 70 | 65 | 60 | 55 | 50 |
| | Doppler change in hertz | | | | | | | | |
| 200 | 0 | −1.1 | −4.4 | −9.8 | −17.1 | −26.1 | −36.6 | −48.1 | −60.5 |
| 300 | 0 | −2.5 | −9.9 | −22.0 | −38.4 | −58.6 | −82.1 | −108.0 | −135.7 |
| 400 | 0 | −4.4 | −17.5 | −39.0 | −68.0 | −103.9 | −145.5 | −191.6 | −240.8 |
| 500 | 0 | −6.9 | −27.3 | −60.7 | −106.0 | −162.0 | −226.8 | −298.7 | −375.4 |
| 600 | 0 | −9.9 | −39.2 | −87.2 | −152.3 | −232.6 | −325.8 | −429.1 | −539.4 |

As can be seen in Table 3, a 3.5 hertz resolution would do quite well at all headings and velocities with the exception of the low speed target (200 ft/sec) in the zero to ten degrees off of nose headings inbound or outbound. For these conditions, the headings are available but accuracy would be approximately plus or minus five degrees. For greater accuracy when the dwell times cannot be changed for targets detected in these areas, the system makes calculations on alternate scans, thereby improving the accuracy by a factor of two, or on a two scan interval basis, improving the accuracy by a factor of three.

Table 4 shows the same for a target at sixty mile range. At this range, the heading accuracy of low speed targets (200–350 ft/sec) in the 0 to 25 degree off of the nose headings inbound or outbound would be in the ten to twenty degree range. For very slow targets this accuracy may not be adequate and reliance on multiple scans would be required.

TABLE 4

| Tgt Velocity | Target bearing rel. radar look angle | | | | | | | | |
|---|---|---|---|---|---|---|---|---|---|
| ft/sec | 90 | 85 | 80 | 75 | 70 | 65 | 60 | 55 | 50 |
| | Doppler change in hertz | | | | | | | | |
| 200 | 0 | −0.2 | −0.7 | −1.6 | −2.9 | −4.4 | −6.1 | −8.1 | −10.1 |
| 300 | 0 | −0.4 | −1.7 | −3.7 | −6.4 | −9.8 | −13.8 | −18.1 | −22.7 |
| 400 | 0 | −0.7 | −2.9 | −6.6 | −11.4 | −17.5 | −24.5 | −32.2 | −40.4 |
| 500 | 0 | −1.2 | −4.6 | −10.2 | −17.9 | −27.3 | −38.2 | −50.3 | −63.1 |
| 600 | 0 | −1.7 | −6.6 | −14.7 | −25.7 | −39.3 | −55.0 | −72.4 | −90.9 |

With accurate Doppler frequency, target heading can be determined and the mathematical approach shown is just one way to solve the problem. Other mathematical variants are possible using Doppler frequency, but any such derivation employed using Doppler frequency is within the scope of the present invention.

5. Use of 2 or More Scan Periods to Reduce Range Ambiguities

The use of 3 of 8 PRFs for traditional medium PRF radars is based on good Doppler visibility. This occurs by spreading the PRFs across an octave bandwidth. The traditional technique for resolving medium PRF range ambiguity resolution is to first solve range ambiguity using what is known as Chinese remainder arithmetic. Having unambiguous range, true Doppler can be determined and used to reduce ghosting.

As shown in the Capitalizing on Post Detection Integration Gain and Frequency Determination section above (Section 2), data showing performance degradation is a function of target position in the beam. This data shows that under the best of conditions, two of the eight PRF have a 6 dB or greater loss, two more have 3 dB or greater loss and two more have a 1 dB or greater loss. Thus, to claim all the advantages of 3 of 8 would penalize the system with a 6 dB loss. To claim 3 of 4 on average would penalize the system 1.5 dB and spread the Doppler advantage over multiple scans based on not knowing which 4 PRFs illuminate the target on any dwell. This fact leads to the conclusion that less than 8 PRFs can provide equivalent performance.

An earlier approach to 3 of 8 was to use 3 of 3 PRFs in a major/minor/minor concept. The system solves range ambiguities by using a major PRF followed by two successive minors: one for ambiguity resolution and one for de-ghosting (insuring that the target in major PRF is not correlated with some other target in the minor PRFs). The spacing in PRF is equivalent to adding one range gate of time to the major PRF for the first minor PRF and subtracting one range gate of time for the second minor PRF. This approach resolves range ambiguity and reduces ghosting by the correlation of target positions from all three PRFs, and reliance on frequency is minimal and based on windowing several Doppler filters (like 6 to 8) as the candidate set to correlate the range candidates.

The 3 of 8 approaches traditionally use 32 Doppler filters for radar processing but cannot make use of Doppler filtering to minimize ghosting because of Doppler shifts due to each PRF change and Doppler folds. This lack of Doppler filtering creates an opportunity for ghosting. The 3 of 8 reduces ghosting but cannot eliminate it completely. 3 of 3 can be reduced to 2 of 2 if ghosting can be resolved with reliance on accurate frequency measurement in a correlation approach. However, relying on frequency correlation requires knowing target heading, as described previously. Target heading is required to correct frequency change due to target position change on the second scan.

The new medium PRF concept provides 64 Doppler filters and measuring frequency to one percent of filter bandwidth creates 6400 positions for the targets to occupy. This large number of positions reduces probability of false correlation approximately three orders of magnitude.

Given that a 2 of 2 PRF system with frequency/heading correlation can eliminate ghosting, the question to be answered is how to implement and what are the decision drivers for selection of PRFs. The two PRF approach resolves ambiguity by first removing both the radar movement and the target movement from the second PRF range measurement and then using the range gate position of the target in both PRFs to determine the range fold. Knowing the radar position on PRF-1 and PRF-2 makes it easy to correct for radar movement. Knowing target Doppler unambiguous frequency provides an accurate range change measurement to correct for target motion. This correction places the target in PRF-2 at the same true range position as it was during PRF-1 but due to PRF differences the target appears in a different range gate. The difference in range gate movement from the position in the PRF-1 to PRF-2 is a function of the range fold the target is in and the difference in range gates between the two PRFs. If the target was detected in range gate 37 during the PRF-1 with no fold, it would appear in range gate 37 on PRF-2. With each subsequent fold the target would move the number of range gate difference between PRFs per fold.

A convenient methodology to determine the true range of the target is to use lookup tables that provide the fold ranges based on range differences measure in the two PRFs. The lookup table is constructed to provide a range gate number to be added to the range number that the target was detected in. The number used is selected from the lookup table based on the plus or minus difference value obtained when the range gate number of the target from PRF-1 is subtracted from the range gate number in PRF-2. A partial lookup table for PRF set 1 is given in the following Example.

EXAMPLE

| 80 Range Gates (Number added to Target range in PRF-1) | Difference number | 83 Range gates (Number added to Target range in PRF-2) |
|---|---|---|
|  | −60 | 1660 |
|  | . | . |
|  | . | . |
|  | . | . |
|  | −12 | 332 |
|  | −9 | 249 |
|  | −6 | 166 |
|  | −3 | 83 |
| 0 | 0 | 0 |
| 80 |  | 80 |
| 160 |  | 77 |
| 240 |  | 74 |
| 320 |  | 71 |
|  | . | . |
|  | . | . |
|  | . | . |
| 1620 |  | 20 |

An inherent disadvantage of range gate sampling is that it cannot resolve partial range gate movement or choose the position of the target relative to the gate which results in some probability of one range gate error. This one range gate error will produce a range error if the selected PRFs have differences that are in consecutive order. A number of techniques are available to the radar designer to minimize this occurrence. One such technique is to separate the PRFs by more than one range gate as shown above. This separation provides gaps between the differences numbers in the lookup table, and as such if the measured difference appears in the gap a proper correction can be made due to knowing how the range gate quantizing error effects range gate position. The foregoing procedure is not restricted to the above Example. Rather it can be used with any PRF combination.

The concept of choosing PRF relationships that provide gaps between the fold over numeric values is dependent on the radar system parameters, i.e., pulse width, pulse compression, PRF range of values, maximum detection range, etc. These parameters are selected using classic radar engineering design principles. Given these selections, the precise PRFs to be used are selected to provide desired gaps. Given a large number of range gates, a wide range of PRFs, and a small number of gaps, many combinations are possible. Reducing the number of range gates and increasing the number of folds required for maximum unambiguous range significantly reduces the combinations possible. For a three-PRF system, a general rule for selection is that each PRF is fairly closely spaced, two of the PRF's number of range gated channels are relatively prime numbers, and fold over occurs in relationship to the number of gaps desired.

A number of different analytical alternatives are possible for resolving range ambiguity using multiple PRFs. The concept embodied in this design is the use of Doppler frequency to account for Target range change from PRF to PRF. Equation (5.1) is the preferred analytical solution and is predicated on the choice of PRFs as described in the previous section that provide gaps between PRF overlaps.

The solution to Equation (5.1) is predicated on iteration of the range ambiguity multipliers ($N_1$ and $N_2$) until a solution is found. If no solution is found the detections are not from the same target. Inherent in Equation (5.1) is the target motion determined by the Doppler measured and the radar motion towards or away from the target. If the Doppler is incorrect, Equation (5.1) will not converge.

$$t * (\text{Doppler frequency}/20.3) = \quad (5.1)$$

Radar change toward/away from target =

$N_1 * PRF\text{-}1$ Max range + $PRF\text{-}1$ Ambiguous Range −

$N_2 * PRF\text{-}2$ Max range − $PRF\text{-}2$ Ambiguous Range.

1. The sign of Doppler frequency and direction of Radar movement must be accounted for based on direction of motion.

2. $N_1$ and $N_2$ must be iterated through all values up to maximum range of the Radar. For example, if the max range of the Radar is ninety miles and the PRF max range is three miles then N must be iterated from 0 through 30.

3. Radar movement is calculated based on the range change of the Radar to or from the target in the interval from PRF-1 to PRF-2. If the movement is away from the target, the minus sign is changed to a plus sign.

4. Equation solution must allow for range error expected from the system.

Equation (5.1) is the preferred method for resolving range ambiguity for this new radar mode.

At this juncture, a process for resolving range ambiguity has been described for a two PRF system. Its validity to be used with minimal ghosting is dependent on correlating Doppler frequency to insure that the right target from the first PRF is correlated with the same target second PRF, and this validity has been described in the previous section. What has not been addressed is what happens if the target is not detected in the second PRF. This is possible for weak targets and target loss due to range eclipsing. This problem is resolved by adding more PRF selections for the system to use on subsequent scans. The PRFs chosen by the radar designer are keyed to minimizing side lobe clutter effects and reducing the effects range/Doppler blind zones. The design characteristics chosen for analytical and performance calculations chose six PRFs. Three were chosen to uncover both range and Doppler blind zones, and three were chosen to provide a high probability of detection associated with its near neighbor. They were not chosen though for a particular radar application.

A design approach using two of two PRFs has been identified that provides all the features needed to resolve range ambiguity without suffering from ghosting. The following process shows how these features are used. Given a new detection in any PRF only the range ambiguity must be resolved (Doppler ambiguity has already been resolved), the target measured data is recorded and flagged for range ambiguity resolution on the next PRF change. Based on the measured Doppler of the flagged target, a Doppler window wide enough to account for frequency changes in moving from previous scan position to current scan is used to search all the range bins in the Doppler window in the second PRF. Each new detection identified in PRF-1 is paired with detections in PRF-2 that fall within the Doppler window.

Using Equation (5.1), the true range to the target is determined. A heading calculation is performed for each candidate pair that is identified. If a heading calculation is possible and no other detection pair has a common detection with this pair, the pair is declared a detection. The true candidate pair will always correlate the Doppler frequencies with the right target heading and provide a heading and that set is the resolved range ambiguity. If no correlation occurs, the target is flagged for range ambiguity resolution on the next scan. On occasion two pair may correlate with headings so an additional scan is required to eliminate the false target pair.

It is important to understand that Equations (4.7), (4.8), (4.9) and (4.10) are used to calculate heading and if heading cannot be calculated, the range calculations are not valid.

Not stated above but inherent in the design is the use of the frequency windows to minimize false candidate pairing. The radar designer has the choice to vary the window width based on system requirements and target speeds to be detected. Conceptually, the maximum window will be less than two Doppler filters providing a 31:1 false target reduction, and in many cases will be less than ½ filter width providing 124:1 false target reduction.

A complete solution has been described to justify using three major PRFs with associated near minor and resolving range ambiguities on alternate scans. It should be noted that the problem of resolving range and Doppler fold over occurs with new target detections only. Once the target is detected, the correlation from scan to scan based on heading and Doppler will be adequate to maintain target real range. A major contributor to insuring correlation is the determination of heading vector on a scan to scan or scan to multiple scan basis. The ability to provide the system tracker with target heading and velocity information provides the improvements needed to speed up accurate tracking of targets.

6. Range Accuracy and Reduction of Range Gate Straddle Losses

Range accuracy in Doppler radar is determined by the spacing and size (range resolution) of the range gates used, and both along with the speed of the target and radar platform determine range straddle loss. Straddle losses occur in two ways. One way is based on the actual position of the returned echo in the range gate, and the second is based on the radar platform/target movement during the dwell. The positional losses occur in pulse compression coded radars due to the A/D conversion sampling overlapping the point in the return waveform where phase changes are taking place. This loss is not recoverable because the lost power does not flow into the next range gate. The straddle loss due to motion during dwell is small if the range gate size is large relative to the distance change during the dwell. If the range gate is small then the movement losses cause power to appear in each range gate. If the power is split, a 3 dB loss occurs. On average, this is a 1.5 dB performance loss. This loss can be avoided though with appropriate processing.

Range accuracy is driven by range resolution. However, if the spacing is closer (a factor of 2 or more) than the resolution provided, accuracy can exceed the resolution using amplitude centroiding techniques. The overlapping of range gates to improve range accuracy does not avoid the range straddle losses that occur due to range motion, and the cost to implement is that it doubles the amount of processing needed.

For range motion, both of these problems can be improved on by applying elements of the process of the '939 application; that is, the method disclosed in that application for determining frequency and measuring for frequency correlation in the range gate adjoining the range gate where detection occurred is used. For closing targets, the preceding range bin is checked. The following range bin is checked for opening targets. If the frequency in the gate correlates with the range gate being processed, range straddle is present. The amount of straddle present is estimated based on the ratios of the measured standard deviations with regard to average noise standard deviations and the frequency correlation existing in the two range bins measured. (Design details are provided in Section 8 below.) To eliminate the range straddle loss the integrated range bin values are adjusted to allow for range bin offset as just determined. The adjustment involves removing the integrals not containing signal from the leading range bin and replacing them with the integrals containing signal from the following range bin. This is accomplished for adjacent filters as well.

7. Use of 4:1 FFT Redundancy to Improve Signal Detectability

Redundancy processing will improve the performance of systems using post detection integration. Since the current fighter radars do not use post detection integration, there is no need to use it. Implementing redundancy processing in the 70's and 80's was costly. To get a gain of 1.8 dB with 4:1 redundancy, the FFT processing load increases by a factor of four. However, the cost of processing has reduced to the point where this amount of gain cannot be ignored. This is especially true in the next generation radars using Electronic Steerable Array (ESA) technology. 1.8 dB of performance is equivalent to adding 1.5 times more power to the system. ESA technology is quite expensive so that a good trade is available to reduce the cost of the radar by using low cost redundant processing and cutting back on the size of ESA required to implement the system. This assumption is that post detection integration is used as it is in the new medium PRF approach.

Redundancy processing gain is not well documented; however, a short write-up is provided in Williams, J. R. and Ricker G., "Signal Detectability Performance of Optimum Fourier Receivers," IEEE Symposium Arden House Workshop, Harriman, New York, January 1972. The net effect of redundancy processing is to decrease the standard deviation of a signal integrated following a linear detector. The amount of reduction is dependent on the weighting function used during the FFT processing. The 1.8 dB improvement is predicated on Hanning weighting and 4:1 redundancy. Any further increase in redundancy provides minuscule gain. Hanning weighting provides additional benefits in the adjacent filter side lobe suppression which is most desirable in strong signal clutter regions.

8. Improved FFT Sensor Processor Which Uses Enhanced Frequency Domain Principles For Detection The post detection integration gains discussed in Section 1 above are based on the procedures outlined in the '939 application. Two different approaches for detecting the signal follow the coherent integration as outlined in the '939 application. One approach is predicated on using the incoherent integration information in conjunction with the coherent integration in a CFAR detection routine. This detection approach is used where good estimates can be made on the noise background levels. The major factors for gain improvements are the ability to measure frequency accurately and the use of both incoherent and pseudo coherent integration. However, performance is limited by the accuracy of frequency measurement, and in applying this technology to a fighter radar the frequency resolution will approximate 3.5 hertz.

The second approach is based on background data surrounding the target position. If the background is irregular, it will cause CFAR losses in excess of 1 dB, and a single filter detect routine is provided to hold the losses to less than 1 dB. The single filter detection is made based on the phase standard deviation being less than a predetermined value and the ratio of the particular filter amplitude in coherent integration ratioed with the same non-coherent filter integrated data being greater than a predetermined value.

9. Determining Frequency Rate-of-Change

A procedure of this invention to determine frequency rate-of-change based on using templates of expected range of changes will now be discussed. The process is implemented in the same manner as described in the following sections for implementing frequency measurement for data collected. The frequency search zeros in on that portion of the Doppler bin where signal may reside. A follow-up search is conducted using a modulation rate-of-change function added to the phase correction and as in the frequency search look for minimal standard deviation. The modulation patterns used would represent a set that typifies the real world ranging from zero rate of change to maximum possible for the aircraft detection problem at hand. Each would be applied successively while monitoring standard deviation. The pattern that generates minimal standard deviation is the assumed modulation for the signal. The actual search will be aided by knowing the Doppler frequency (within ~3.5 hertz) as measured for the detection process. The virtues of this process are to anticipate target maneuvers in applications to improved tracking. The process would be applied on a selective basis.

10. Using Improved FFT Sensor Processor Which Uses Enhanced Frequency Domain Principles for Ground Clutter Reduction and Strong Signal Multiple Detection Determination and Elimination Use of pulse compression in radar applications suffers from range sidelobes inherent in pulse compression codes. Strong signals cause detections in range gates following the range gate where the strong signal appears. These detections limit range resolution and complicate range ambiguity resolution due to the multiplicity of same targets created. The multiplicity of detections all occur at the same frequency, and the system can effectively remove them. The ability to measure frequency to within several hertz using the process detailed in the Receiver Performance and System Design sections provides a sure means of removing the multiple detections without falsely removing a detection of a second target in the same frequency cell and a near range bin. The process for removing the detection is simply one of measuring the frequency of all detections using the process outlined in the Receiver Performance and System Design sections during the dwell and checking the detections for same frequencies. If the frequencies are the same, the system keeps the detection having the largest amplitude and discards all others.

This process eliminates multiple detections and the associated problems it creates for range ambiguity resolution. However, the process does not minimize range resolution impacts. An alternative process can be used to minimize range resolution impacts, which also minimizes ground clutter signals impacting medium PRF radar performance.

Ground clutter and target signals have one attribute in common in the radar equation. Both ground clutter and target signals produce signals correlated in the number of range bins the transmitted pulse overlaps prior to pulse compression. The fundamental difference between target signals and ground clutter is that ground clutter appears in many contiguous range and Doppler bins at approximately equal levels. As such, these signals are indistinguishable from noise, while the radar target occupies only one range bin and can be detected when its amplitude exceeds the noise. Knowing the antenna characteristics, pointing angle relative to flight path, aircraft altitude, and aircraft velocity provides the radar with ample information on which Doppler bins may contain ground clutter. By maintaining a power average map for all range/Doppler bins and knowing approximately which bins are known not to have ground clutter, the system obtains a good estimate of ground clutter along with estimates of its amplitudes relative to the noise levels.

Use of this process to identify the average level of ground clutter present in the range/Doppler filters during the detection processing provides optimum detection of targets not clutter limited and provides data for a second step detection process optimized for weak targets in ground clutter and in the presence of strong targets.

When the system has identified a number of range/Doppler bins having ground clutter, the removal of such ground clutter uses the pulse compressed data channel, amplitude, frequency and phase of the ground clutter using the process detailed in the Receiver Performance and System Design sections for all the range/Doppler bins identified. The system divides the amplitude of the clutter in the range/Doppler bin by the number of range bins involved in the pulse compression. The resultant amplitude and phase are subtracted out from the selected range/Doppler bin and of all the following range bins involved in the pulse compression. The subtraction process must account for the pulse compression phase coding in the transmitted pulse in the appropriate subsequent bins. Wherever the system locates a phase reversal in a particular range bin, the subtraction process must apply that phase reversal prior to subtraction. Subtraction occurs on the uncompressed data channel.

The subtraction process continues with the system determining the amplitude and phase for the next range bin subtracted for all subsequent range bins. The system repeats the process for all subsequent range bins until all range bins involved have clutter removed.

In the uncompressed data channel, a point target appears in every range bin covered by the transmitted pulse. For the characteristics detailed above the transmitted pulse appears in 20 range bins for PRF-1, 24 range bins for PRF-2, and 28 range bins for PRF-3. The system requires 20/24/28 subtractions to remove a point target, but since ground clutter is a continuous target the subtraction process must be continuous.

The above described process for ground clutter can be used to remove strong signal targets by identifying the range/Doppler bin containing the strong target. The system subsequently applies the subtraction process to the subsequent range bins. As the system has detected a strong signal, the system can completely remove the strong signal, thereby providing the opportunity for redirect detect processing to look for weak targets in that area.

11. Azimuth Resolution Improvement

Azimuth resolution of any radar system is defined by the size of antennae used and features that can be built into the radar to improve the resolution. Effective features involve adding significant hardware to the radar.

A less effective approach used involves amplitude centroiding. That is, the amplitude of the detected signal over different azimuth positions is measured for conformity with the antennae beam shape and based on degree of conformity the resolution is improved. This process improves resolution at best a factor of three with strong signals but degrades with weak signals.

The new mode radar provides a means to improve resolution based on measuring phase standard deviation and frequency which provides a degree of immunity to amplitude fluctuations. The implementation of the resolution improvements are a direct fallout of the basic processing used to improve signal detectability. The PRFs chosen for analysis of the radar provide either 8, 9 or 11 processing integrals that represent data collected between the −3dB points on the antennae. The detection process has determined that a signal is present and what the frequency is.

A secondary processing approach to determine where the centroid for the target position is located is accomplished. This approach is predicated on performing frequency measurements and standard deviation calculations using a predetermined number of the integrals collected. The process is started by taking consecutive integrals from one end point of the antennae and processing for frequency and standard deviation. The process is repeated by dropping one end point integral and picking up the adjacent integral in line moving towards the other antennae end point. This moving window process is continued for all integrals collected. A centroid approach for matching the antennae pattern with the measured data is used to determine the target position in the beam. The process has the potential of improving the resolution in proportion to the number of integrals used, i.e. in this case a factor of 8, 9 or 11 depending on the PRF used.

12. Multiple Signal Detection in Sample FFT filter (Image of Signal Source)

The process for determining frequency based on minimal Standard Deviation search provides a capability that can be exploited to determine if multiple signals exist in the same filter. The process is modified so that rather than searching for minimal Standard Deviation, the Standard Deviation for all frequency positions is determined and viewed as a two dimensional image of frequency versus Standard Deviation. Test runs to determine if two signals imbedded in noise can be identified have been conducted and the results were all positive. Test runs of five signals at different spacing within the filter have been run and the results are not conclusive. Test runs for ground returns associated in ground mapping have not been conducted, but basic theory suggests that identifying characteristics will be present and as such provide an important function for air-to-ground medium PRF Radars.

13. New Medium PRF Radar Architecture

Figure 18:
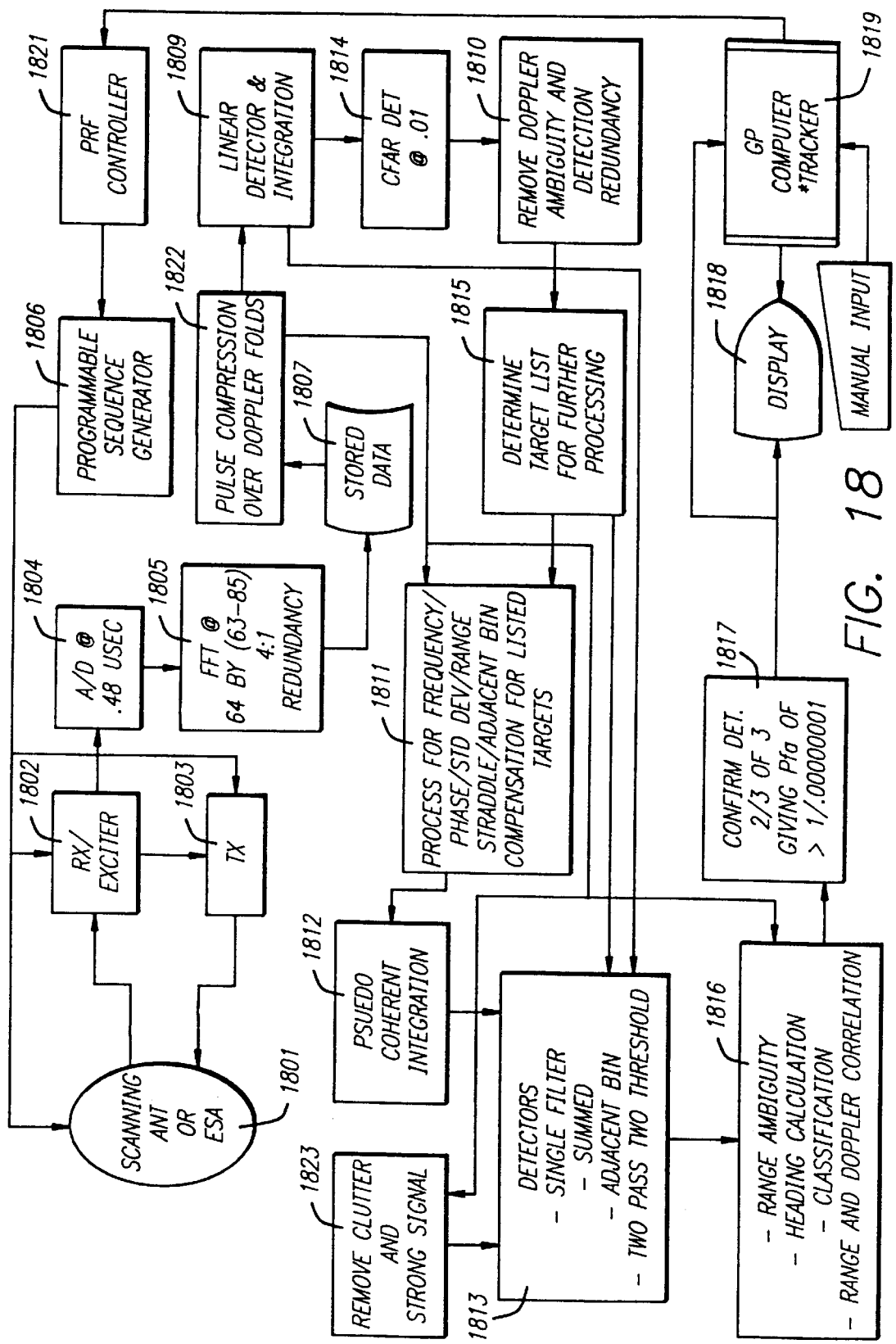
FIG. 18 and FIG. 19 are specific design approaches capitalizing on the previously-described design features and replace the traditional medium PRF design.
Figure 19:
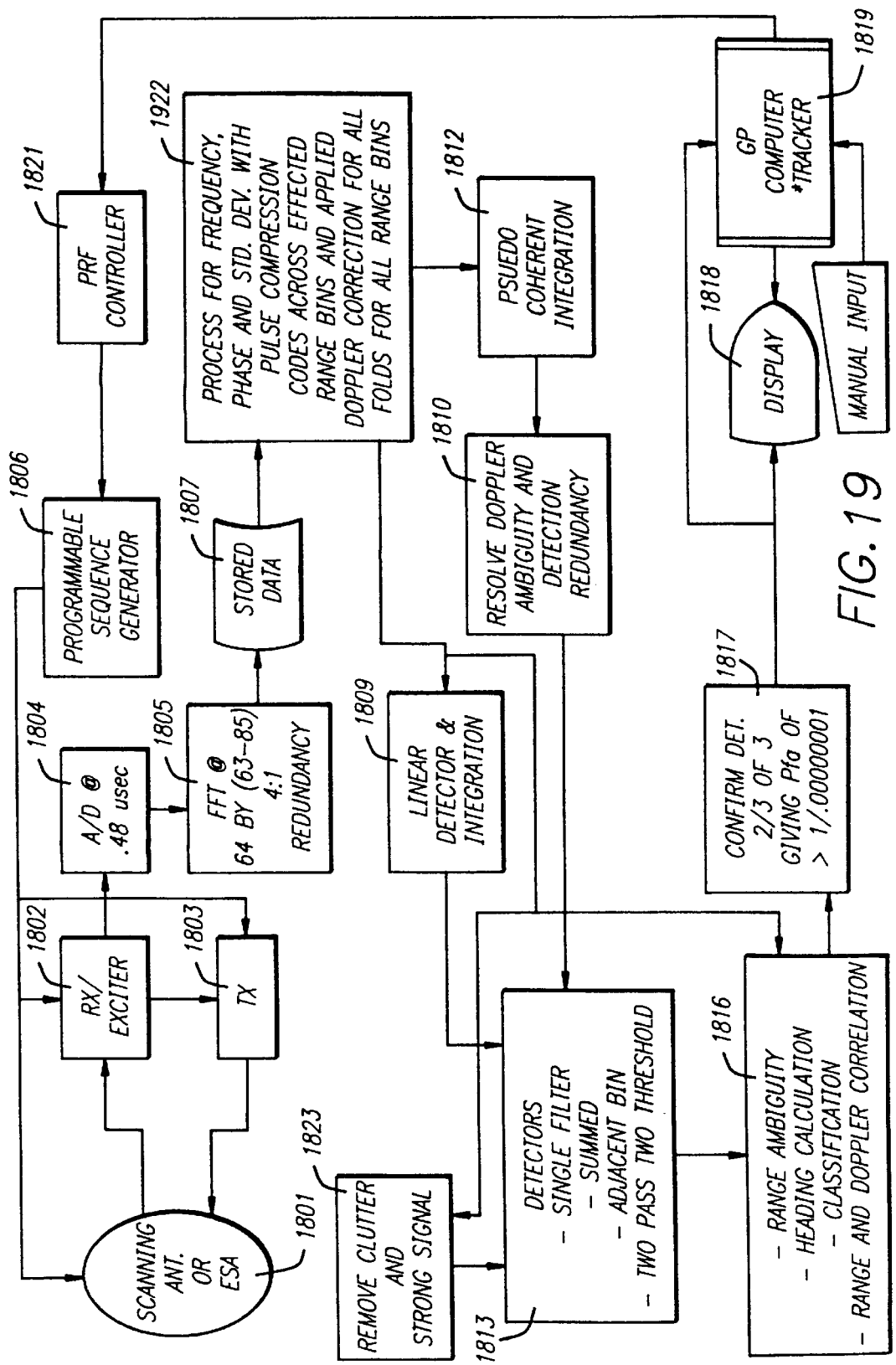

While FIG. 13 is an expanded detail flow diagram for a conventional fighter application medium PRF radar, FIG. 18 is a specific design approach capitalizing on the previously-described design features to replace the traditional medium PRF design approach. FIG. 18 is organized with the intent of minimizing processing, and FIG. 19 is organized to maximize performance. It is understood that elements of FIG. 18 could be incorporated in FIG. 19 and vice versa. Comparing FIG. 18 with FIG. 13, it is seen that all the elements of the traditional approach are used in conjunction with new processing routines organized to provide the improvements discussed in previous sections. The new design implementation of FIG. 18 diagrammed in FIG. 18 starts with the real and imaginary outputs of the A/D converter and by-passes the traditional pulse compression.

FIGS. 18 and 19 are specific design approaches capitalizing on the previously-described design features to replace the traditional medium PRF design approach. As stated above, the embodiment illustrated in FIG. 18 minimizes processing, while the design of FIG. 19 maximizes performance.

From FIG. 18, scanning antenna/ESA 1801 receives data from transmitter 1803 and transmits data to receiver/exciter 1802. Receiver/exciter 1802 also passes information to transmitter 1803. Receiver/exciter 1802 transmits data to analog-to-digital converter 1804, which sends information to the FFT processor 1805 operating at a 64 by (59–85) element array with four-to-one redundancy. The FFT processor passes information to data storage element 1807 which stores all processed data needed to perform integration. The programmable sequence generator 1806 passes data to transmitter 1803, receiver/exciter 1802, and scanning antenna/ESA 1801 to control all processing. Pulse compression element 1822 performs pulse compression over the Doppler fold based on information in data storage element 1807, and passes data to linear detector 1809 and compensator 1811, clutter removal 1823, and range ambiguity 1816. Compensator 1811 processes the data for frequency, phase, standard deviation, range straddle, and antenna phase for the listed targets and passes data to pseudo coherent integrator 1812. The linear detector processes the data and passes it to the detectors 1813 and to the CFAR element 1814.

CFAR element 1814 operates on information from linear detector 1809 and detects at 0.01 probability of false alarm (PFA) level, and passes data to the Doppler ambiguity element 1810. This element removes Doppler ambiguity and detection redundancy and then passes the processed data to the determination element 1815. Determination element 1815 determines a list of range/Doppler gates having a possible target signal, and passes this information to compensator 1811 and detection element 1813. Compensator 1811 processes the data and passes information to phase integrator 1812, which passes information to detection element 1813. Detection element 1813 correlates and filters using the appropriate detector for the specific radar system parameters.

Post-detection processing element 1816 receives data from detection element 1813 and from pulse compression element 1822 and resolves range ambiguity in the signal based on Doppler information and frequency correlation. The post-detection processing element 1816 also performs the target heading calculations. In addition, target classification is provided by comparing the filter signature to a stored library of signatures. The results are passed to element 1817 for detection confirmation. Element 1817 confirms detection on 2 of 3 or 3 of 3 PRFs and passes the detection onto the GP computer/tracker 1819 and to the display 1818. GP computer/tracker 1819 also passes information to the display 1818 and to programmable sequence generator 1806. Additionally, GP computer/tracker 1819 receives manual input as shown.

From FIG. 19, the embodiment of the system shown utilizes most of the same elements as the embodiment of FIG. 18. Processing element 1922 represents the only new element, and it processes data stored in data storage element 1807 for frequency, phase, and standard deviation with pulse compression codes across affected range bins and applies Doppler correction for all folds in all range/Doppler bins. The processing element 1922 passes data to phase integrator 1812, which passes data to ambiguity resolver 1810 for resolving Doppler ambiguity and removing target redundancy. Processing element 1922 also passes data to the linear detector 1809, the clutter removal element 1823 and to the range ambiguity resolver 1816. Doppler ambiguity resolver 1810 passes information to the detector element 1813, which correlates and filter detects using the appropriate detector for the specific radar system parameters. Range ambiguity resolution, range and Doppler correlation and heading calculations are all performed in element 1816.

Elements of FIG. 18 could be incorporated in FIG. 19, and vice versa. Comparison of FIG. 18 with FIG. 12 shows all the elements of the traditional approach being used; the inventive processing routines described herein, thereby providing the improvements discussed in previous sections.

14. New Medium PRF Radar Design

Figure 20:
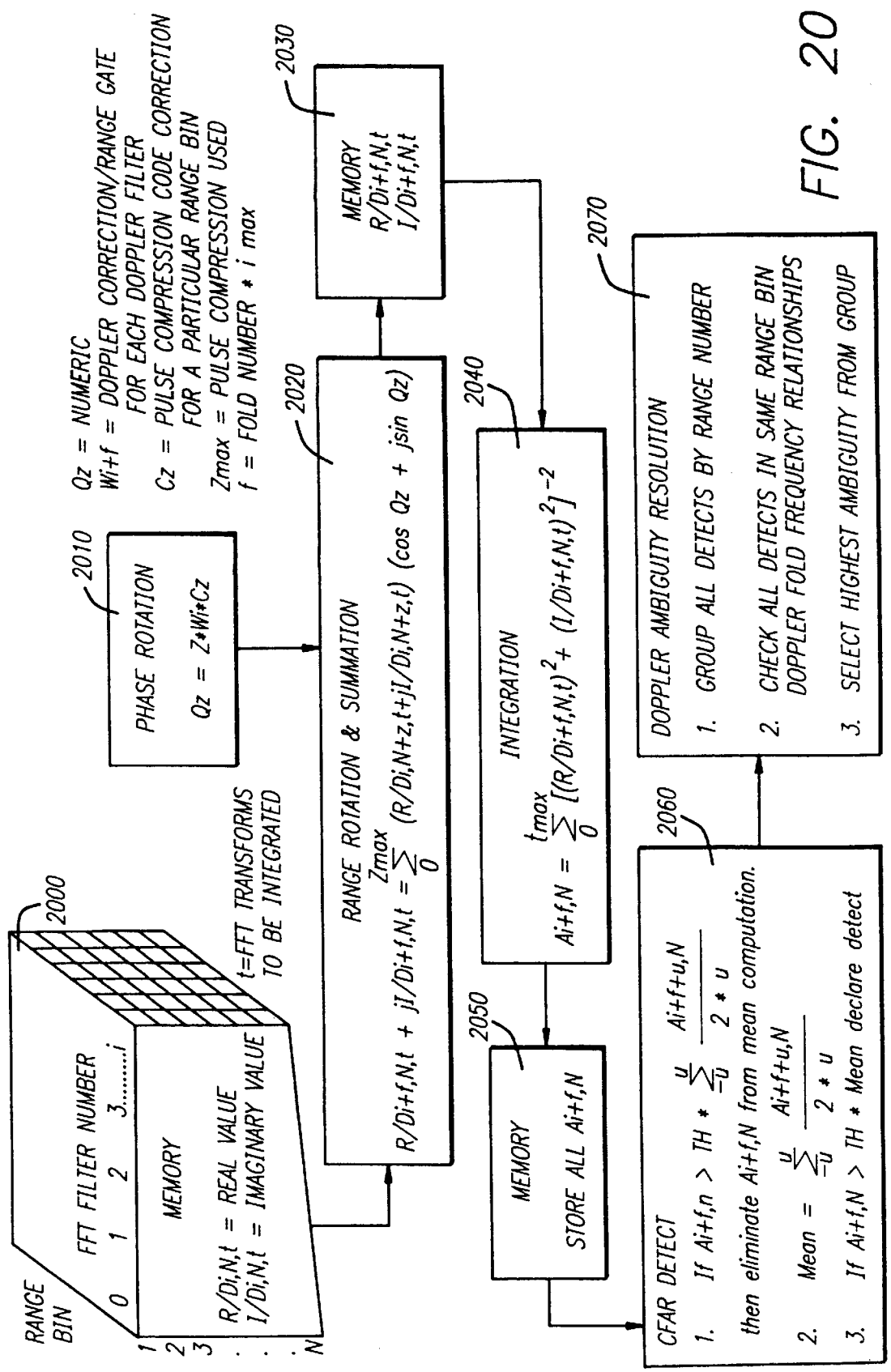
FIG. 20 shows the frequency domain pulse compression and Doppler ambiguity resolution process.

The A/D outputs are fast Fourier transformed in a 64 point transform. The transforms are time overlapped by a factor of four-to-one producing a four-to-one redundancy ratio. The real and imaginary outputs are stored. The process is repeated for all FFT runs desired in the integration (44 for PRF-1, 36 for PRF-2 and 32 for PRF-3). At the completion of the storage process for the right number of integrals, the next step is to pulse compress and resolve Doppler ambiguity using frequency domain pulse compression. The pulse compression is accomplished as detailed in Section 1 and shown in FIG. 20. Phase shifting the real and imaginary stored data for each filter is based on two requirements. The first requirement is to correct for the pulse compression code used which, for example, is zero degree or 180 degree phase shift per range bin for biphase coding. The second requirement is to correct the data for Doppler velocity phase shift. One form of arithmetic to accomplish this is to do a complex phase rotation with a unity vector whose phase is the same as the amount of rotation required:

| | |
|---|---|
| Range/Doppler bin Real value = $R/D_{i,N}$ | Where i is a particular Doppler filter and N is the range bin being compressed. |

Range/Doppler bin Imaginary value = $I/D_{i,N}$ $$Q_Z = Z * Wi * C_Z$$

Q = the phase shift;

W is phase shift per PC element for the Doppler bin;

Z is PC position; and $C_Z$ = pulse compression code correction.

If pulse compression is 13:1, Z takes on values 1 through 12.

$Q_Z$ is the phase rotation as shown in 2010.

$$R/D_{i+f,N,t} + j\, I/D_{i+f,N,t} = SUM((R/D_{i,N+Z,t} + j\, I/D_{i,N+Z,t})(\cos(Q_Z) + j\sin((Q_Z))))$$

SUM for all Z and f is fold number.

f=0 for no fold, f=1 for first fold, etc.

The phase rotation and summation is shown in 2020 and is accomplished for all i, f, N and x and stored in memory 2030.

The above math is performed for all Range/Doppler bins and all integrals forming a Doppler map for inbound and outbound Doppler at the number of folds (f) desired for the system.

Following the pulse compression process for each Doppler cell, the amplitude of each cell is integrated (FIG. 20 at 2040) using traditional post detection integration over the number of transforms selected for the particular PRF being integrated. Integration is as follows:

$$A_{i+f,N} = \Sigma_o^t((R/D_{i+f,N,t})^2 + (I/D_{i+f,N,t})^2)^{-2}$$

SUM for t where t=transform number in integral.

t=0 to Max number integrated.

The integration process includes the new Doppler filters created (f) with the pulse compression routine. Integration results are stored in memory unit 2050.

Following integration and storage, a traditional amplitude discriminating CFAR detection process 2060 is completed. A two-pass moving window mean computation first pass removes strong signals from the mean computation. The second pass then makes detections if signal amplitudes exceed the threshold multiplier times the mean. The CFAR threshold for detection is set to incur a high false alarm rate (greater than 0.01 PFA) to insure detection sensitivity commensurate with the final processing channel (about 4–5 dB more processing gain). The objective of this step is to reduce the number of range/Doppler bins that will be subject to the new processing routines. Detections in this process are used to set up a map of which filters and range bins are the candidates for detection in the final detection process using the coherent integrated processing channel. Operating on the premise that a hundred-to-one data reduction can be achieved, this processing step provides 1 dB processing gain that will be capitalized on in the coherent integration channel as detailed in Section 2 above. If some other data reduction is used, the performance will change accordingly.

Doppler ambiguity resolution 2070 is conducted on all detections. This is a simple test to group all detections in the same range bin that are related by folded frequency relationships and then selecting the frequency that has the strongest amplitude. If two adjacent Doppler fold amplitudes are in close proximity, both are tagged for further processing.

To this point, two design improvements have been accomplished. The received data has been pulse compressed in the frequency domain and the Doppler ambiguity removed, and the first step thresholding to reduce data to be processed has been accomplished. The next step is the processing to determine Doppler frequency within each Doppler filter selected for potential target signal.

The process of determining frequency is as described above and in the '939 application.

All the selected filters are searched for signal positions that provide minimal phase standard deviation. This is accomplished by phase correcting each filter based on its filter number position. FIG. 7 is a flow diagram for correcting FFT filter phase change for the four-to-one redundancy used. All filters divisible by four need no bin center phase correction. All adjacent filters one position up require –90 degrees of phase shift, two positions up require –180 degrees of phase shift and three positions up require –270 degrees of phase shift.

As shown in FIG. 7, the phase is cumulative, up to a full rotation (360 degrees), and then repeats. The phase information representing the output of the FFT process, due to the arc tangent function used, produces a discontinuity at the 180 degree point. Phase correction must account for this discontinuity. This is shown in FIG. 7 as the function that monitors all correction additions/subtractions, and if magnitudes occur that exceed 180 degrees the appropriate correction is applied as shown.

All corrected values replace the old values in array storage. Phase rotation in the '939 application was conducted using an arc tangent function as described here.

A less computation alternative is to use the real and imaginary outputs of the FFT process and rotate using a unity vector as described previously for pulse compression in the frequency domain. The unity vector approach replaces the arc tangent function here.

The next step is to conduct the search routine for finding "potential signal" position in each FFT filter. The search routine shown in FIG. 8 is used when no consideration for Doppler dynamics is required. The search routine process starts with selection of all the processed data (runs one through the maximum number of integrals selected for integration) for filter (x=0). As shown in block 1 of FIG. 8, a phase multiplier of –72 degrees (M=–72) (corresponding to a –0.80 offset from filter center) is subtracted from the first run (R=1) value. The resulting phase is checked for 180 degree discontinuity and corrected if the addition/subtraction magnitudes exceed 180 degrees. (This phase process is replaced by unity vector rotation as described above.) This new value is stored in a processing buffer and the process repeated for the second run value (R=2) with M multiplied by the run value. The process is repeated for all runs to be integrated.

The resulting process serves to phase correct all values in filter (0) for a hypothesized signal in a –0.8 filter offset position. The mean phase value is complicated by the phase discontinuity at 180 degrees. A proper solution requires an array vector arithmetic approach as shown in step 2. All the buffered run values for the selected filter are corrected by subtracting the mean value from each run. The process serves to shift the mean phase value of all the integral values to near zero degrees. Step 3 is shown only as a reference to confirm that the zero mean value is achieved. In the vicinity of zero degrees, traditional mean value calculations are in order due to the separation from the 180 degree discontinuity. The process to this point removes any phase anomalies that have occurred in the data, like the phase shift that the antenna may have provided.

Step 4 determines the standard deviation of phase for the given M value, step 5 sets the initial value of standard deviation to 180 degrees for each filter run and step 6 compares the calculated value with the previous value and if the new standard deviation is less, this new value is stored along with the filter positional number (step 7). The above process is repeated for M=–71 through M=72 in steps of one degree. The search from –0.8 offset through +0.8 offset for each filter finds the signal position where minimum standard deviation occurs. The standard deviation and signal position (M) (M represents frequency of the signal in the filter) are recorded for use in other processing. During this process the original values of phase are maintained unchanged in memory.

Figure 30:
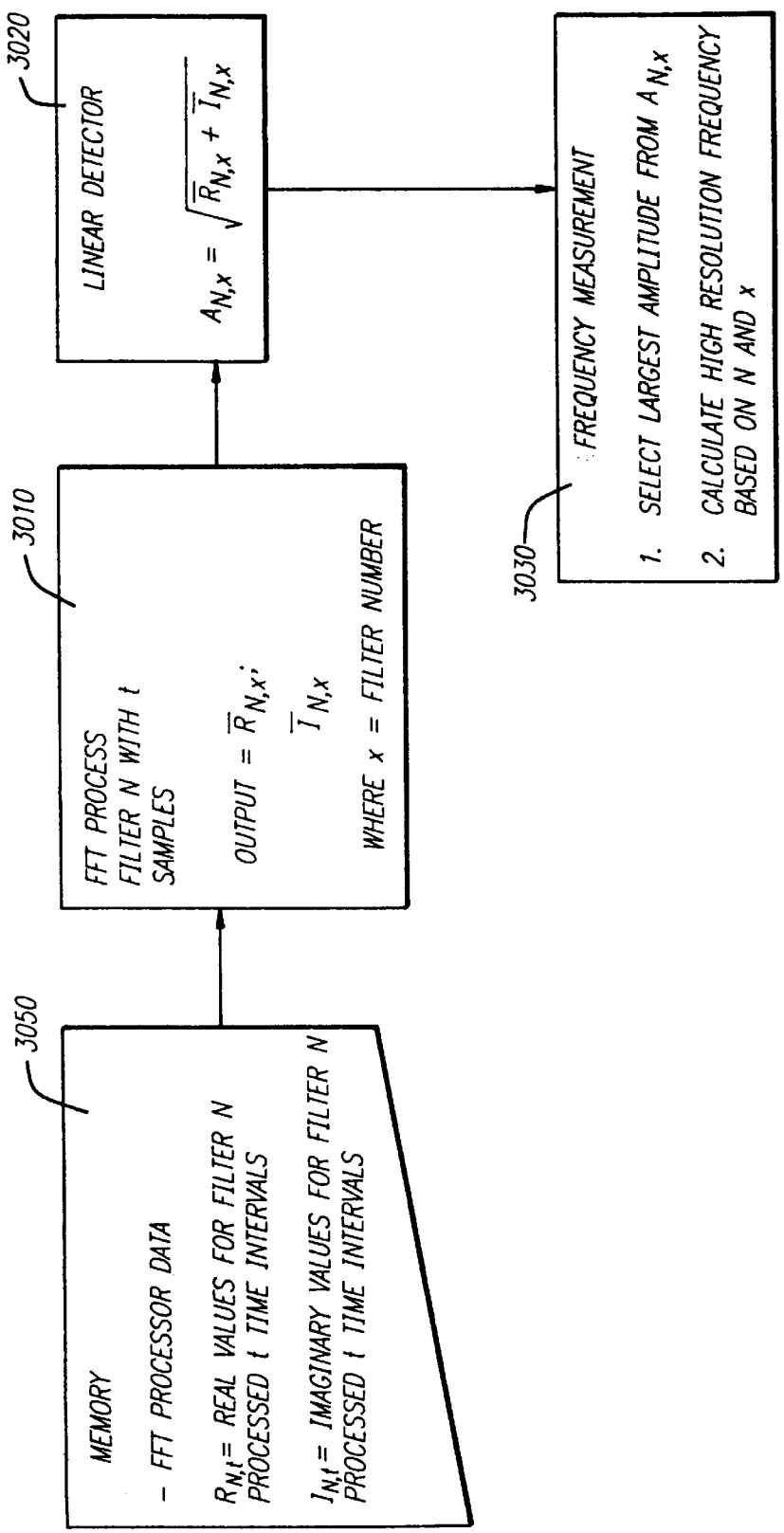
FIG. 30 shows an alternate high resolution frequency measurement process.
Figure 31:
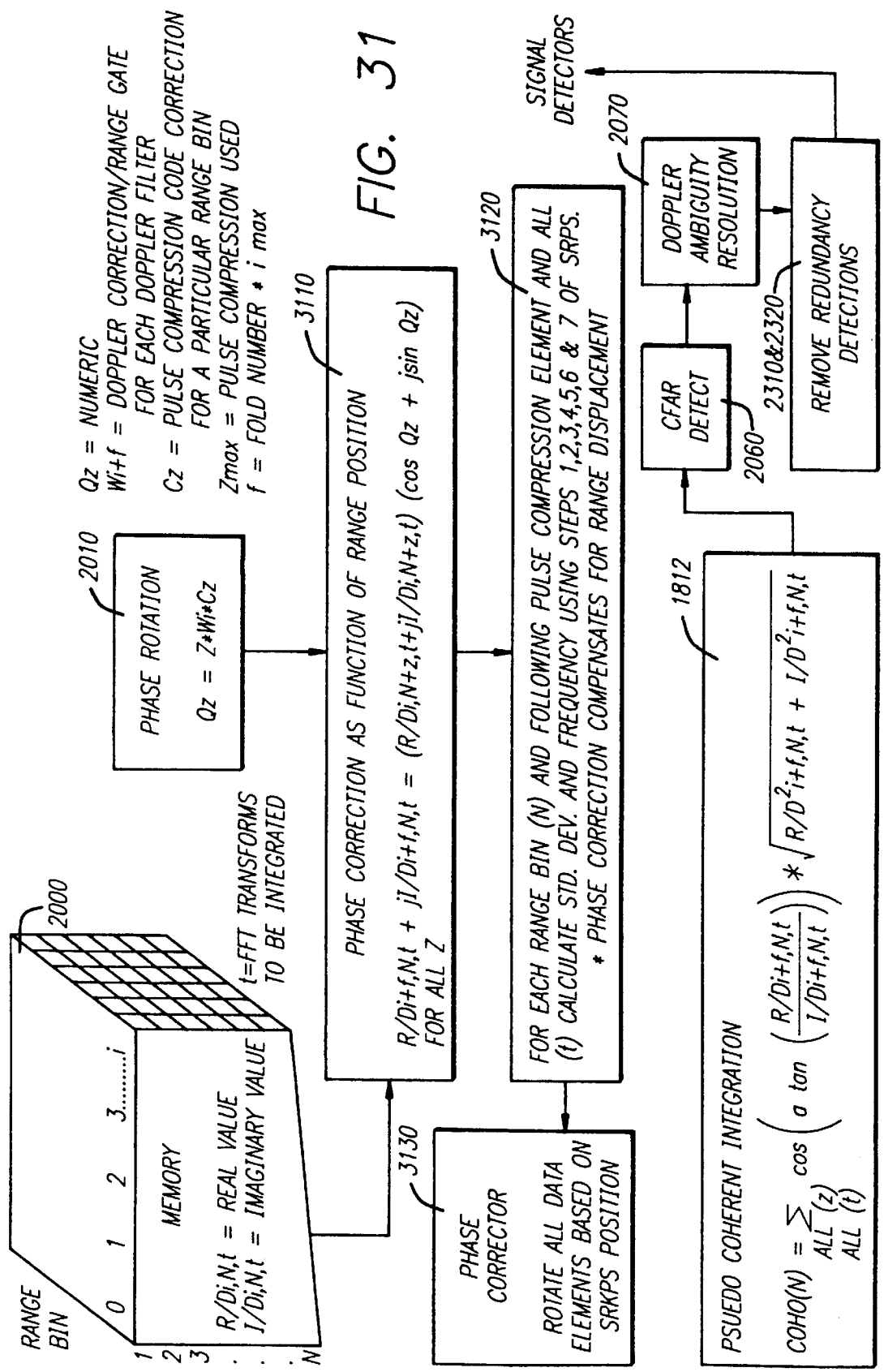
FIG. 31 illustrates a higher performance, coherently integrated compression, Doppler ambiguity resolution, and redundant detection removal process used in FIG. 19.

An alternate high resolution frequency measurement is offered for possible use in this disclosure. This process is widely known but not known to be used in radar applications. The process is shown in FIG. 30. The architecture is that of collecting consecutive outputs of a FFT processor for each FFT filter, as shown in 3050. The collected outputs are then processed in a second pass FFT where the collected samples of the FFT filter being processed are consecutively ordered as the array of data for the FFT process, as shown in 3010. The outputs of the second FFT process are detected using a linear detector 3020 and, in turn, are passed to the frequency measurement unit 3030 for frequency determination. The high resolution frequency is determined by the center frequency of the first filter and the offset position determined in the second FFT process. This alternative does not provide the frequency accuracy or standard deviation measurements as does the '939 application, and it is noted here for purposes of understanding.

Figure 21:
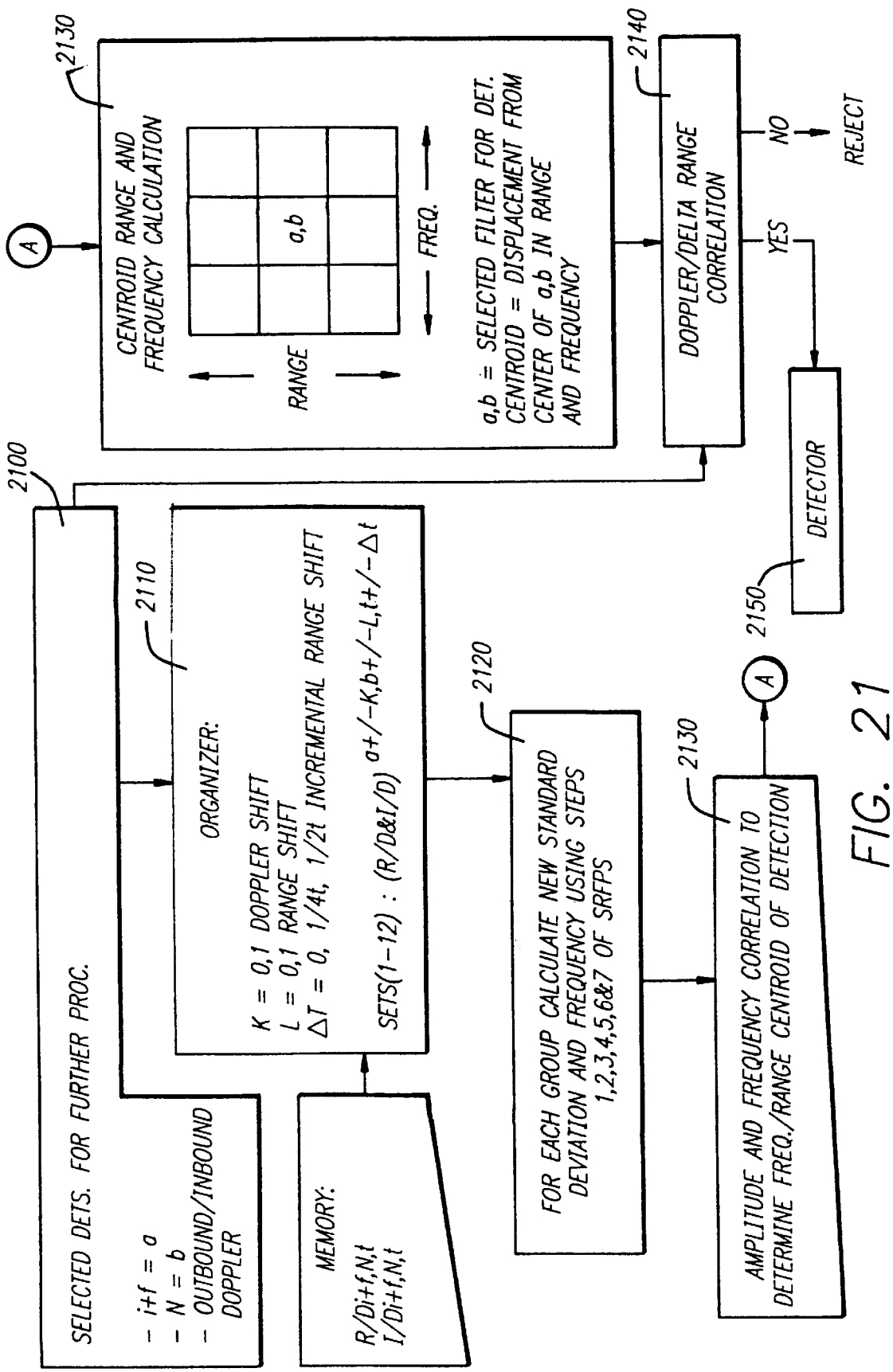
FIG. 21 shows the range bin correlation processor function.

Next the adjacent filter correlation measures position in adjacent filters, as shown in FIGS. 9 and 10, using the M values obtained in the SFRPS functions for all filters whose bin position is greater than 0.2 offset, and if correlation with the adjacent filter is within four units then both filters are tagged for special detection processing. Correlation within four units was selected based on several test runs that provided good performance. An additional step is provided here that was not described in the '939 application. This step is to determine range bin straddle, as shown in FIG. 21.

Range bin correlation is a like process as adjacent filter correlation with the exception that the subject of correlation is the range bin following the filter of interest for outbound targets and is the range bin preceding the filter of interest for inbound targets. The organizer shown in FIG. 21 at 2110 organizes the data for subsequent processing. The processing 2120 computes frequency and standard deviation for all sets organized for processing. A centroid calculation determines where the centroid of detection exists, given correlation is established in the adjacent frequency and range bins. 2140 validates the results by insuring the Doppler agrees with the direction of the computed delta range. The final process is to confirm detection at the system false alarm rate desired using one of several detector approaches.

At this point all the preprocessing needed to complete the correlation integration and detection process has been completed. The following information has been determined for all the Range/Doppler bins that have been selected for potential targets: 1. Precise frequency determination; 2. Phase standard deviation; 3. Adjacent filter correlation; and 4. Range bin correlation.

Prior to pseudo coherent integration, the stored phase values R/Di values all need to be corrected for the value of M obtained with the Search Routine shown in FIG. 8. The corrected new values replace the old stored values. The pseudo coherent integration (FIG. 10) is then applied by taking the cosine of the stored phase value $R/D_i$, multiplying it by the filter magnitude value, dividing the value by the number of samples in the integral and summing it with the value obtained for the repeated process on the next sample to be integrated. The process is repeated for all samples in the integral period and repeated for all filters. As described previously, the arc tangent phase rotation approach has been replaced with the unit vector approach. This change requires that the above process be applied to the Real and Imaginary values stored out of the FFT process.

For those filters that have been identified with consecutive range bin correlation, an additional processing step is required to determine the degree of range straddle (FIG. 21). The process is based on the number of transforms integrated. For PRF-1 transforms, this is determined by comparing the FFT transforms from the leading range bin with the transforms from the following range bin as set forth in the Table 5 for outbound targets. Leading and following interchange for inbound targets.

TABLE 5

|  | LEADING RANGE BIN TRANSFORMS | FOLLOWING RANGE BIN TRANSFORMS |
| --- | --- | --- |
| 1/4 straddle | 11–42 | 1–10 |
| 1/2 straddle | 22–42 | 1–21 |

A frequency correlation count along with Standard Deviation Values is established for each group, and the group set that provides the best correlation is established as the centroid (FIG. 21 at 2130). To minimize the range straddle loss, the integrated range bin values are adjusted to allow for range bin offset as just determined. The adjustment involves removing the integrals not containing signal from the leading range bin and replacing them with the integrals containing signal from the following range bin. This is accomplished for adjacent filters as well.

The final step is to declare detections. This is accomplished by capitalizing on the dominant attributes of each of the above processes and varies based on the integration period and the environment the processor is to be used in. The following describes each detection process.

Same Filter Detection (SFD) is implemented in the ratio concept, and the process is shown in FIG. 10. A filter test is used to reduce the number of candidates to be evaluated. The filter tests reduce false alarm rates thus providing performance benefits. If the selected filter passes the filter tests (steps 1,2,3,4), the filter qualifies for the ratio test. To pass the filter test the standard deviation of the filter must be less than a predetermined standard deviation value as shown in step 1. Given it passes this test, a determination is made on where the signal is in the filter (M value). If less than 0.2 units displaced from filter center, it is routed to the single filter ratio test in step 5. If the ratio of the pseudo coherent integration is greater than a predetermined value (an approximate value in the vicinity of 0.6), it then qualifies for a detection. If the signal is displaced greater than 0.2 units from filter center, it is checked in step 3 to determine if it passed the adjacent filter correlation test. If true, it is then routed to the single filter ratio test in step 5. The process is repeated for all filters. All threshold values are adjusted based on a number factors to achieve optimization. The use of the ratio test is subject to optimization of the radar mode of operation. The choice of using it singularly or in combination with the following summed test is a viable option.

FIG. 11 shows the functional flow for the filtered sum detector. The filter function shown in FIG. 10 steps (1,2,3,4) are used to reduce false alarm rates in the filtered sum detector. This is followed by a summation process where the pseudo coherent integration for the selected filter is added to the traditional integration value of the same filter. Detection is then accomplished with a threshold exceeding test. Filtered traditional detection and pseudo coherent integration detection are accomplished in a like manner.

Figure 22:
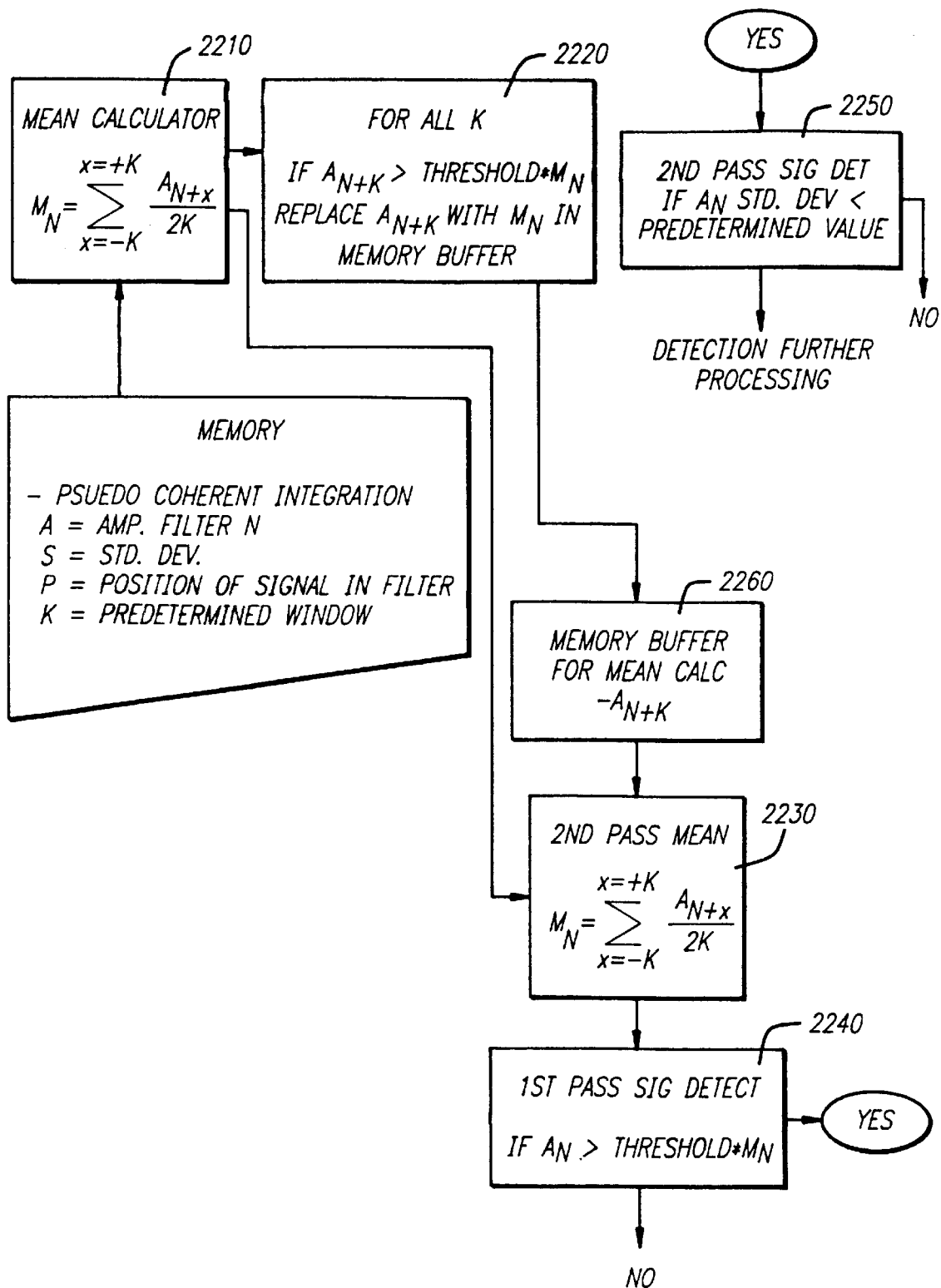
FIG. 22 illustrates the two pass means, two pass threshold detection process.

With the exception of the single filter ratio detection approach, all other signal detectors are based on the premise that all filters surrounding a filter that has a signal contain noise. Given that premise, the objective of the detection process is to determine the noise level in the surrounding filters. If the signal plus noise in the filter considered for detection is larger than the noise by a predetermined amount, the filter is considered to have signal in it. The process is subject to false alarm due to the noise and loss of detection due to other signals in the surrounding filters biasing the mean calculations. The two pass mean/two pass threshold detection shown in FIG. 22 minimizes these problems. The integrated signal filter to be detected and its neighboring filters are processed by the mean calculator 2210 to determine the mean. A threshold check 2220 is conducted on all of the filters that were used for the mean calculation and, if any exceeds a predetermined value, its value is replaced by the mean calculated. The mean is recalculated in 2230. This process removes strong signals from the mean calculation. Using this second pass mean value, a threshold test is conducted with the filter of interest 2240; and if the signal is larger than a predetermined value, it is declared as having a signal. To reduce the false alarm rate, a second threshold test is conducted using the standard deviation value of the signal filter 2250. If the standard deviation is less than a predetermined value, the detection is confirmed.

Tests have shown that an integrated signal detector using the best attributes of the above approaches is the ideal detector. The region of –0.1 to +0.1 is covered by summing the pseudo coherent detection with traditional detection. Detections must exceed a predetermined threshold value based on the mean and must pass a filter test.

To pass the filter test, the standard deviation of the filter must be less than a predetermined standard deviation value and the signal position in the filter must reside between −0.1 to +0.1. The region between 0.1 to 0.4 on each side of filter center is based on thresholded pseudo coherent integration and several different filter concepts. The 0.1 to 0.3 filter uses standard deviation and signal position. The 0.2 to 0.4 filter uses a larger standard deviation and a coarse adjacent filter position correlation. The 0.3 to 0.4 filter uses the largest standard deviation and signal position. For signals that fall between 0.4 and 0.5 on each side of filter center, adjacent filter summation is used for the detection process. For those filters that the correlation has identified in adjacent filter, the signal in the nearest adjacent filter or range is summed with the identified filter, and the sum is compared to a threshold that is obtained by multiplying the mean value that is calculated for the traditional detector by the appropriate value that provides the 0.01 false alarm detection rate. Use of the 0.01 threshold provides a system false alarm rate of 0.0001 due to the first level thresholding which has reduced the data set by a factor of one hundred.

Figure 23:
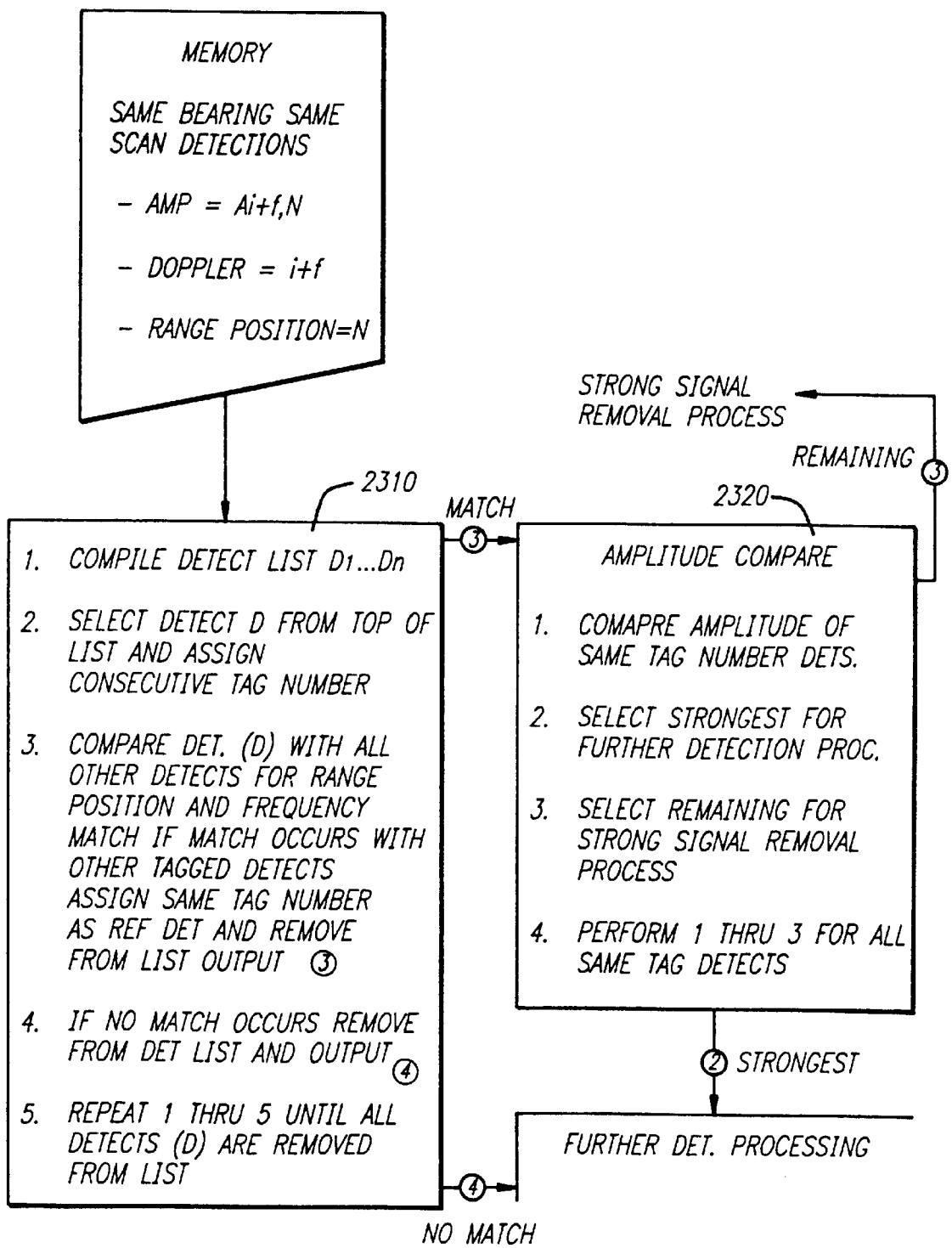
FIG. 23 shows how multiple detections of the same target are processed.

Use of pulse compression in radar suffers from the side lobe response of the pulse compression code used. The net effect of this side lobe response is that a strong signal will have multiple detections. These detections are from the same filter in following range bins. The objective of the same target multiple detections shown in FIG. 23 is to delete the multiple detections from the signal detection process and identify the filters that have these detections for signal removal. Given that these multiple detections have a predetermined detection pattern following a strong signal detection and that they are all directly related by frequency, the process of identification is one of logic and signal compare 2310. The comparison groups all related frequency detections into their own group or, if no group is found, it is passed on for further detection processing. If a group is formed, it is passed to 2320 for an amplitude compare test. The largest signal range bin of the group is determined as the detection and all others of the same group are passed for strong signal removal considerations.

All detections from a look dwell are sorted to the next step processing. This is accomplished by sorting the detections into like classes, namely:

1. New detection first PRF report;
2. New detection second PRF report; and
3. Targets that have been detected previously, ambiguity resolved and heading determined.

Figure 24:
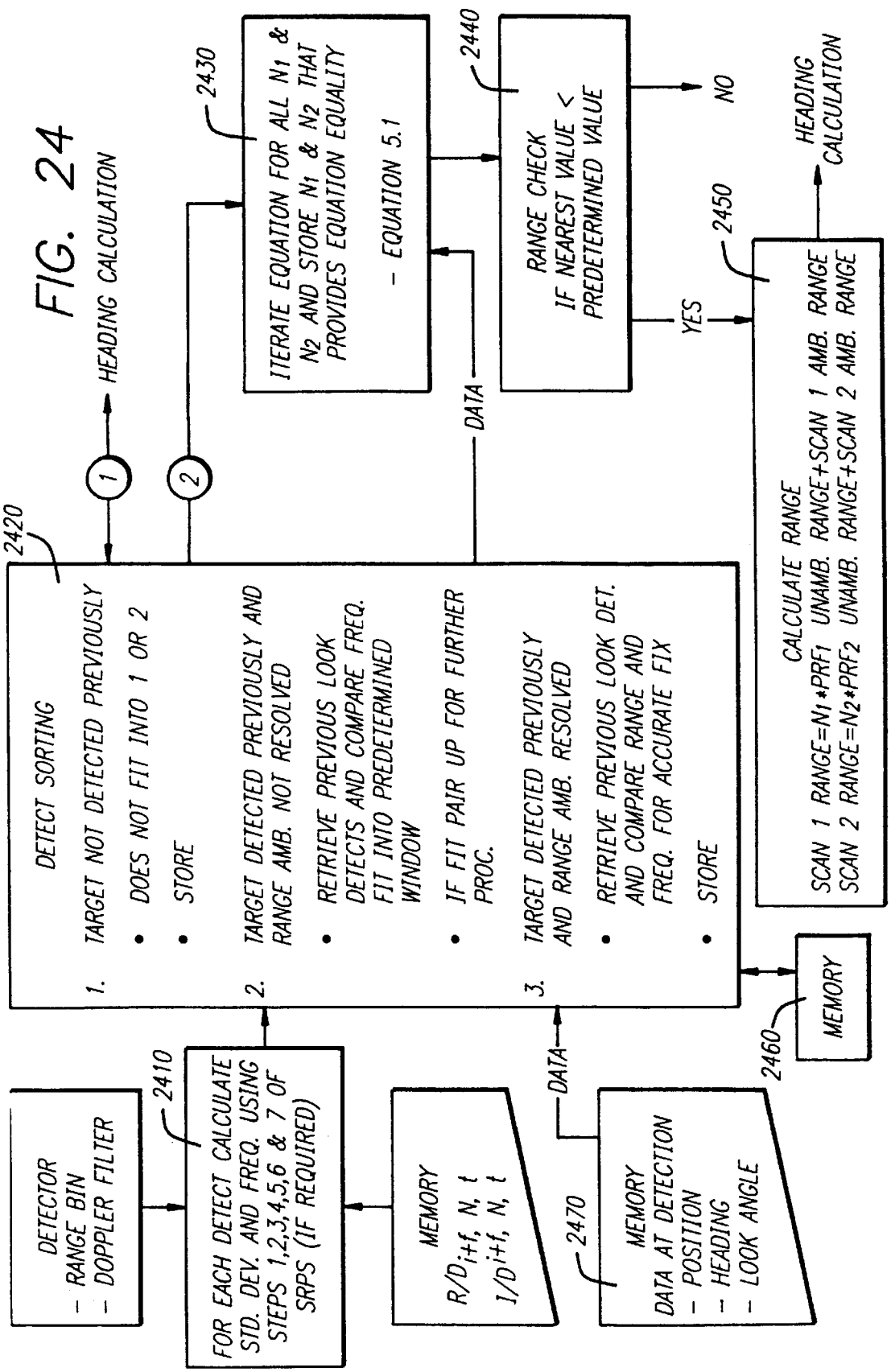
FIG. 24 shows the process for range ambiguity resolution.

Target detect sorting (FIG. 24 at 2420) sorts targets detected on the very first PRF and holds for pairing on the next scan detections. Targets detected previously are paired with current detections if the detections fit within a predetermined frequency window and angular window. If pairing occurs, the pair is routed to 2430 for range ambiguity resolution calculations, as described in Section 5, Equation (5.1). Inherent in Equation (5.1) is the fact that if the equation does not convey to a solution, the pair is not valid. False target pairing is minimized by the use of tailored window sizes (size determined by Doppler measured: high Doppler, small window; low Doppler, wider window). Range check is performed by 2440. Range ambiguity resolution must take into consideration the time lapse between measurements. In this interval of time, both the target and the radar have changed positions and the range change position from the first detection to the second must be accounted for, as shown in Equation (5.1). The solution in Equation (5.1) provides two variable values which are used in 2450 to calculate the unambiguous range.

Based on the true range a heading is computed using either cross range Equations (4.7), (4.8), (4.9) and (4.10) or cross angle equation for all the identified candidates. If heading is computed, the correlation is true and the target pairing is validated. If a heading cannot be computed, correlation is not sustained and the target is held for the next PRF change for second try pairing correlation.

Figure 25:
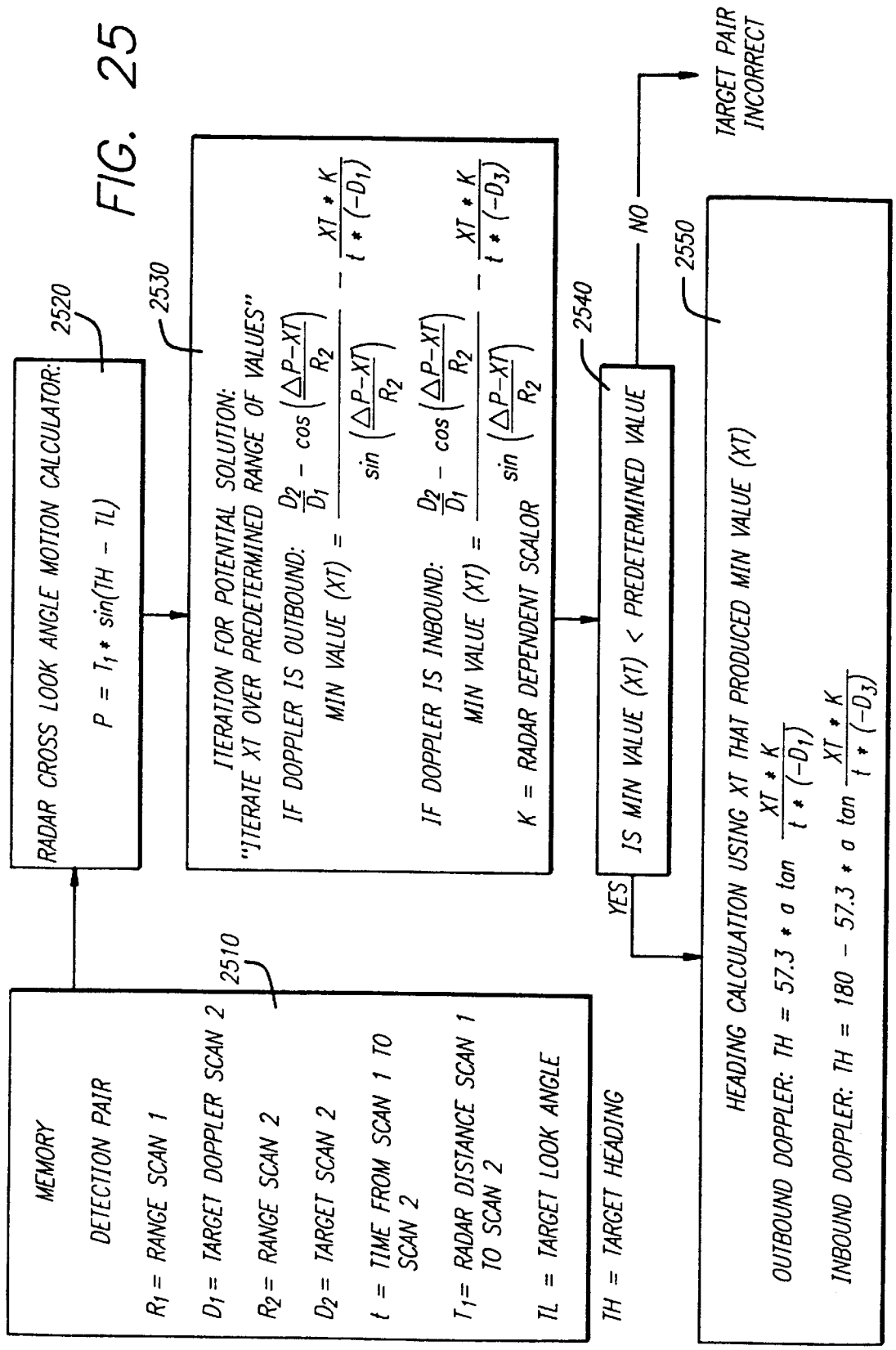
FIG. 25 illustrates the process used for cross range heading calculation.
Figure 26:
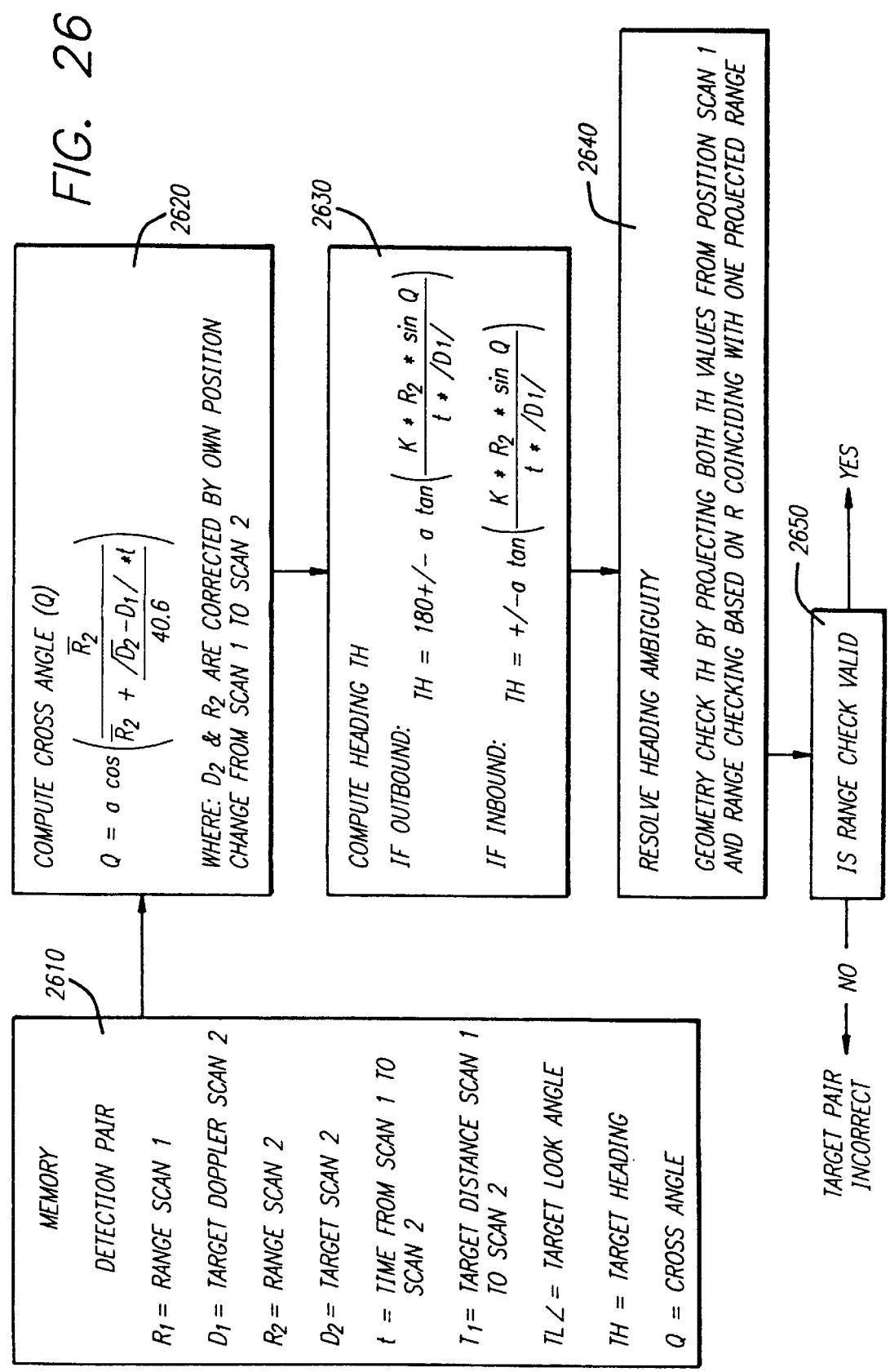
FIG. 26 shows the process for cross angle heading calculation.

Targets that are sorted as previous detections are sorted using much narrower windows due to having heading information. Heading measurements are updated for all previously detected targets, and the headings are correlated to insure target correlation from scan to scan, and to alert tracking for heading changes. If the Doppler frequency change is immeasurable from scan to scan, multiple scans are used and in the interim the correlation of frequency will be used to confirm same target detection from scan to scan. The heading arithmetic process is as shown in Section 4 above and diagrammed in FIG. 25. 2510 stores the data needed for computation. 2520 calculates over distance traveled perpendicular to look angle. 2530 calculates the heading and passes the results to 2540 to validate. 2550 calculates heading relations to look angle. FIG. 26 is the flow diagrams for cross angle heading calculations.

The above process is simplified because the design has no Doppler ambiguity. It is pointed out that even if Doppler ambiguity existed, the alternative process for resolving Doppler ambiguity in Section 5 would resolve Doppler ambiguity. The correlation process remains the same, however as explained more candidate trials occur for testing and would get more rejections. That is, instead of having only one Doppler window to search, there would be a Doppler window at every Doppler fold for both inbound Doppler and outbound Doppler. The correlation process would confirm only one candidate Doppler velocity.

Figure 27:
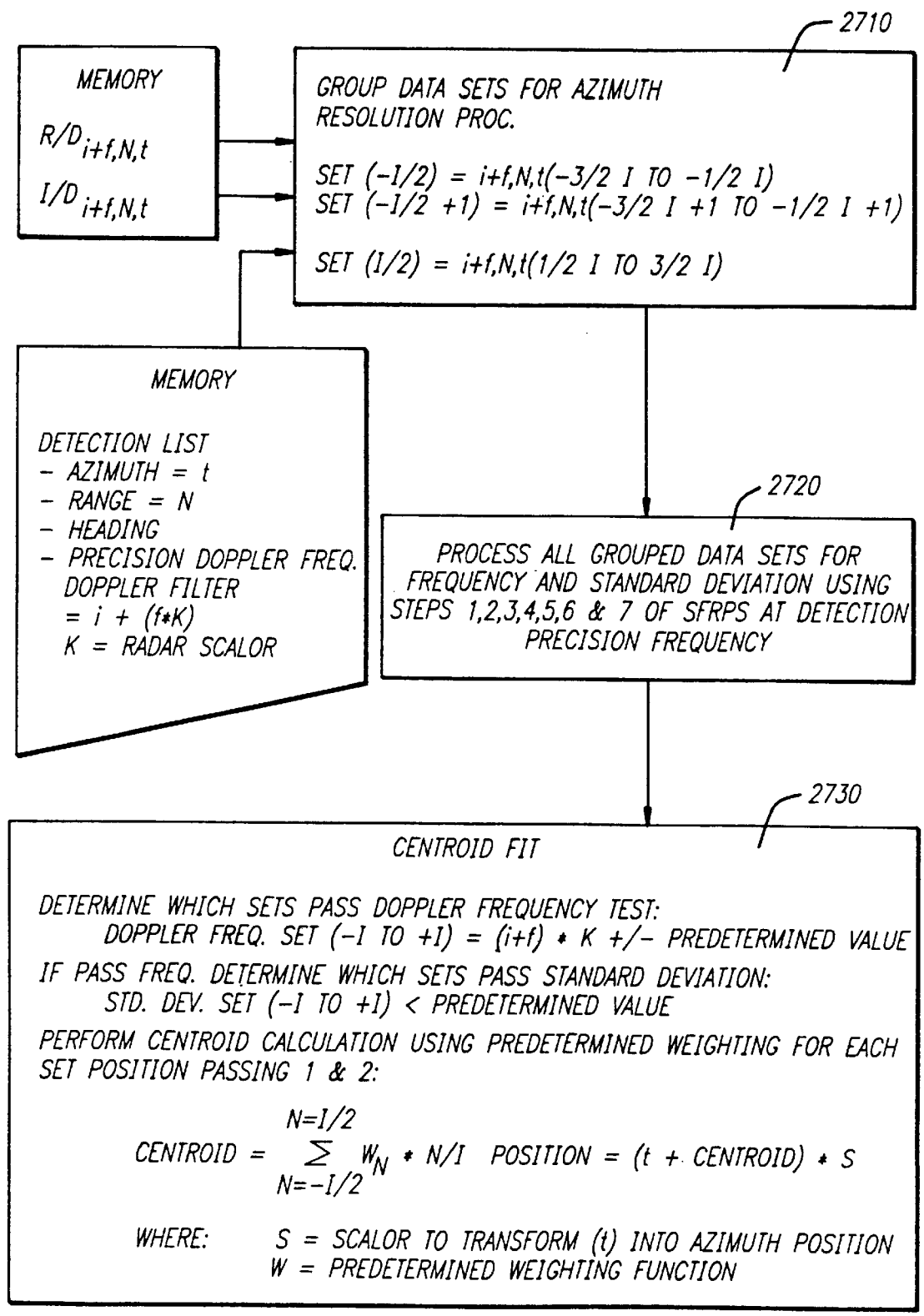
FIG. 27 illustrates the process for providing azimuth resolution improvement.

The heading calculation added to this radar provides significant improvements to the radar's capability to track targets. A further improvement can be provided by improving the look angle (target azimuth) measurement, as described in Section 11. FIG. 27 diagrams the process. For the detection of interest, the group data sets function 2710 groups the data collected into predetermined sets and passes the groups to the frequency and standard deviation function 2720 for frequency and standard deviation calculation. The results are passed to the centroid fitting function 2730 to determine the centroid of azimuth detection.

Figure 28:
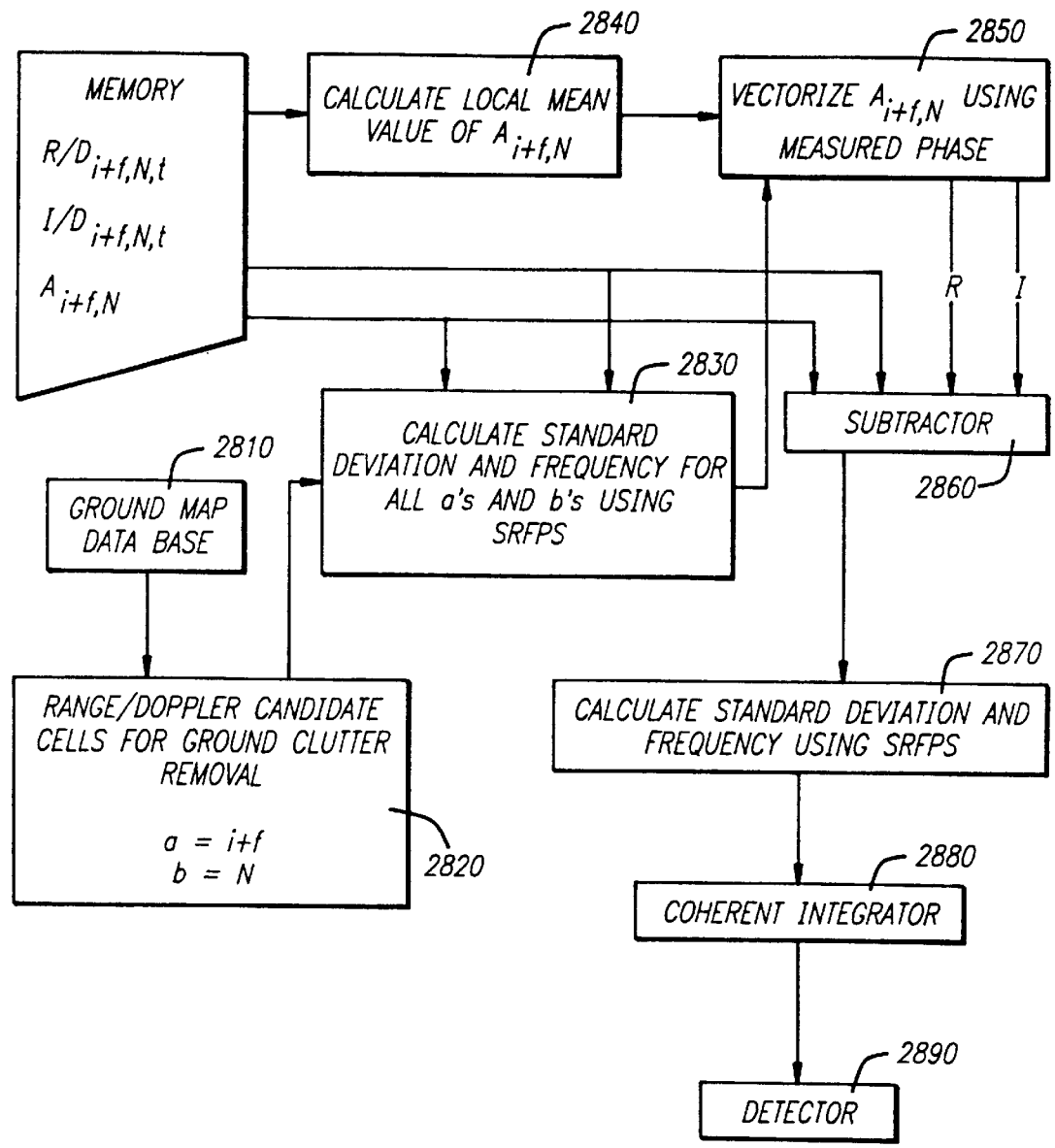
FIG. 28 illustrates the clutter signal removal process.

The clutter removal capability described in Section 10 provides this radar with the capability for improved detection by reducing the magnitude of clutter picked up by the radar. FIG. 28 diagrams the process. The range Doppler cells that are contaminated with clutter are predetermined based on the radar characteristics. This information can be reduced to a ground map 2810, and stored for use by the radar when required. Cell determination 2820 uses the ground map to determine which range/Doppler cells will be subject to ground clutter removal. The cell numbers are provided to the frequency and standard deviation calculator 2830, to calculate frequency and standard deviation. The local mean calculator 2840 calculates the mean value of the clutter surrounding the cell of interest. The vector unit 2850 constructs the vector that is to be subtracted from the bin of interest. Subtractor 2860 subtracts out the mean clutter and a second frequency and standard deviation calculation is accomplished by 2870. The output of 2870 is pseudo coherently integrated by 2880 and detected by 2890.

The design approach in the previous sections details the processing for FIG. 18. The major difference between FIG. 18 and FIG. 19 is that FIG. 19 does not rely on the traditional detection process to identify the target bins that will use phase correlation processing for the final detection process. Rather, FIG. 19 processes all range Doppler bins for detection and then uses an additional processing step which removes strong signals and ground clutter and reprocesses for detection. The major advantage of the FIG. 19 approach is that the pulse compression processing utilizes the phase correction and pseudo coherent integration to replace the summer previously used in pulse compression and is extended across all the bins that the pulse compression code covers. FIG. 30 at 3110 provides the phase correction, 3120 computes the frequency position and standard deviation needed to correct all involved data bins needing correction prior to coherent integration. In FIG. 18, the correlation for one range bin for PRF-1 extends across 40 four-to-one redundant FFT processing units. In FIG. 19, the correlation for one range bin for PRF-1 extends across 800 four-to-one redundant FFT processing units. This length of correlation provides improved frequency accuracy and much sharper standard deviation functions, thereby improving overall detection.

Figure 29:
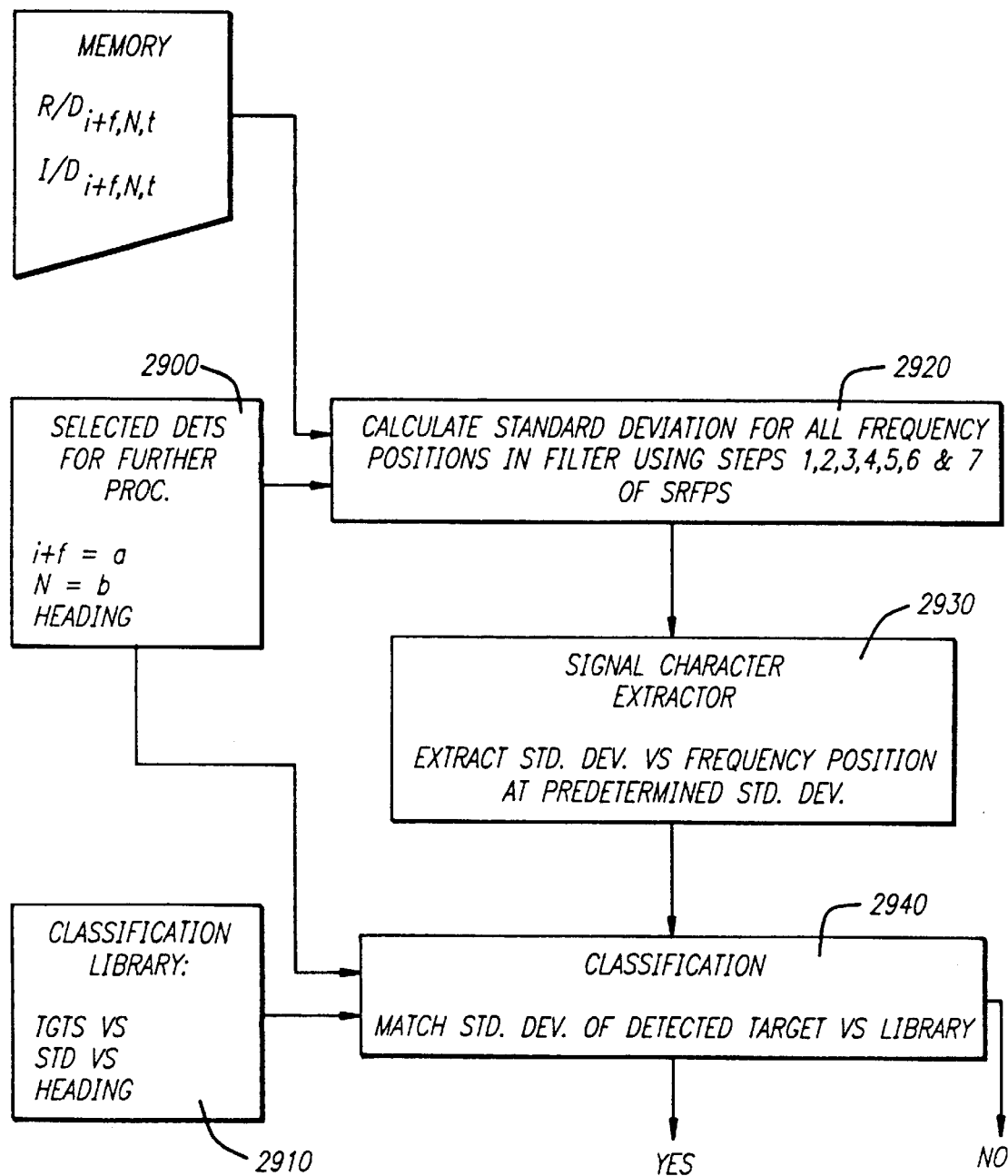
FIG. 29 shows the process for target classification.

Classification processing shown in FIG. 29 is added due to its importance and is a simple extension of the search routine to determine frequency position of potential signals in filters. For all Doppler filters that are holding detection 2900, the image processing routine using the frequency search routine 2920 obtains the standard deviation for all frequency positions in the filter. The standard deviations for each position are sent to 2930 to extract signal features. Feature extraction is based on the standard deviation values being less than a predetermined value. Features extracted are routed to 2940 for classification. Given that targets are defined by Sterling as having one or more scatters, the feature extractor has the capability to identify more than one scatter within the filter, and knowing the Doppler relationship between the scatters can lead to target classification. Current technology has not been focused to show the frequency differences between the scatters because of the inability to measure frequency accurately enough. Thus, virtually no data exists to show the degree of classification that can be achieved. 2910 would contain a library of features that are collected from targets using the extractor approach.

Azimuth resolution improvement is accomplished for all detected targets to aid in computer tracking of the target. The processing performed to obtain the centroid of the azimuth is as described in Section 11.

15. New Medium PRF Performance Calculation/Comparisons

The performance of the new medium PRF architecture is calculated here, and preliminary comparisons made with current technology fighter radar's performance. The analysis is not intended to show range detection performance, but rather to show the dB performance difference due to the design approach taken. The transmitted power used is that which is available from the transmitter. The antennae, transmitter, receiver, and exciter are common to both designs, and any losses in these systems are considered the same for both systems.

Figure 32:
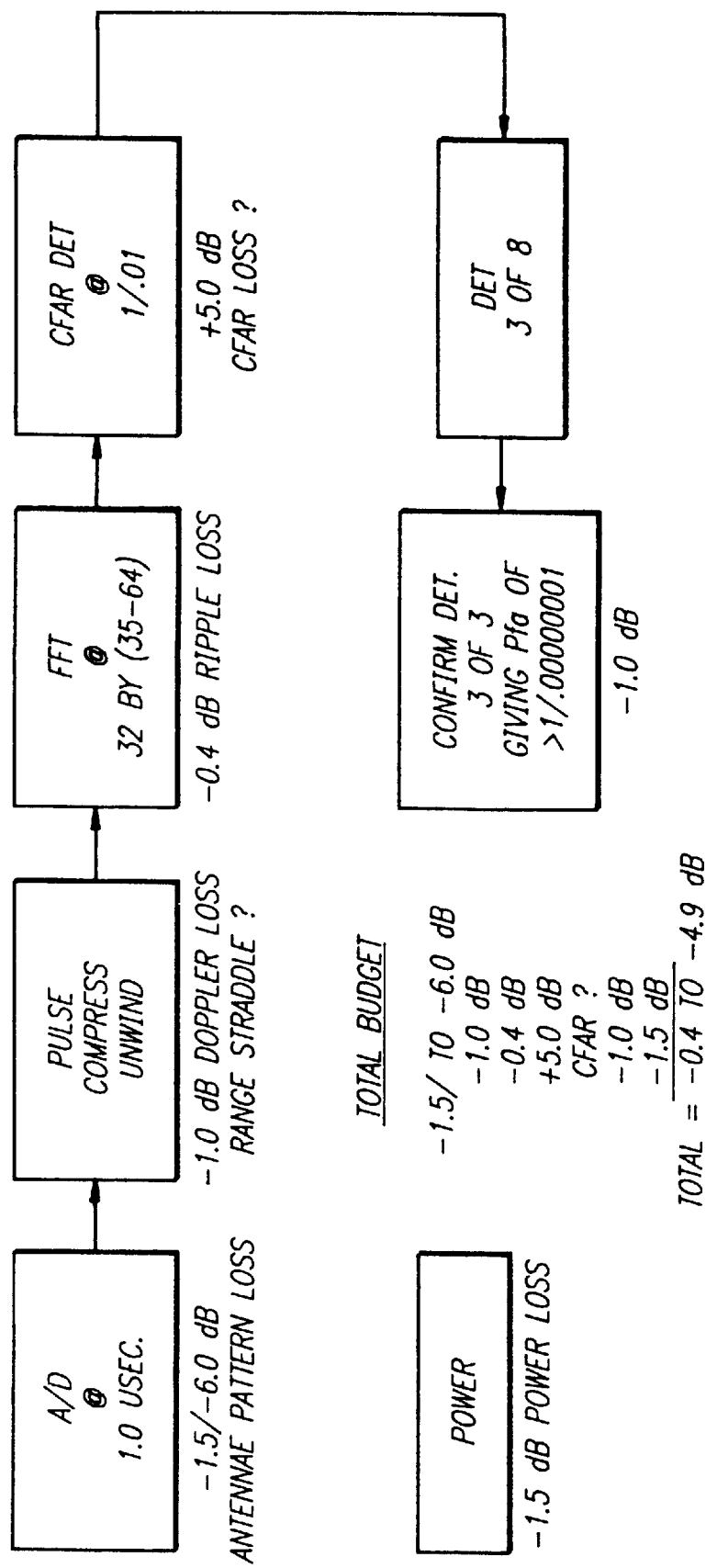
FIG. 32 shows performance calculations for a traditional Medium PRF.

FIG. 32 is the performance analysis work sheet for the traditional implementation of medium PRF. The performance calculations take into account all known losses except for the differences in the FFT resolution. The gain associated with the FFT resolution is accounted for in the new medium PRF mode due to the fact the new medium PRF mode has better resolution. Antennae two way pattern loss for a true 3 of 8 is −6 dB. However, it is clear that the system will operate without all PRFs present but will suffer other penalties. Not knowing the impact, the analysis shows both (−1.5 dB and −6dB) with the true answer somewhere in between. Doppler pulse compression loss of −1 dB is conservative considering the wide range of target velocities for which the radar must provide adequate coverage. Range straddle loss is not identified due to the dependency on A/D's and range gate sizes.

A +5.0 dB gain is valid for operating the detector output at 0.01 false alarm rate. The 0.01 false alarm rate is high and expected to accentuate ghosting problems. The number of candidate range bins for detection varies with each PRF; however, the average number is approximately 8*32*45 which is 11,520 candidate detection bins. With a 0.01 false alarm rate, one hundred and fifteen false alarms will be present in each 3 of 8 detection pass. CFAR detection losses are not budgeted due to various unknown variables. The gain is not claimed in the new medium PRF mode even though the design provides a means to avoid these losses. Traditional radars do not adjust the pulse compression to maintain average power for PRF changes and the average power loss is −1.5 dB. This loss has been assigned as the new medium PRF design is conceived to maintain average power. The final loss of −1 dB for 3 detections out of 3 scans is to compensate for the probability of detection drop. The total FIG. 20 performance calculations add up to −0.4 if a −1.5 dB antenna loss is appropriate or a −4.9 if a −6.0 dB antenna loss is appropriate.

Figure 33:
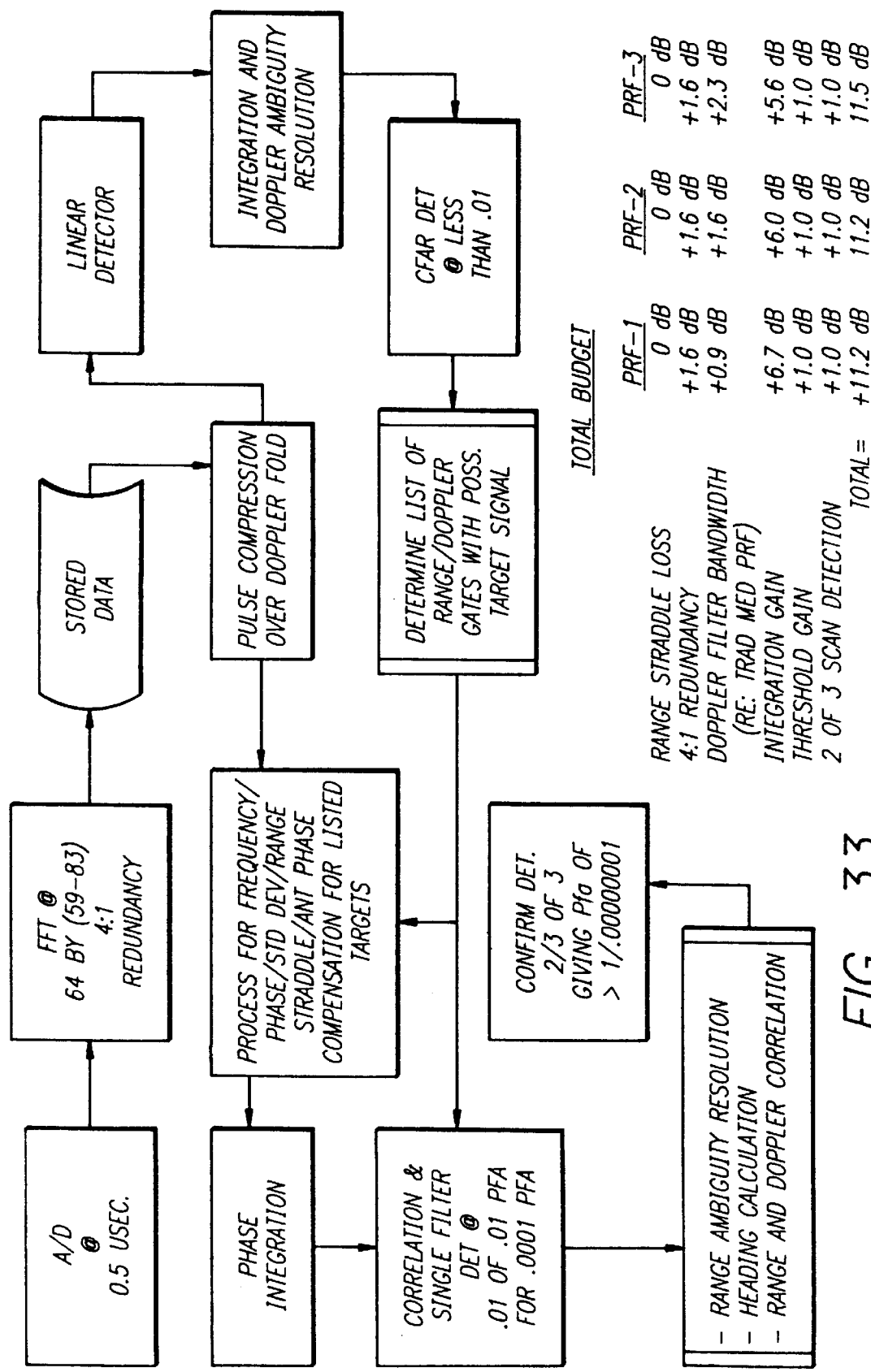
FIG. 33 shows the performance calculations for a new Medium PRF.

FIG. 33 is the performance analysis work sheet for the implementation of the new medium PRF mode. Four-to-one redundancy provides +1.8 dB gain, and the improved FFT resolution provides gain which varies with PRF. The gain is based on using the average PRF from the traditional approach. This improvement is very conservative considering that the FFT sizes are twice as great as the traditional medium PRF. The integration gain is obtained from Section 1 and is based on the number of integrals used and corrects the gain based on two-way antennae pattern losses. Range straddle is covered in the design so that no losses occur. Range straddle loss was not considered as a loss for the traditional design. A +1.0 dB gain is assumed for operating with a 0.0001 false alarm threshold and using two of three scan logic to validate detects. The minimum total performance in FIG. 21 adds up to +11.4 dB.

Comparing the performances of FIGS. 32 and 33, a total difference of +11.8 dB to +16.3 dB is seen depending on which antennae loss is appropriate plus what ever the improvements should be for both CFAR losses and range straddle. This positive difference is attributed to all the features discussed previously which can be implemented in the processing elements of existing radars or new radars. New technology memory and processing may be required for the increased processing needed. The analysis presented assumes that the radar processing hardware does not introduce computational errors due to limited arithmetic precision.

This much improvement in the noise limiting cases increases the detection range somewhere between a minimum of ninety-four percent and a maximum of one hundred and fifty-one percent. Not noted in the architecture is the ease in which even greater improvements can be achieved. Changing the scan to four seconds can be accomplished by simply slowing the scanning antennae and changing the processing to double the number of transforms integrated. This simple change provides an additional 2.6 dB of performance improvement. This change cannot be made easily in current systems because there is no integration. Instead the FFT size must be changed, and this leads to numerous changes in the processing. The complexity of the change generally precludes this change from being utilized in today's systems. The advent of ESA technology in future radars is primed to take advantage of this feature. Since the ESA technology allows multiple scan rates concurrently, this new mode can operate with one scan rate optimized for tracking and another optimized for greater detection performance.

16. New Medium PRF Computer Simulation

Figure 34:
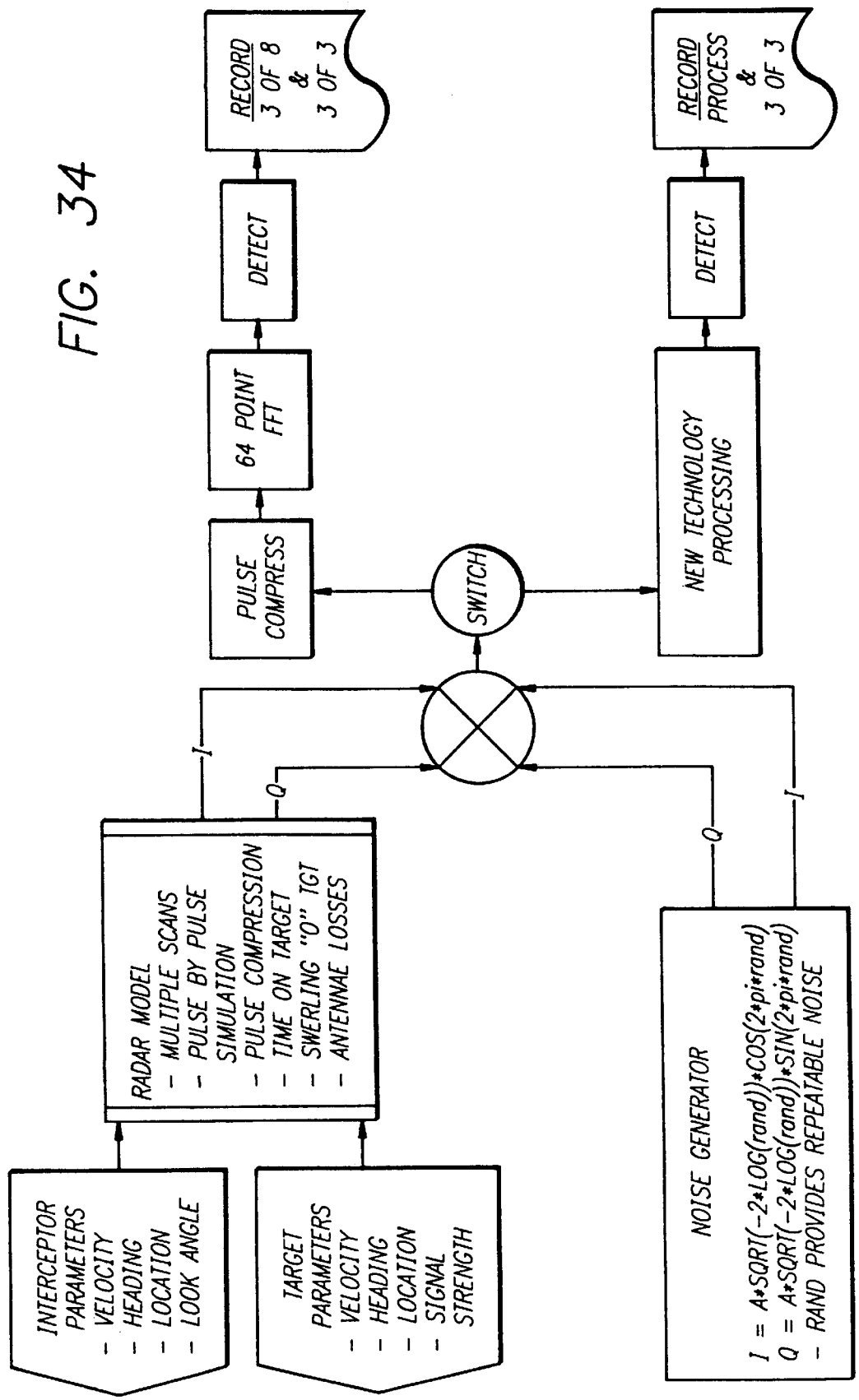
FIG. 34 is a computer simulation model of a new Medium PRF radar.

FIG. 34 is a schematic diagram of the computer simulation model developed to compare the performance of this new medium PRF radar against the F-16 radar. The simulation was constructed and tested with the objective that no hardware modifications are needed to the Radar except for the addition of additional processing needed to perform the new radar functions. The simulation represented by FIG. 34 in the new technology processing block was a program coded in C++ to represent a dynamic model of the new radar wherein all functionality need to make the radar perform was completed and tested. The test results confirmed the analytical analysis of Section 15 and of all the improvements claimed in the following section.

CONCLUDING SUMMARY OF THE INVENTION

A new design approach to radar medium PRF modes utilizing key attributes of the '939 application and new design approaches and system architecture to facilitate use of known technology have been described herein which provide the following system improvements.

* +11.8 to +16.3 dB signal-to-noise (ninety-seven to one hundred and fifty-five percent range increase for noise limited detection) improvement over the simulated radar using medium PRF. This improvement is accomplished using the same transmitted power, antennae, receiver/exciter and dwell times.

A coherent integration approach to improve signal detection performance.

A process to reduce ground clutter in areas where ground clutter is limiting range performance.

A process to identify target features in detected target returns.

A process to reduce impact of pulse compression sidelobe responses during strong target signal detection.

A process to eliminate redundant target detections without eliminating other targets.

Improved Doppler frequency accuracy two orders of magnitude.

Single filter signal detection capability avoiding losses due to noise estimating errors and/or uncertainty in background noise or clutter power.

The ability to measure and report target heading at the time of detection report.

A processing approach to improve the accuracy of the heading determination.

A processing approach to measure target Doppler frequency rate-of-change.

A processing approach to reduce signal losses associated with range straddle and correct the range error when this occurs.

A processing approach to reduce signal loss given that the received Doppler echo is not filter centered.

A processing approach to eliminate the pulse compression losses associated with high Doppler frequencies and wide transmitted pulses.

A frequency domain Doppler ambiguity resolver given that the radar uses pulse compression.

A correlation approach to resolve Doppler ambiguity given that the radar does not use pulse compression.

For radar systems relying on scanning antennas, a processing architecture that accommodates changing the scan rates to increase performance with minor adjustments in the radar processing software.

For ESA radar systems, a processing architecture that provides a means to interlace scan rates providing a fast scan rate for tracking and a slow rate to increase performance.

More particularly disclosed herein is a system architecture for increasing radar performance using a processing approach to provide a means to calculate target heading to improve signal tracking performance; to eliminate redundant pulse compression sidelobe detections; to improve range resolution; to improve radar detection range and to provide an image of the target return is disclosed herein. The architecture is predicated on more efficient time utilization during target dwells which is made possible by the organization of PRF scheduling, capability to determine frequency extremely accurately, perform pseudo coherent integration and use of multi strategy detection concepts.

Traditional radars that use ambiguous range PRF's are inefficient in the use of dwell time budgets due to the time consuming needs to collect data to resolve ambiguity. The PRF scheduling used in this radar architecture coupled with an approach to resolve ambiguity in subsequent scans provides very efficient time utilization during dwells to provide the increased detection range. The detection process is predicated on measuring frequency accurately following the FFT process and performing pseudo coherent integration based on these measurement. Following the detection process, the range ambiguity resolver uses a frequency correlation window to couple target detects from scan to scan and uses iterative equation solution based on correcting own motion and target motion between scans to solve for unambiguous range. Target headings are calculated for all detection using the accurate frequency data to compute cross range components of the target motion.

Accurate frequency measurement is made possible with a systematic processing approach for handling the data output of an FFT processor. The system measures FFT output phase standard deviation over a number of consecutive FFT runs, and subsequently adjusts the output for processing phase shifts. The system corrects FFT output phase in an organized fashion for all potential signal filter offset positions, while measuring changes in phase standard deviation, and selects the filter offset where the minimum standard deviation occurs. The system utilized pseudo coherent integration to augment and enhance traditional integration, where the pseudo coherent integration locates the mean phase shift within the number of FFTs integrated and corrects all FFT runs by this mean of shift value. The integration multiplies the magnitude of each FFT filter output by the cosine of the corresponding corrected phase and summing all FFTs in the integration period for the respective filter. Detections are then declared based on the ratio of pseudo coherent integration and traditional integration and the standard deviation values. Detection further utilizes various blended techniques across the filter bandwidth. A key feature of the process is the ability to provide a two dimensional presentation of the data residing in the filter in terms of standard deviation value versus filter position.

This image presentation has value in ground mapping and target identification.

The system provides additional performance improvements through use of the accurate frequency measurement to eliminate multiple same frequency detects that result from use of pulse compression techniques. Accurate frequency is used to correlate such detects and then removing all except for the strongest. Accurate frequency measurement is also used to improve the radar angular resolution using frequency and standard deviation measurements resulting from frequency measurement to correlate signal detections across the antenna. The resulting measurements are correlated to determine the centroid of signals received relative to the antenna pattern.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A system for performing enhanced signal detection for use with a fast Fourier transform processor having a plurality of filters and a traditional integrator, comprising:
   a filter number phase corrector;
   a filter unit phase rotation corrector;
   a mean phase calculator;
   a standard deviation calculator;
   a lowest standard deviation evaluator, wherein said filter unit phase rotation corrector, said mean phase calculator, and said lowest standard deviation evaluator iteratively step through all filter numbers in said filter;
   a pseudo coherent integrator; and
   a detector.

2. The system of claim 1, further comprising:
   an arctangent calculator for calculating real and imaginary outputs of said fast Fourier transform processor; and
   a memory for storing values of magnitudes and phase.

3. The system of claim 1, wherein said filter number phase corrector maintains the phase of all signals in FFT bins evenly divisible by the redundancy of the signal transmitted, and shifts all signals by a predetermined ratio between filter number and redundancy.

4. The system of claim 1, wherein said filter unit phase rotation corrector corrects filter phase shift based on signal position in the filter.

5. The system of claim 1, wherein the mean phase calculator calculates the mean of the signal phase, and the standard deviation calculator calculates the standard deviation of the signal received from the mean phase calculator.

6. The system of claim 1, wherein said detector comprises at least one of the group comprising:
   a single filter detector;
   a sum coherent and traditional detector;
   a filtered coherent detector; and
   a filtered traditional detector.

7. The system of claim 1, wherein the pseudo coherent integrator comprises an integrator and computes a value equal to the cosine of the stored phase value from the memory, multiplies the value by filter magnitude value, divides the value by a number of samples used in the integration, and sums the value with the value obtained for the repeated process on the next sample to be integrated.

8. The system of claim 1, wherein the detector determines whether the ratio of pseudo coherent integration from said pseudo coherent integrator and traditional integration exceeds a predetermined threshold.

9. A method for performing enhanced signal detection for use with a fast Fourier transform (FFT) processor having a plurality of filters, comprising the steps of:
   measuring predetermined FFT output parameters;
   sequentially adjusting FFT output based on said predetermined output parameters;
   sequentially correcting FFT output phase for all potential signal filter offset positions; and
   selecting signal filter offset where minimum phase standard deviation occurs.

10. The method of claim 9, wherein said predetermined FFT output parameters comprise phase standard deviation measured over a plurality of consecutive FFT runs.

11. The method of claim 9, further comprising the step of performing a predetermined detection algorithm to declare detections.

12. The method of claim 11, wherein said predetermined detection algorithm comprises a pseudo coherent integration routine.

13. The method of claim 9, further comprising multiplying the magnitude of each FFT filter output by the cosine of the corresponding corrected phase and summing all FFTs in the integration period for the respective filter.

14. The method of claim 9, wherein said method utilizes single filter detection.

15. A method for detecting signals for use with a fast Fourier transform processor having a plurality of filters, comprising the steps of:
   determining individual filter number phase rotation, filter signal position, and mean signal phase shift for signals in the FFT filters;
   correcting original values of phase for filter number phase rotation, filter signal position measured, and mean signal phase shift; and
   performing a predetermined detection algorithm to declare detections.

16. The method of claim 15, wherein said predetermined detection algorithm comprises a pseudo coherent integration routine.

17. The method of claim 16, wherein said predetermined detection algorithm performing step further comprises:
   computing a ratio of the pseudo coherent integration to traditional integration; and
   declaring a detection if said ratio exceeds a predetermined threshold.

18. The method of claim 17, wherein said predetermined detection algorithm performing step further comprises passing a filter test.

19. The method of claim 18, wherein said filter test passing step comprises:
   determining whether the standard deviation of the filter is less than a predetermined standard deviation value;
   computing whether the traditional integration value exceeds a threshold value for the traditional integration mean; and
   determining whether the signal position in the filter passes a coarse test.

20. The method of claim 15, wherein said signal detecting method further comprises utilizing a plurality of predetermined filter detection schemes to perform detection in different regions across the filter.

21. A system comprising:
   a Fourier transform processor;

means for performing high resolution frequency measurement, phase measurement and standard deviation measurements on FFT output signals of said processor; and a frequency rate of change template used in conjunction with a lowest standard deviation evaluator of said FFT output signals to determine frequency rate of change of the signal to be detected.

22. The system of claim 21 wherein said frequency rate of change template replaces a linear phase shift pattern a lowest standard deviation evaluator with a non-linear phase shift pattern that conforms with the desired frequency change to be detected.

23. A system comprising:

a Fourier transform processor adapted to receive a signal cycling at a frequency; and a first system for performing high resolution frequency measurement using phase measurement and standard deviation measurements of filter output data of said processor to determine where said frequency of said received signal lies within an output filter bin of said Fourier transform processor.

24. The system of claim 23 further comprising a second system to provide a processing data channel to enhance signal processing to support signal detection.

25. The system of claim 24 wherein said second system comprises a phase corrector and a pseudo coherent integrator.

26. The system of claim 24 wherein said processing data channel defines a first processing data channel, and further comprising a third system to provide a second processing data channel to enhance signal processing to support co-operative signal detection with said first processing data channel.

27. A system comprising:

a Fourier transform processor; and a first system for performing high resolution frequency measurement, phase measurement and standard deviation measurements of filter output data of said processor, wherein said first system comprises:

a filter;

a filter number phase corrector;

a filter unit phase rotation corrector;

a mean phase calculator;

a standard deviation calculator;

a lowest standard deviation evaluator; wherein said filter unit phase rotation corrector, said mean phase calculator and said lowest standard deviation evaluator iteratively step through all filter positions in said filter; and a frequency calculator.

28. The system of claim 27 further comprising:

an arctangent calculator for calculating phase of real and imaginary outputs of said transform processor; and a memory for storing values of magnitude and phase for a number of consecutive FFT transforms of said transform processor.

29. The system of claim 27 wherein said filter unit phase rotation corrector corrects filter phase shift based on signal position in filter, redundancy and FFT transform position number.

30. The system of claim 27 wherein said mean phase calculator calculates a mean of the phase of the filter output data and said standard deviation calculator calculates the standard deviation of the phase.

31. The system of claim 27 wherein said frequency calculator calculates a frequency of signal detected based on the position determined by said lowest standard deviation evaluator, the redundancy used and the filter number.

32. The system of claim 27 further comprising a second system for measuring signal characteristics of identified detections.

33. The system of claim 32 wherein said second system comprises a lowest standard deviation evaluator, and a signal character extractor.

34. The system of claim 33 wherein said signal character extractor comprises (a) a scheduler to schedule said lowest standard deviation evaluator to perform frequency and standard deviation calculations for all frequency positions in a Doppler filter where detection has occurred, and (b) a threshold evaluator to extract all signal positions where the standard deviations are lower than a predetermined threshold.

35. A system comprising:

a Fourier transform processor:

a first system for performing high resolution frequency measurement, phase measurement and standard deviation measurements of filter output data of said processor; and a second system to provide a processing data channel to enhance signal processing to support signal detection, wherein said second system comprises a phase corrector and a pseudo coherent integrator, and further wherein said phase corrector corrects the signal for filter number phase rotation, filter signal position determined by said lowest standard deviation evaluator and mean signal phase shift calculated and stores the rotated results.

36. A system comprising:

a Fourier transform processor;

a first system for performing high resolution frequency measurement, phase measurement and standard deviation measurements of filter output data of said processor;

a second system to provide a processing data channel to enhance signal processing to support signal detection, wherein said second system comprises a phase corrector and a pseudo coherent integrator, and further wherein said pseudo coherent integrator comprises an integrator and computes a value equal to the cosine of the phase value resulting from an operation of said phase corrector times the magnitude of the stored value, dividing the values by the number of transforms used in the integration and sums the value with the value obtained for the repeated process on the next sample to be integrated.

37. A system comprising:

a Fourier transform processor;

a first system for performing high resolution frequency measurement, phase measurement and standard deviation measurements of filter output data of said processor; and a second system to provide a processing data channel to enhance signal processing to support signal detection, wherein said processing data channel defines a first processing data channel, and further comprising a third system to provide a second processing data channel to enhance signal processing to support co-operative signal detection with said first processing data channel, and further wherein said third system comprises a linear/square law detection of the FFT outputs and integrating consecutive outputs to provide said second data channel for use in combination with a pseudo coherently integrated data channel for improved signal detection.

38. A system comprising:

a Fourier transform processor;

a first system for performing high resolution frequency measurement, phase measurement and standard deviation measurements of filter output data of said processor; and a second system to provide a processing data channel to enhance signal processing to support signal detection, wherein said processing data channel defines a first processing data channel, and further comprising a third system to provide a second processing data channel to enhance signal processing to support co-operative signal detection with said first processing data channel, and further wherein said data channel signals are detected as single filter signal detection which includes a ratio check of a filter that is pseudo coherent integrated versus a same filter linear/square law detected and integrated, and if the ratio exceeds a predetermined threshold and if the standard deviation values are smaller than a predetermined value, a detection is declared.

39. A system comprising:

a Fourier transform processor;

a first system for performing high resolution frequency measurement, phase measurement and standard deviation measurements of filter output data of said processor; and a second system to provide a processing data channel to enhance signal processing to support signal detection, wherein said processing data channel defines a first processing data channel, and further comprising a third system to provide a second processing data channel to enhance signal processing to support co-operative signal detection with said first processing data channel, and further wherein said data channel signals are detected as (a) a two channel summed signal detection which includes a summer to sum like filters that are linear/square law detected and integrated and pseudo coherently integrated, (b) a filter that filters detection candidates using predetermined standard deviation values, and (c) a multi-pass local mean signal determination unit that removes strong signals from mean calculations and detects based signals exceeding threshold mean values.

40. A system comprising:

a Fourier transform processor;

a first system for performing high resolution frequency measurement, phase measurement and standard deviation measurements of filter output data of said processor; and a second system to provide a processing data channel to enhance signal processing to support signal detection, wherein said processing data channel defines a first processing data channel, and further comprising a third system to provide a second processing data channel to enhance signal processing to support co-operative signal detection with said first processing data channel, and further wherein said data channel signals are detected as (a) a two pass mean two pass threshold signal detection which comprises a two pass local mean calculator which removes strong signals from mean calculations, (b) a threshold detector that detects based on signals exceeding threshold mean of said second pass, and (c) a second threshold detector which filters detection candidates using predetermined standard deviation values.

41. A system comprising:

a Fourier transform processor;

a first system for performing high resolution frequency measurement, phase measurement and standard deviation measurements of filter output data of said processor; and a second system to provide a processing data channel to enhance signal processing to support signal detection, wherein said processing data channel defines a first processing data channel, and further comprising a third system to provide a second processing data channel to enhance signal processing to support co-operative signal detection with said first processing data channel, and further wherein said data channel signals are detected as (a) an adjacent bin signal detection which includes a mean calculator, (b) a strong signal removal from mean calculations and recalculation, (c) an adjacent bin correlator, (d) a weighted summer to add signals from adjacent filters, and (e) a detector which detects based on summed signals exceeding threshold mean values and thresholded standard deviation values.

42. A system comprising:

a systematic processor of FFT processed data adapted to receive a signal cycling at a frequency; and a measuring system to perform high resolution frequency measurement of said FFT processed data to determine where said frequency of said received signal lies within an output filter bin of said Fourier transform processor.

43. A system comprising:

a systematic processor of FFT processed data; and a measuring system to perform high resolution frequency measurement, wherein said measuring system comprises:

a memory unit for pertinent data storage over integration time;

a FFT processor unit converting time domain signals to frequency domain;

a linear detector converting real and imaginary filter outputs to magnitude; and a frequency measurement unit to determine position of signal in a filter.

44. The system of claim 43 wherein said FFT processor unit FFT processes (t) consecutive samples collected from a first pass FFT filter that were stored in said memory unit.

45. The system of claim 43 wherein said linear detector converts the FFT outputs of said FFT processor unit to a magnitude value.

46. The system of claim 43 wherein said frequency measurement unit determines which filter has the largest magnitude and converts a filter number of an originating filter and a filter number of the largest magnitude signal detection filter into high resolution frequency.

47. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

architecture means for resolving range ambiguity through systematic changes of transmitter pulse recurring frequency (PRF) of said Doppler radar programmable event generator on a scan to scan basis.

48. A pulsed Doppler radar system comprising an antenna unit; a transmitter for transmitting a signal through said antenna unit, a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

architecture means for establishing an architecture that improves system performance through systematic control of transmitter pulse recurring frequency (PRF) of said Doppler radar programmable event generator on a scan to scan basis, wherein the architecture means comprises a scheduler for changing the PRF on a scan to scan basis wherein each PRF value used has been predetermined and each PRF to PRF mathematical relationship is chosen to maintain spacing greater than three range gates for the number of folds required to meet maximum range requirements without fold redundancy.

49. The pulsed Doppler radar system of claim 47 wherein said architecture means includes the time interval between scans need not be consistent and allows intervals to be used for other uses such as radar, communication and/or anti-jamming.

50. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

resolving means for resolving range ambiguity by changing transmitter pulse recurring frequency (PRF) on a scan to scan basis of said detected signals.

51. A pulsed Doppler radar system comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

resolving means for resolving range ambiguity on a scan to scan basis of said detected signal, wherein said resolving means comprises: (a) a detection sorting unit to pair detections from different scans, (b) a radar motion calculator, (c) an equation iteration unit to systematically sequence numeric values searching for equation equality, (d) a range check that confirms unambiguous range of the correlated calculations, and (e) a range calculator that calculates unambiguous range.

52. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

compression means for providing frequency domain pulse compression of said FFT processed received signals.

53. A pulsed Doppler radar system comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal, wherein the improvement comprises:

compression means for providing frequency domain pulse compression of said FFT processed received signals, wherein said compression means comprises: (a) a phase shifter that phase shifts real and imaginary filter outputs of consecutive range bins from a filter involved in the pulse compression by the amounts required to compensate each range bin for the pulse compression coding, and (b) a summer to add the shifted range bins.

54. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing frequency domain pulse compression and Doppler ambiguity resolution on said FFT processed received signals at constant PRF.

55. A pulsed Doppler radar system comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing frequency domain pulse compression and Doppler ambiguity resolution on said FFT processed received signals at constant PRF, wherein said performing means comprises: (a) a phase shifter that phase shifts real and imaginary filter outputs of consecutive range bins from a filter involved in the pulse compression amounts based on Doppler frequency involved and pulse compression coding, (b) a Doppler term numeric calculator to determine an amount of phase shift to be used for pulse compression over multiple Doppler folds for both inbound and outbound Doppler, (c) a summer to sum the phase rotated results; (d) a detector/integrator to integrate the magnitudes of each filter, (e) a memory storage unit to store results, (f) a CFAR detector operating at a high false alarm rate to determine range bin and Doppler filters that Doppler ambiguity is to be resolved, and (g) a Doppler ambiguity resolution unit that resolves Doppler ambiguity.

56. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on said FFT processed received signals; and determining means for determining a heading of an unambiguous range detected target by said heading calculator and accurate frequency measurement.

57. A pulsed Doppler radar system of claim 56 wherein said determining means comprises: (a) a radar cross-look angle motion calculator, (b) an equation iteration unit to systematically sequence cross range values searching for a cross range value giving the minimum equation value, (c) a minimum value comparator for performing a validation of minimum value, and (d) a target heading calculator based on the cross range value.

58. A pulsed Doppler radar system of claim 56 wherein said determining means comprises: (a) a cross angle calculator to determine amount of angular change, (b) a target heading calculator that uses calculated angle change to calculate heading, and (c) a heading ambiguity resolution calculator to confirm calculation of said heading.

59. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on said FFT processed received signals; and improving means for improving azimuth resolution of said Doppler radar.

60. A pulsed Doppler radar system of claim 59 wherein said improving means comprises: (a) a logic unit that systematically groups FFT processed data from the look direction representing a fixed area of said antennae unit and processes each group of said data with a high resolution frequency measurement unit to determine the frequency and amplitude of each group, and (b) a centroid processing unit which determines target position based on predetermined weights for each group processed by said logic unit.

61. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on said FFT processed received signals; and improving means for improving range accuracy and minimizing performance losses due to range gate straddle of said target signals with regard to analogue to digital range gate conversions.

62. A pulsed Doppler radar system of claim 61 wherein said improving means comprises: (a) an organizer that uses the frequency measurement unit to measure the frequency and standard deviation of predetermined group sets made up from the range bin preceding the detection bin and the range bin following the detection, (b) an amplitude/frequency centroid calculator to determine the centroid of detection of said detected target signals, (c) a centroid range and frequency calculator to determine delta range/frequency and standard deviation of said detected signals, and (d) a correlation unit to correlate said detected signals with known Doppler to validate results.

63. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurements, phase measurement and standard deviation measurements on said FFT processed received signals; and removing means for removing same target multiple detections from said detected target list.

64. A pulsed Doppler radar system of claim 63 wherein said removing means comprises: (a) a comparator to determine if multiple signal detections exist based on range and Doppler frequency relationships, and (b) an amplitude comparator to select the greater amplitude for detection processing and others for strong signal removal.

65. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on said FFT processed received signals; and minimizing means for minimizing ground clutter signals in said received signals in presence of target signals to improve target detection.

66. A pulsed Doppler radar system of claim 65 wherein said minimizing means comprises (a) a mapping unit to identify all range and Doppler bins with potential clutter and process each filter group with the lowest standard deviation evaluator to determine the frequency and phase in each identified range and Doppler bin, (b) a mean arithmetic unit to determine amplitude of ground clutter/strong signal, and (c) a vector substration unit to subtract out the mean value clutter/strong signal from each range and Doppler bins at the frequency and phase determined by said ground clutter signal identification process.

67. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on said FFT processed received signals; and classifying means for classifying a detected target detected by said target signal classification process.

68. A pulsed Doppler radar system of claim 67 wherein said classifying means comprises: (a) a logic unit that selects detected targets for a high resolution frequency measurement and stores the amplitude and standard deviation for all frequency positions checked; (b) a signal character extractor for extracting features from detected target signals, (c) a classifier that comprises a library base of features as measured in this classification process for all targets of interest, and (d) a correlation unit that compares the library features to the measured features and makes decisions based on correlation fit.

69. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

performing means for performing high resolution frequency measurement, phase measurement and standard deviation measurements on data associated with Doppler resolved data filters for filtering said predetermined received signal groups; and providing means for providing frequency domain pulse compression and Doppler correction to said received signal groups without addition and extending the integration function across all range and time bins of said group.

70. A pulsed Doppler radar system of claim 69 wherein said providing means comprises (a) a phase shifter that phase shifts real and imaginary filter outputs of consecutive range bins from a filter involved in the pulse compression amounts based on Doppler frequency involved, pulse compression coding and range bin involved, (b) a Doppler term numeric calculator to determine an amount of phase shift to be used for pulse compression over multiple Doppler folds for both inbound and outbound Doppler, (c) a controller that uses the lowest standard deviation evaluator to determine signal position and standard deviation, (d) a phase corrector to phase shift all elements for coherent integration, (e) a memory storage unit to store results, and (f) a Doppler ambiguity resolution unit that resolves Doppler ambiguity.

71. A pulsed Doppler radar system, comprising: an antenna unit; a transmitter for transmitting a signal through said antenna unit; a receiver/exciter for receiving through said antenna unit a target signal reflected by a target to provide a reception signal and for creating a reference waveform for transmitting/receiving; and a processing unit which receives the reception signal from said receiver/exciter and performs processing to maximize detection of the target signal; wherein the improvement comprises:

architecture means for establishing an architecture that can improve system performance through systematic control of transmitter pulse recurring frequency (PRF) of said Doppler radar programmable event generator;

performing means for performing frequency domain pulse compression and Doppler ambiguity resolution on the FFT data collected from said FFT processed received signals for a given PRF dwell period;

performing means for performing high resolution frequency measurement, phase measurement and standard deviation measurements on data associated with Doppler resolved filters for enhanced detection processing;

first means for providing a first processing data channel to enhance signal processing to support signal detection on pulse compressed Doppler resolved data filters;

second means for providing a second processing data channel to enhance signal processing to support co-operative signal detection on all pulse compressed data filters; and resolving means for resolving range ambiguity on a scan to scan basis of said detected signals.

72. The pulsed Doppler radar system of claim 71 wherein a single filter signal detector of said Doppler ambiguity resolved signals uses said first and second processing data channels comprises a ratio check of a filter that is pseudo coherent integrated versus a same filter linear/square law detected and integrated, and if the ratio exceeds a predetermined threshold and if the standard deviation values are smaller than a predetermined value, a detection is declared.

73. The pulsed Doppler radar system of claim 71 wherein said Doppler ambiguity resolved signals are detected using a two channel summed signal detection which comprises: (a) a summer to sum like filters that are linear/square law detected and integrated and pseudo coherently integrated, (b) a filter that filters detection candidates using predetermined standard deviation values, and (c) a multi-pass local mean signal determination unit that removes strong signals from mean calculations and detects signals exceeding threshold mean values.

74. The pulsed Doppler radar system of claim 71 wherein said Doppler ambiguity resolved signals are detected using a two pass mean two pass threshold signal detector which comprises: (a) a two pass local mean calculator which removes strong signals from mean calculations, (b) a first threshold detector that detects based on threshold mean, and (c) a second threshold detector which filters detection candidates using predetermined standard deviation values.

75. The pulsed Doppler radar system of claim 71 wherein said Doppler ambiguity resolved signals are detected using an adjacent bin signal detector using high resolution frequency measurements which comprises: (a) a mean calculator, (b) a strong signal removal from mean calculations and recalculation, (c) an adjacent bin correlator, (d) a weighted summer to add signals from adjacent filters, and (e) a detector which detects based on summed signals exceeding threshold mean values and thresholded standard deviation values.

76. The pulsed Doppler radar system of claim 71 further comprising means for detecting heading of detected targets using a high resolution frequency measurement of said detected range ambiguity resolved signals.

77. The pulsed Doppler radar system of claim 71 further comprising means for improving azimuth resolution of said detected range ambiguity resolved signals using a lowest standard deviation evaluator of said detected range ambiguity resolved signals.

78. The pulsed Doppler radar system of claim 71 further comprising means for improving range accuracy and minimize performance losses due to range gate straddle of said range ambiguity resolved signals using a lowest standard deviation evaluator of said pre-detected range ambiguity resolved targets.

79. The pulsed Doppler radar system of claim 71 further comprising means for removing same target multiple detections from said Doppler resolved detected targets relying on accurate frequency measurements.

80. The pulsed Doppler radar system of claim 71 further comprising means for minimizing ground clutter signals in presence of target signals to improve target detection by said removal of ground clutter signals using a lowest standard deviation evaluator.

81. The pulsed Doppler radar system of claim 71 further comprising means for classifying a detected target detected by said signal extraction using a lowest standard deviation evaluator.

82. The pulse Doppler radar system of claim 71 further comprising compression means for performing coherent frequency domain pulse compression and Doppler correction on the FFT data collected for a given PRF dwell period from said grouping of received range Doppler signals.

* * * * *